United States Patent [19]

Shepter

[11] 4,257,008
[45] Mar. 17, 1981

[54] LOGIC CIRCUIT BUILDING BLOCK AND SYSTEMS CONSTRUCTED FROM SAME

[75] Inventor: Joseph Shepter, New Haven, Conn.

[73] Assignee: Scientific Circuitry, Inc., Norwalk, Conn.

[21] Appl. No.: 852,594

[22] Filed: Nov. 17, 1977

Related U.S. Application Data

[62] Division of Ser. No. 382,981, Jul. 26, 1973, abandoned.

[51] Int. Cl.³ .................................. H03K 3/037
[52] U.S. Cl. ........................... 328/206; 307/221 R; 307/291; 328/195
[58] Field of Search ............... 307/215, 218, 289, 291, 307/221 R; 328/206, 195

[56] References Cited

U.S. PATENT DOCUMENTS 3,778,794  12/1973  Szabo et al. .................. 307/229 X Primary Examiner—John Zazworsky
Attorney, Agent, or Firm—Kenyon & Kenyon

[57] ABSTRACT

A logic system includes first and second identical logic circuit building blocks, each referred to as an M Circuit, which responds to transitions of a two level, binary input signal to provide a memory and a logic function which has a complete truth table for every possible combination of input signal transitions or changes in logic level at a pair of input terminals A and B. Each of the M Circuits includes gates having two inputs connected to the A and B input terminals, respectively and a set-reset flip flop having its set input connected to the output of the gate, its reset input connected to the B input terminal and its set and reset outputs connected respectively to output terminals Q and $\overline{Q}$ of the M Circuit, with the Q and $\overline{Q}$ output terminals providing complementary binary outputs for any combination of binary inputs applied at the A and B input terminals, providing a four terminal device which responds to each transition of said input signal at the A and B terminals to provide outputs at the Q and $\overline{Q}$ terminals in accordance with its truth table functions.

One of the Q and $\overline{Q}$ output terminals of the first M Circuit is connected with one of the A and B input terminals of the second M Circuit.

6 Claims, 141 Drawing Figures

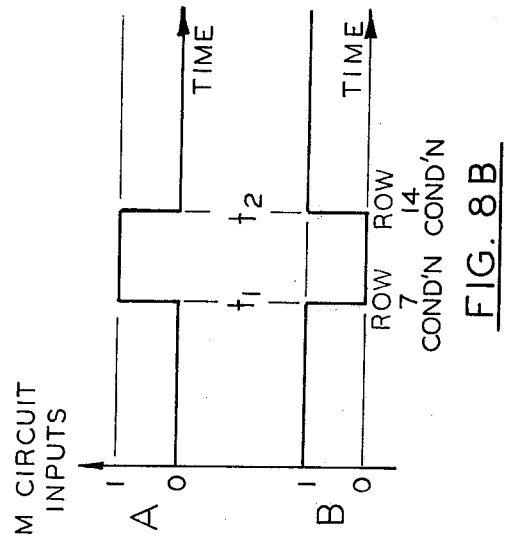
FIG. 8A
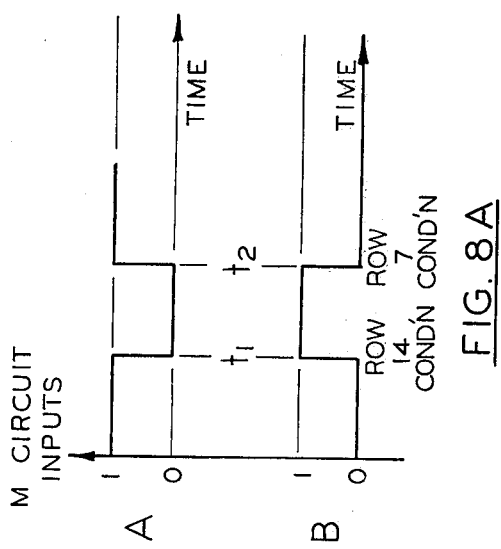
FIG. 8B
FIG. 3A
[PRIOR ART THEORY]
TABLE OF 16 FUNCTIONS ($f_n$) OF 2 BOOLEAN VARIABLES (x & y)
| BINARY VALUE | INPUTS | | OUTPUTS | | | | | | | | | | | | | | | |
|---|---|---|---|---|---|---|---|---|---|---|---|---|---|---|---|---|---|---|
| | X | Y | $f_0$ | $f_1$ | $f_2$ | $f_3$ | $f_4$ | $f_5$ | $f_6$ | $f_7$ | $f_8$ | $f_9$ | $f_{10}$ | $f_{11}$ | $f_{12}$ | $f_{13}$ | $f_{14}$ | $f_{15}$ |
| $2^0$ | 0 | 0 | 0 | 1 | 0 | 1 | 0 | 1 | 0 | 1 | 0 | 1 | 0 | 1 | 0 | 1 | 0 | 1 |
| $2^1$ | 0 | 1 | 0 | 0 | 1 | 1 | 0 | 0 | 1 | 1 | 0 | 0 | 1 | 1 | 0 | 0 | 1 | 1 |
| $2^2$ | 1 | 0 | 0 | 0 | 0 | 0 | 1 | 1 | 1 | 1 | 0 | 0 | 0 | 0 | 1 | 1 | 1 | 1 |
| $2^3$ | 1 | 1 | 0 | 0 | 0 | 0 | 0 | 0 | 0 | 0 | 1 | 1 | 1 | 1 | 1 | 1 | 1 | 1 |

TRUTH TABLE FOR THE NOR GATE
SET-RESET FLIP-FLOP

| ROWS | $S_0$ | $R_0$ | $Q_0$ | $\bar{Q}_0$ | S | R | Q | $\bar{Q}$ |
|---|---|---|---|---|---|---|---|---|
| 1 | 0 | 0 | 0 | 1 | 0 | 0 | 0 | 1 |
| 2 | 0 | 0 | 0 | 1 | 0 | 1 | 1 | 0 |
| 3 | 0 | 0 | 0 | 1 | 1 | 0 | 0 | 1 |
| 4 | 0 | 0 | 0 | 1 | 1 | 1 | 0 | 0 |
| 5 | 0 | 0 | 1 | 0 | 0 | 0 | 1 | 0 |
| 6 | 0 | 0 | 1 | 0 | 0 | 1 | 1 | 0 |
| 7 | 0 | 0 | 1 | 0 | 1 | 0 | 0 | 1 |
| 8 | 0 | 0 | 1 | 0 | 1 | 1 | 0 | 0 |
| 9 | 0 | 1 | 1 | 0 | 0 | 0 | 1 | 0 |
| 10 | 0 | 1 | 1 | 0 | 0 | 1 | 1 | 0 |
| 11 | 0 | 1 | 1 | 0 | 1 | 0 | 0 | 1 |
| 12 | 0 | 1 | 1 | 0 | 1 | 1 | 0 | 0 |
| 13 | 1 | 0 | 0 | 1 | 0 | 0 | 0 | 1 |
| 14 | 1 | 0 | 0 | 1 | 0 | 1 | 1 | 0 |
| 15 | 1 | 0 | 0 | 1 | 1 | 0 | 0 | 1 |
| 16 | 1 | 0 | 0 | 1 | 1 | 1 | 0 | 0 |
| 17 | 1 | 1 | 0 | 0 | 0 | 0 | 1/0 | 0/1 |
| 18 | 1 | 1 | 0 | 0 | 0 | 1 | 1 | 0 |
| 19 | 1 | 1 | 0 | 0 | 1 | 0 | 0 | 1 |
| 20 | 1 | 1 | 0 | 0 | 1 | 1 | 0 | 0 |

FIG. 5

[PRIOR ART]

TRUTH TABLE FOR THE M CIRCUIT IN NOR GATE FORM

| ROWS | $A_0$ | $B_0$ | $Q_0$ | $\bar{Q}_0$ | A | B | Q | $\bar{Q}$ |
|---|---|---|---|---|---|---|---|---|
| 1  | 0 | 0 | 0 | 1 | 0 | 0 | 0 | 1 |
| 2  | 0 | 0 | 0 | 1 | 0 | 1 | 1 | 0 |
| 3  | 0 | 0 | 0 | 1 | 1 | 0 | 0 | 1 |
| 4  | 0 | 0 | 0 | 1 | 1 | 1 | 1 | 0 |
| 5  | 0 | 1 | 1 | 0 | 0 | 0 | 0 | 1 |
| 6  | 0 | 1 | 1 | 0 | 0 | 1 | 1 | 0 |
| 7  | 0 | 1 | 1 | 0 | 1 | 0 | 1/0 | 0/1 |
| 8  | 0 | 1 | 1 | 0 | 1 | 1 | 1 | 0 |
| 9  | 1 | 0 | 0 | 1 | 0 | 0 | 0 | 1 |
| 10 | 1 | 0 | 0 | 1 | 0 | 1 | 1 | 0 |
| 11 | 1 | 0 | 0 | 1 | 1 | 0 | 0 | 1 |
| 12 | 1 | 0 | 0 | 1 | 1 | 1 | 1 | 0 |
| 13 | 1 | 0 | 1 | 0 | 0 | 0 | 0 | 1 |
| 14 | 1 | 0 | 1 | 0 | 0 | 1 | 1/0 | 0/1 |
| 15 | 1 | 0 | 1 | 0 | 1 | 0 | 1 | 0 |
| 16 | 1 | 0 | 1 | 0 | 1 | 1 | 1 | 0 |
| 17 | 1 | 1 | 1 | 0 | 0 | 0 | 0 | 1 |
| 18 | 1 | 1 | 1 | 0 | 0 | 1 | 1 | 0 |
| 19 | 1 | 1 | 1 | 0 | 1 | 0 | 1 | 0 |
| 20 | 1 | 1 | 1 | 0 | 1 | 1 | 1 | 0 |

FIG. 7A

SET

RESET

MEMORY

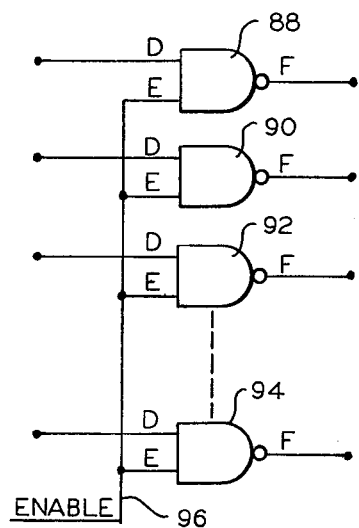
FIG. IIE
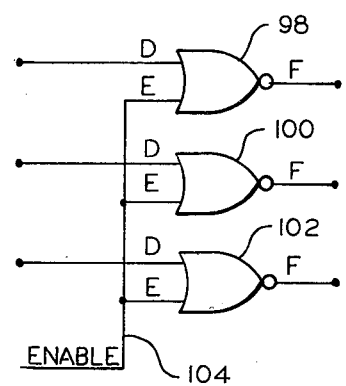
FIG. IIF
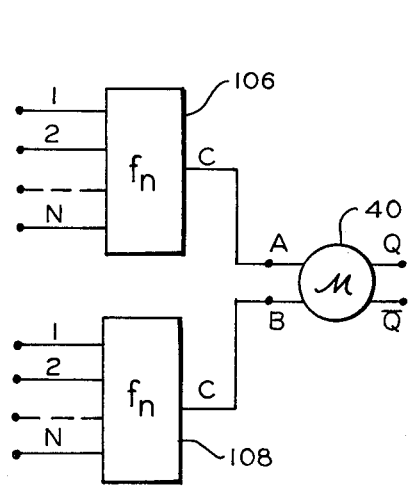
FIG. 12A
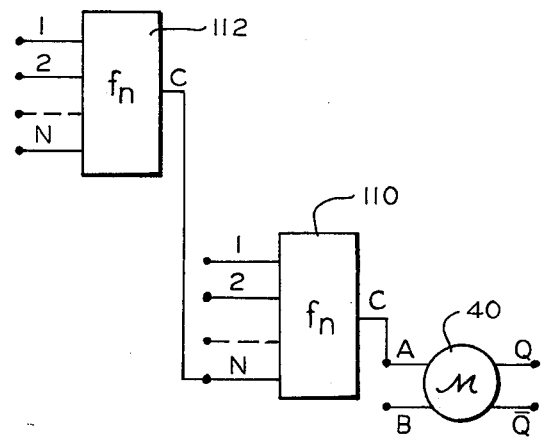
FIG. 12B
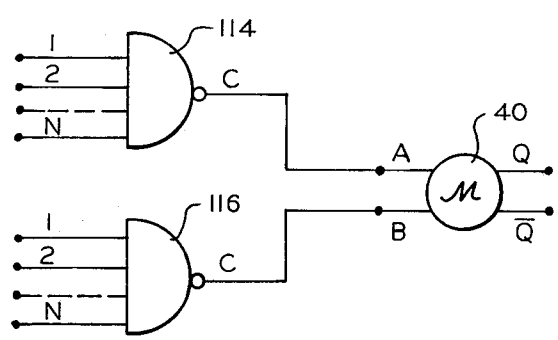
FIG. 12C

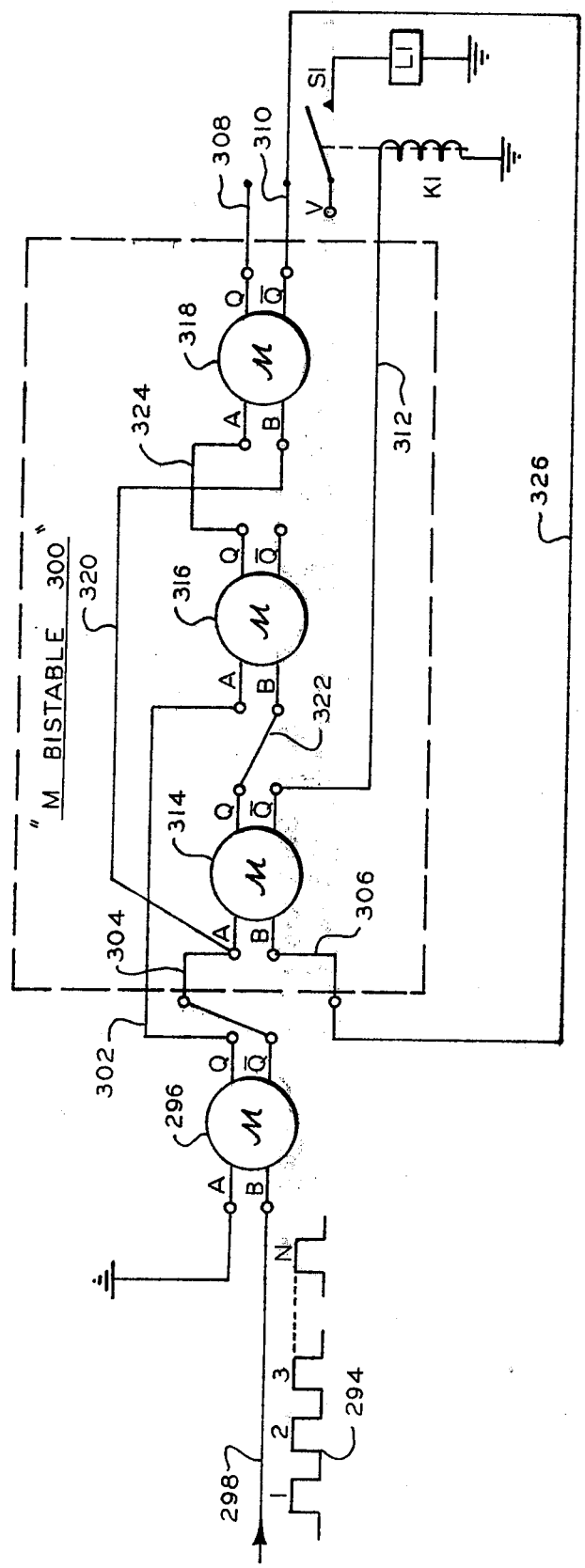

| OUTPUT BINARY NUMBER | $\bar{Q}$ OF M 804e $2^2$ | $\bar{Q}$ OF M 804d $2^1$ | $\bar{Q}$ OF M 804c $2^0$ | SERIAL INPUT DATA CODE |
|---|---|---|---|---|
| 0 | 0 | 0 | 0 | NO DATA |
| 1 | 0 | 0 | 1 | X, X |
| 2 | 0 | 1 | 0 | X, Y |
| 3 | 0 | 1 | 1 | X, X, Y |
| 4 | 1 | 0 | 0 | X, Z |
| 5 | 1 | 0 | 1 | X, X, Z |
| 6 | 1 | 1 | 0 | X, X, Y |
| 7 | 1 | 1 | 1 | X, X, Y, Z |

FIG. 36A

| OUTPUT BINARY NUMBER | $\bar{Q}$ OF M 804e $2^2$ | $\bar{Q}$ OF M 804d $2^1$ | $\bar{Q}$ OF M 804c $2^0$ | PARALLEL INPUT DATA CODE |
|---|---|---|---|---|
| 0 | 0 | 0 | 0 | NO DATA |
| 1 | 0 | 0 | 1 | W, X |
| 2 | 0 | 1 | 0 | W, Y |
| 3 | 0 | 1 | 1 | W, X, Y |
| 4 | 1 | 0 | 0 | W, Z |
| 5 | 1 | 0 | 1 | W, X, Z |
| 6 | 1 | 1 | 0 | W, Y, Z |
| 7 | 1 | 1 | 1 | W, X, Y, Z |

FIG. 36B

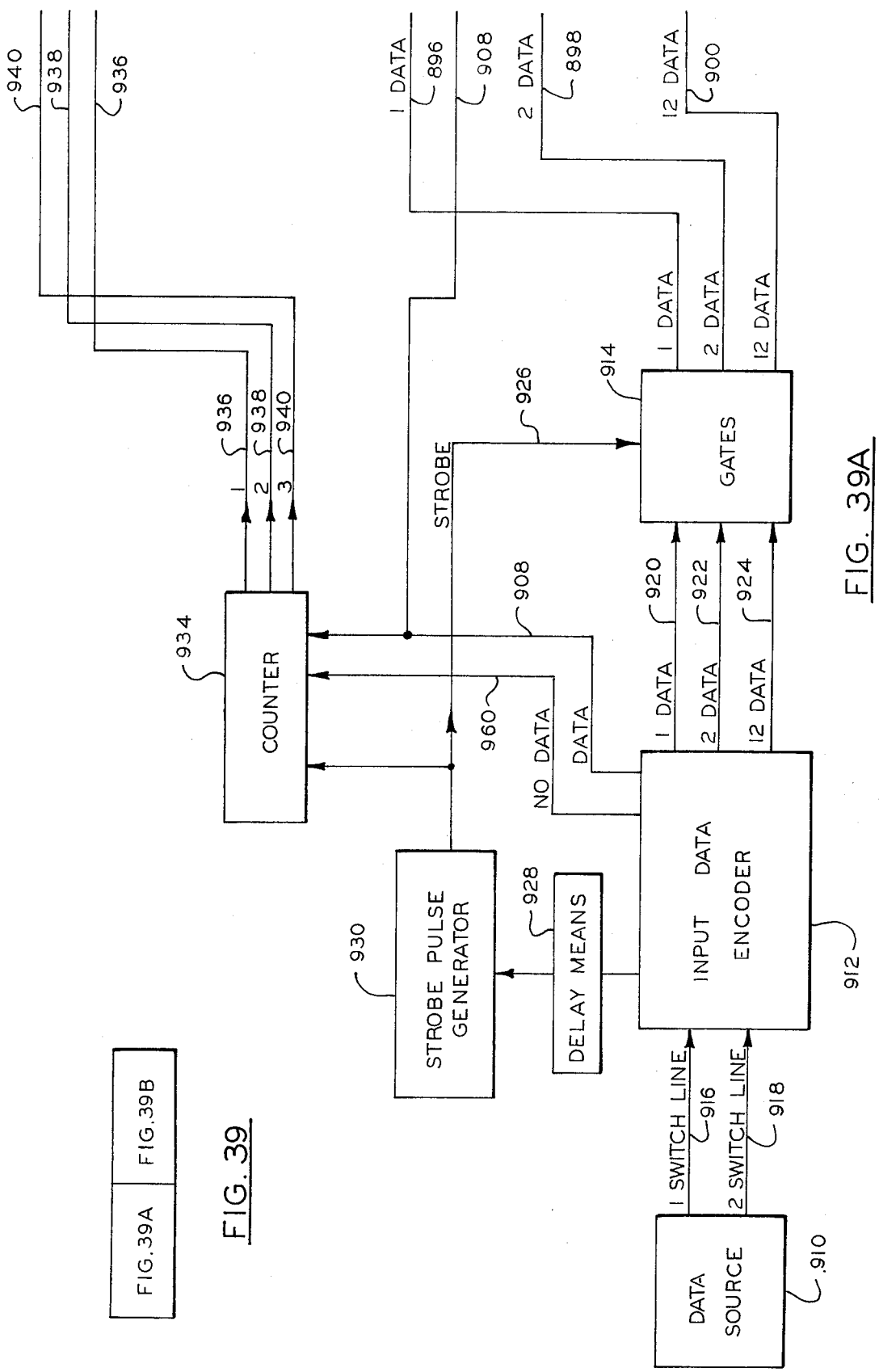

MEMORY I MODES OF INPUT/OUTPUT SWITCHING OPERATION

| | MODE 1 | MODE 2 | MODE 3 | MODE 4 | MODE 5 | MODE 6 | MODE 7 |
|---|---|---|---|---|---|---|---|
| | | INPUT | LINE | DATA | | | |
| L1 | 1 | 1,1 | 1,1,1 | 1,1,1,1 | 1 | 1 | 1,1 |
| L2 | 2 | 1,2 | 1,1,2 | 1,1,1,2 | 1,1 | 2 | 1,2 |
| L3 | 12 | 1,12 | 1,1,12 | 1,1,1,12 | 1,1,1 | 3 | 1,3 |
| L4 | | 2,1 | | | 1,1,1,1 | 12 | 1,12 |
| L5 | | 2,2 | | | | 13 | 1,13 |
| L6 | | 2,12 | | | | 23 | 1,23 |
| L7 | | 12,1 | | | | 123 | 1,123 |
| L8 | | 12,2 | | | | | |
| L9 | | 12,12 | | | | | |

(Left axis label: LOADS OR OUTPUT INDICATORS)

MEMORY I

| MEMORY II MODES | INPUT LINE DATA | OPERATION |
|---|---|---|
| 1 | 1 | LATCH OPERATION |
| 2 | 2 | CODE ON ANY OFF |
| 3 | 12 | CODE ON ANY OFF & ENTER |

MEMORY II

M 2532 RESET
(COLUMNS)

| | 1 | 2 | 3 | 4 | 5 | 6 | 7 | 8 | 9 | 10 | 11 |
|---|---|---|---|---|---|---|---|---|---|---|---|
| | $A_O$ | $B_O$ | A | B | a | Q | b | $\bar{Q}$ | c | d | e |
| 1 | ANY | | 1 | 1 | 1 | 1 | 0 | 0 | 0 | 1 | 0 |
| 2 | ANY | | 1 | 1 | 0 | 1 | 1 | 0 | 0 | 0 | 1 |
| 3 | 0 | 1 | 1 | 0 | 1 | 1 | 0 | 0 | 0 | 1 | 0 |
| 4 | 0 | 1 | 1 | 0 | 0 | 1 | 1 | 0 | 0 | 0 | 1 |
| 5 | 1 | 1 | 1 | 0 | 1 | 1 | 0 | 0 | 0 | 1 | 0 |
| 6 | 1 | 1 | 1 | 0 | 0 | 1 | 1 | 0 | 0 | 0 | 1 |

(ROWS)

M 2532 SET
(COLUMNS)

| | 1 | 2 | 3 | 4 | 5 | 6 | 7 | 8 | 9 | 10 | 11 |
|---|---|---|---|---|---|---|---|---|---|---|---|
| | $A_O$ | $B_O$ | A | B | a | Q | b | $\bar{Q}$ | c | d | e |
| 1 | ANY | | 0 | 0 | 1 | 0 | 0 | 1 | 0 | 0 | 1 |
| 2 | ANY | | 0 | 0 | 0 | 0 | 1 | 1 | 1 | 0 | 0 |
| 3 | 0 | 0 | 1 | 0 | 1 | 0 | 0 | 1 | 0 | 0 | 1 |
| 4 | 0 | 0 | 1 | 0 | 0 | 0 | 1 | 1 | 1 | 0 | 0 |

(ROWS)

|   | $a_1$ | $b_1$ | M 2532-1 | $e_1$ | $a_2$ | $b_2$ | M 2532-2 | $e_2$ | f |
|---|---|---|---|---|---|---|---|---|---|
| 1 | 1 | 0 | SET | 1 | 1 | 0 | RESET | 0 | 0 |
| 2 | 0 | 1 | SET | 0 | 1 | 0 | RESET | 0 | 1 |
| 3 | 1 | 0 | SET | 1 | 1 | 0 | RESET | 0 | 0 |
| 4 | 1 | 0 | SET | 1 | 0 | 1 | RESET | 1 | 0 |
| 5 | 1 | 0 | SET | 1 | 1 | 0 | RESET | 0 | 0 |
| 6 | 0 | 1 | SET | 0 | 0 | 1 | RESET | 1 | 0 |

FIG. 63B

|   | a | b | M 2532-1 | e | a | b | M 2532-2 | e | f |
|---|---|---|---|---|---|---|---|---|---|
| 1 | 1 | 0 | RESET | 0 | 1 | 0 | SET | 1 | 0 |
| 2 | 0 | 1 | RESET | 1 | 1 | 0 | SET | 1 | 0 |
| 3 | 1 | 0 | RESET | 0 | 1 | 0 | SET | 1 | 0 |
| 4 | 1 | 0 | RESET | 0 | 0 | 1 | SET | 0 | 1 |
| 5 | 1 | 0 | RESET | 0 | 1 | 0 | SET | 1 | 0 |
| 6 | 0 | 1 | RESET | 1 | 0 | 1 | SET | 0 | 0 |

FIG. 63C

|   | $a_1$ | $b_1$ | M 2532-1 | $e_1$ | $a_2$ | $b_2$ | M 2532-2 | $e_2$ | f |
|---|---|---|---|---|---|---|---|---|---|
| 1 | 1 | 0 | SET | 1 | 1 | 0 | SET | 1 | 0 |
| 2 | 0 | 1 | SET | 0 | 1 | 0 | SET | 1 | 0 |
| 3 | 1 | 0 | SET | 1 | 1 | 0 | SET | 1 | 0 |
| 4 | 1 | 0 | SET | 1 | 0 | 1 | SET | 0 | 0 |
| 5 | 1 | 0 | SET | 1 | 1 | 0 | SET | 1 | 0 |
| 6 | 0 | 1 | SET | 0 | 0 | 1 | SET | 0 | 1 |

FIG. 63D

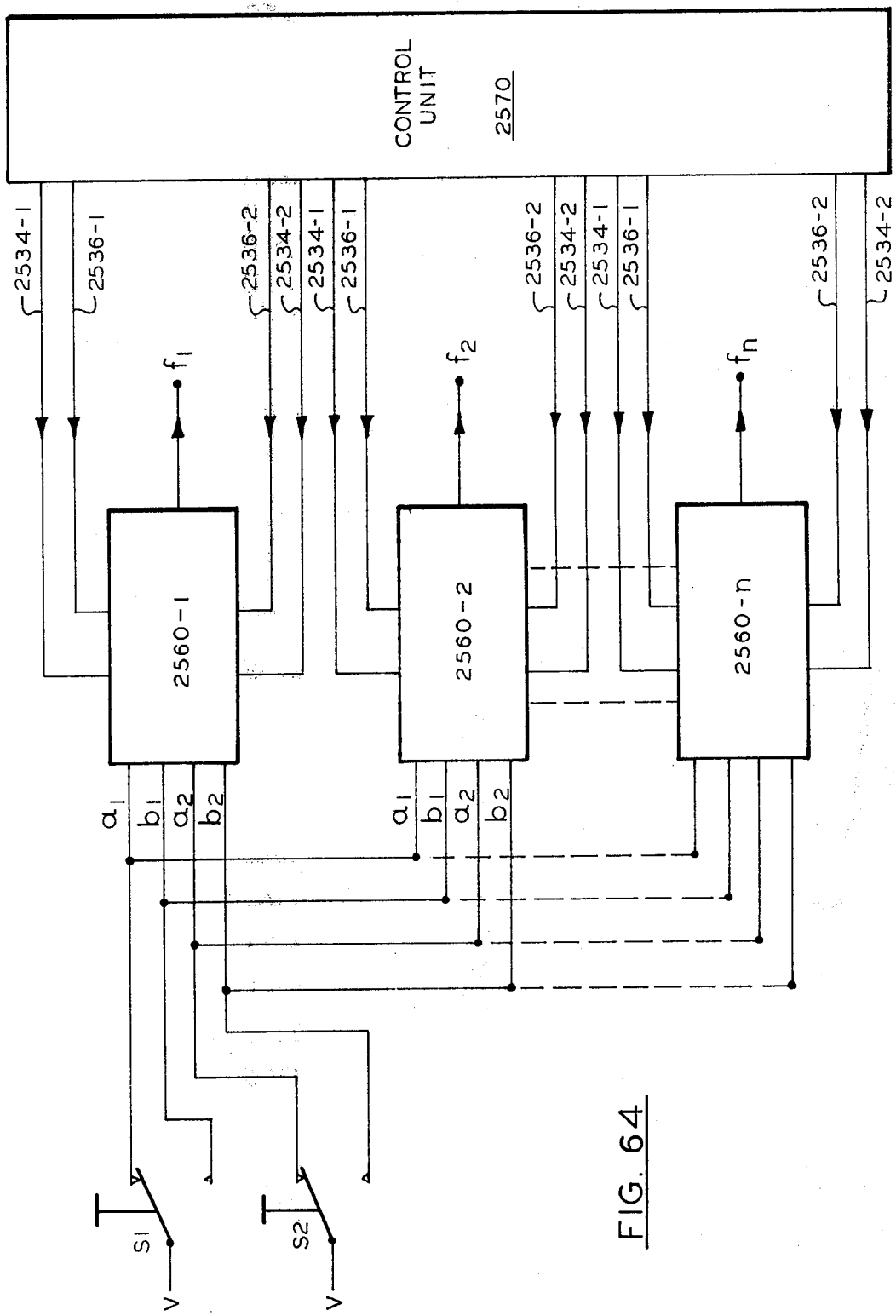

LOGIC CIRCUIT BUILDING BLOCK AND SYSTEMS CONSTRUCTED FROM SAME

This is a division of application Ser. No. 382,981, filed July 26, 1973, now abandoned.

BACKGROUND OF THE INVENTION

The present invention generally relates to logic circuits, and more particularly to a logic circuit building block, herein termed an M Circuit, and the development of subsystems and systems with such M Circuit.

Various types of logic circuit building blocks have been developed by the electronic industry for use in designing systems which operate on two level binary data. One basic building block is the set-reset flip flop. The set-reset flip flop, however, is generally characterized by a truth table in which, for some conditions of data input and data change at the two inputs, the two outputs lose complementation and provide the logic fallacy of identical binary outputs. This is an undesirable condition if complementation is required by the system design. Another undesirable condition occurring in the set-reset flip flop is known as the indeterminate state wherein a particular data transition at the two inputs produce outputs which are unpredictable. Both of these conditions referred to above, that is, loss of complementation and the indeterminate state, arise because two inputs may be simultaneously applied to the set-reset flip flop which cause both of its outputs to be identical. Attempts to overcome these problems have involved the use of clocking, gate logic circuitry in conjunction with one or more set-reset flip flops. This makes the flip flop more complex and also requires, in large systems, clock generators of high power output. This is true since clocking is accomplished at each stage within the system. Similarly, system resetting can also require a large number of wire runs and a large drive capability since, generally, each flip flop or groups of flip flops within a system must be individually reset. The use of a clock also results in a certain slowing down of the system. That is, the maximum speed of operations within the system is affected by the clock rate. Normally, operations are performed on only either the leading or trailing edges of clock pulses. The result, very often, is that the logic elements in the system are not utilized to the fullest extent possible in regard to their inherent speed.

Some of these problems become particularly noticeable when it is desired to separate large quantities o data. If such data separation is attempted using set-reset flip flops, the designer runs into the problem of having a situation involving the loss of complementation at the flip flop output, as discussed above. In addition, the designer must provide a large number of individual resets to the flip flops in the data separation system. On the other hand, where a clock type of flip flop is employed, there must be supplied additional amounts of clock power to accommodate the added gates and flip flop stages.

Thus, it can be seen that there exists a need for a basic building block which can be used to design information generating and processing systems and avoid problems associated with clocking at each stage of data processing. In addition, it would improve the efficiency of such a system if it responded to both the leading and trailing edges of pulses and thereby not have to wait a full cycle to perform each sequential operation. Also, the basic building block employed should not have the inherent characteristics of the set-reset flip flop which permits the loss of complementation at the outputs, and an indeterminate state, but should have its simplicity of design. Furthermore, it would be desirable to have a building block which can easily be reset when combined with other such circuits.

SUMMARY OF THE INVENTION

The present invention fills this need with a logic system comprising first and second identical logic circuit building blocks, each referred to as M Circuits in which an output of the first M circuit is coupled to an input of the second M circuit. The M Circuit responds to transitions of a two level binary input signal to provide a memory and a logic function which has a complete truth table for every possible combination of input signal transitions or changes in logic level at a pair of input terminals A and B. The M Circuit generally includes both logic gating and a memory for placing the M Circuit in a set condition in response to the application of first known combinations of input signal levels or transitions at the A and B terminals, and for placing the M Circuit in a reset condition in response to the application of second known combinations of input signal levels at the A and B input terminals. The M Circuit is placed in a memory condition whereby it memorizes its previous set or reset condition in response to the application of third known combinations of input signal levels at the A and B input terminals. A pair of output terminals Q and $\overline{Q}$ for the M Circuit provide a first known combination of complementary output signal levels when the M Circuit is in the set condition, and a second known combination of complementary output signal levels when the M Circuit is in the reset condition. Thus, the M Circuit provides predetermined complementary, binary output signals at the Q and $\overline{Q}$ terminals for every possible combination of input signal transitions at the A and B terminals in accordance with its truth table function, without requiring clocking, gate logic circuitry.

A preferred embodiment of the M Circuit is disclosed which includes a first gate having two inputs connected to the A and B input terminals, a second gate having one input connected to the output of the first gate, and a third gate having one input connected to the B input terminal, another input connected to the output of the second gate, and an output connected to another input of the second gate. The outputs of the second and third gates are respectively connected to the Q and $\overline{Q}$ output terminals, and the B input terminal is both a reset and an enable terminal so that the M Circuit can be reset or enabled to be set, respectively, at the B terminal. A further preferred form of this embodiment comprises three NOR gates constituting the first, second and third gates.

BRIEF DESCRIPTION OF THE DRAWINGS

FIG. 3A is a table of the sixteen Boolean functions of a two input gate;

FIG. 5 shows the truth table for the f1 or NOR gate set-reset flip flop shown in FIG. 4A;

FIG. 7A shows the truth table for the M Circuit in NOR gate form, as shown in FIG. 6;

FIGS. 8A and 8B show the waveform diagrams of the A and B input terminals of the M Circuit for the two conditions set forth in rows 7 and 14 of the truth table of FIG. 7A;

FIGS. 11A through 11F show various types and arrangements of gates connected to M Circuits;

FIGS. 12A, 12B and 12C show general types of gates and gating connections to an M Circuit;

DETAILED DESCRIPTION OF THE PREFERRED EMBODIMENTS

M CIRCUITS IN GENERAL

Figure 1:
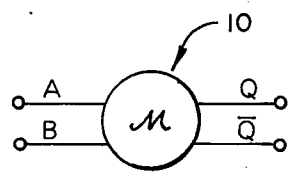
FIG. 1 is a symbolic representation of the M Circuit in the form which will be used in all the Figures.

The M Circuit is a circuit from which systems may be constructed. The M Circuit is shown in symbolic form and indicated by the numeral 10 in FIG. 1. Throughout this description of the M Circuit, the two left terminals of the M Circuit will be referred to as inputs, and the two right terminals as outputs. The upper input will be referred to as input A, the lower input as input B, the upper output as output Q, and the lower output as output $\overline{Q}$ (pronounced as "Q not").

The M Circuit operates on a two level binary input at its input terminals A and B, and provides a two level binary output at its output terminals Q and $\overline{Q}$. These two binary levels are referred to as a "1" and a "0" in the literature of Boolean algebra, and this same practice will be followed herein. In Boolean algebra, the "0" binary level is defined as the complement of the "1" binary level, and the "1" binary level is defined as the complement of the "0" binary level. As will be shown below, except during transition times, the Q output of an M Circuit will always be the complement of the $\overline{Q}$ output of an M Circuit, and the $\overline{Q}$ output will always be the complement of the Q output.

Figure 2:
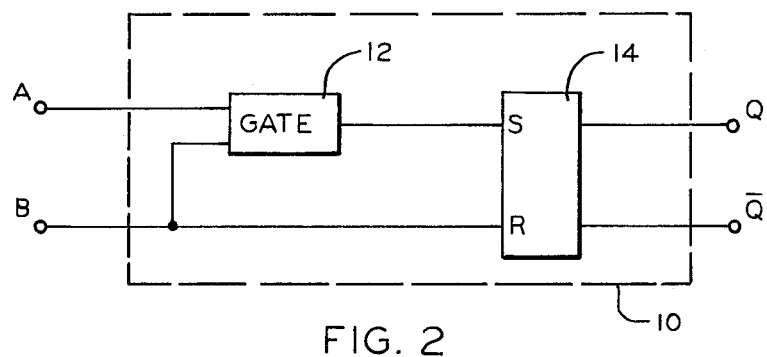
FIG. 2 illustrates one form of representation of the basic elements constituting the M Circuit.

In one sense, an M Circuit may be thought of as the combination of a set-reset flip flop and a gate, or a combination of gates, which provide a Boolean function. This is illustrated in FIG. 2 by a gate 12 connected as shown to a set-reset flip flop 14. The characteristics of the M Circuit 10 are shown and described with reference to the Figures below.

Figure 3B:
FIG. 3B shows a logic representation used for a gate which provides a designated Boolean function.

It is noted that a gate, or a combination of gates, which provide a Boolean function will be referred to herein as a "gate". As is known, a gate is an n input, one output device which will provide one of the $(2)^{2^n}$ functions of n Boolean variables. A table of the 16 possible functions f0 through f15 of a two input gate is shown in FIG. 3A. These 16 functions f0 through f15 of the two Boolean variables X and Y will be referred to in the description below. FIG. 3B is a logic representation used herein for a gate, or a combination of gates, which provide a designated Boolean function.

Referring again to FIG. 3A, one may note that a two input f1 gate will output a "1" for the first input condition, X equals "0", Y equals "0"; and a "0" for each of the other possible input conditions. This may be recognized as the Pierce or NOR function. This function will generate the Boolean algebra. As shown in FIG. 3A, an F2 gate will output a "1" only in the $2^1$ position. An $f^4$ gate will output a "1" in the $2^2$ position. An f7 gate will have outputs which in the binary number system add to decimal 7. This f7 gate may be recognized as the Sheffer or NAND function. This function will generate the algebra. An f11 gate will provide binary outputs which add to decimal 11; an f13 gate will provide binary outputs which add to decimal 13; and an f14 gate will provide binary outputs which add to decimal 14. An f14 gate will be recognized as an OR gate.

Figure 4A:
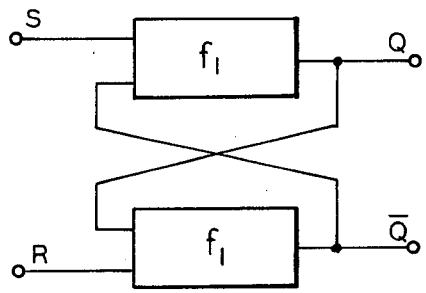
FIGS. 4A through 4E of various gate or gate combinations which constitute the set-reset shown in FIG. 2 for constructing an M Circuit.
Figure 4C:
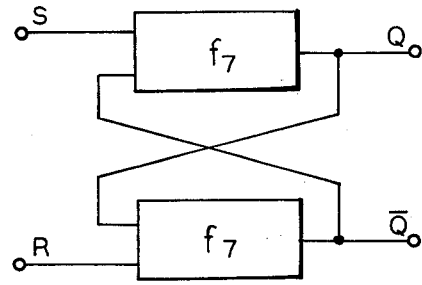
Figure 4B:
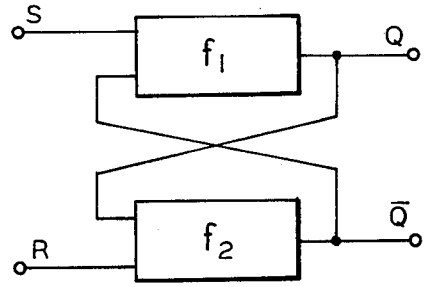
Figure 4D:
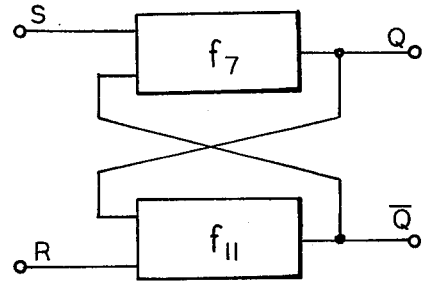
Figure 4E:
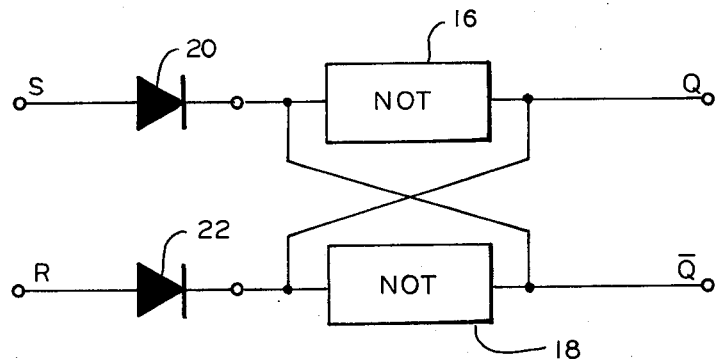

FIGS. 4A-4E show various gate or gate combinations which constitute the set-reset flip flops shown in FIG. 2 for constructing an M Circuit. In FIGS. 4A-4E, the two left terminals are referred to as inputs S and R and the two right terminals as outputs Q and $\overline{Q}$. FIG. 4A shows the combination of a pair of two input f1 gates or NOR gates, FIG. 4B shows the combination of an f1 gate and an f2 gate, FIG. 4C shows the combination of two f7 or NAND gates, and FIG. 4D shows the combination of an f7 gate and an f11 gate. A further possibility is shown in FIG. 4E in which the set-reset flip flop is made of two cross coupled NOT gate circuits 16 and 18 with steering diode inputs 20 and 22, respectively. This is known as the NOT set-reset flip flop. From the standpoint of the truth table or a logic circuit viewpoint, this circuit of FIG. 4E is equivalent to the f1 gate flip flop shown in FIG. 4A, to be described in detail hereinbelow.

FIG. 5 shows the truth table for the f1 or NOR gate set-reset flip flop shown in FIG. 4A. The first column lists $S_o$, the initial S input the second column lists $R_o$, the initial R input; the third column $Q_o$, the initial Q output; and the fourth column lists $\overline{Q}_o$, the initial $\overline{Q}$ output. The next four columns list the A and B inputs and the Q and $\overline{Q}$ outputs for a data change. The rows include those cases where data does not change and therefore shows 20 possibilities. The rows to make particular note of are rows 4, 8, 12, 16, 20 and 17. In rows 4, 8, 12, 16 and 20, the f1 gate set-reset flip flop loses complementation and provides the logic fallacy Q equals $\overline{Q}$. In the data transition of row 17, the final Q and $\overline{Q}$ situation is unpredictable, being dependent upon incremental gain and temperature. This transition is known in the literature as the indeterminate state of the set-reset flip flop.

Figure 6:
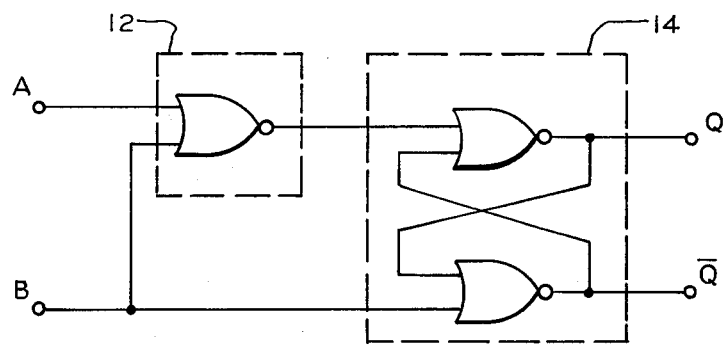
FIG. 6 shows an M circuit in f1 or NOR gate form.

In FIG. 6, there is shown an M Circuit in f1 or NOR gate form. This will be recognized as a structure of the type shown in FIG. 2 wherein the set-reset flip flop 14 is of the type shown in FIG. 4A and the gate 12 of FIG. 2 is an f1 gate or NOR gate described above. It is to be noted that the M Circuit of the f1 or NOR gate form will be used throughout the remainder of the specification for purposes of conforming the description to a common form of M Circuit.

FIG. 7A shows the truth table for the M Circuit in NOR gate form, shown in FIG. 6. As shown therein, the first four columns list the initial $A_o$ and $B_o$ inputs and the initial $Q_o$ and $\overline{Q}_o$ outputs. The next four columns list the final A and B inputs and the final Q and $\overline{Q}$ outputs. One may note that the M Circuit in NOR gate form will never output the logic fallacy Q equals $\overline{Q}$ as is the case for the NOR gate set-reset flip flop described above in reference to FIG. 5.

Figure 7B:
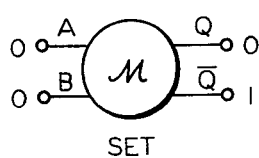
FIGS. 7B, 7C and 7D, respectively, illustrate the logic levels defined for the input and output terminals of the M Circuit in NOR gate form when such M Circuit is in the set condition, the reset condition and the memory condition, respectively.
Figure 7C:
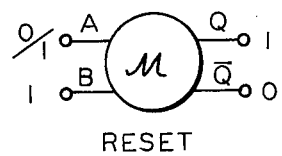

In discussing the M Circuit and M Circuit systems below, the set condition of the NOR M Circuit will be defined as Q equals "0", $\overline{Q}$ equals "1", and the reset condition will be defined as Q equals "1", and Q equals "0". The set and reset conditions are illustrated in FIGS. 7B and 7C, respectively. In this connection, it is noted that the M Circuit is in the reset condition when a "1" is on the B input and either a "0" or a "1" is on the A input.

Figure 7D:
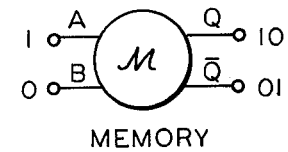

In FIG. 7A, on rows 2, 4, 6, 8, 10, 12, 16, 18 and 20, the M Circuit is in the reset condition after data change. On rows 1, 5, 9, 13, and 17, the M Circuit is in the set condition after data change. On rows 3, 11, 15 and 19, the M Circuit exhibits memory; that is, Q final equals $Q_o$ initial, and $\overline{Q}$ final equals $\overline{Q}_o$ initial. The memory condition is further illustrated in FIG. 7D wherein a "1" is on the A input and a "0" is on the B input. In general, referring to a NOR M Circuit, it is true that when A equals "0" and B equals "0", the M Circuit is set; when B equals "1", the M Circuit is reset; and when A equals "1" and B equals "0", the M Circuit is in memory.

It may now be noted that the B input of the M Circuit provides the dual capability of resetting the M Circuit when the B input is a "1", and of enabling the M Circuit to be set by a "0" on the A input when the B input is "0". That is, in every case when the B input is a "1", the M Circuit is in the reset condition wherein Q equals "1" and $\overline{Q}$ equals "0". Also, in every case when the B input is "0", the M Circuit will be set by a "0" on the A input. The significance of these characteristics will be described in detail below. As will be seen more clearly below, this is one of the features of the M Circuit which permits it to be connected in one, two and three dimensional arrays of data separators and processors.

FIGS. 8A and 8B show the A and B inputs for the two conditions set forth in row 7 and row 14 of FIG. 7A. Specifically, FIG. 8A shows a situation at the input of an M Circuit where the A input goes from a "1" to a "0", and B goes from a "0" to a "1" on the data transition at time $t_1$. Transition time $t_1$ represents the condition shown in row 14 of FIG. 7A. If B arrives late, the M Circuit will output an unwanted pulse for the time duration until the B input goes to "1", at which time the M Circuit will reset. This is a row 14 situation at the leading edge. At $t_2$ there is shown the row 7 condition of FIG. 7A where A goes from a "0" to a "1" and B goes from a "1" to a "0". If A arrives late, the M Circuit will set. This is a row 7 situation at the trailing edge. In FIG. 8B, at $t_1$, A goes from a "0" to a "1" and B goes from a "1" to a "0". If A arrives late, the M Circuit will set at $t_1$. This is a row 7 situation at the leading edge. At $t_2$, A goes from a "1" to a "0" and B goes from a "0" to a "1". If B arrives late, the M Circuit will output an unwanted pulse. This is a row 14 situation at the trailing edge.

These row 7 and row 14 situations rarely arise since data transitions generally arrive at the M Circuit inputs A and B simultaneously with the same rise times. Due to long transmission lines or extra capacity on a line, the above situations may arise. However, to avoid these situations one may place a capacitor or other appropriate delay means at the input which causes trouble.

The operation of the M Circuit in NOR form as a memory device was discussed above. The M Circuit may also act as a gate performing NAND, NOR, AND or OR functions. For an M Circuit to be utilized as a gate device, it must be operated sequentially in a pulsed manner. The f1 or NOR M will provide OR and NOR, as indicated in FIG. 3A by the f14 and f1 functions, respectively. In this mode of operation, the A and the B inputs are normally "1". Assume the data to be input comprises two "0's". The two "0" inputs cause the M Circuit to be set, with Q equals "0", $\overline{Q}$ equals "1". When the inputs return to their normal "1" state, the M Circuit will reset. For each of the remaining possibilities, A equals "0", B equals "1"; A equals "1", B equals "0"; and A equals "1", B equals "1"; the M Circuit will remain reset for each possibility and Q equals "1", $\overline{Q}$ equals "0" when pulsed. The output Q thus presents the OR function and $\overline{Q}$ presents the NOR function.

FIGS. 9A-9H show various gate and set-reset flip flop arrangements which may be used to obtain M Circuits. These are only shown by way of example and other arrangements are possible. Some of these are those configurations obtained when a wired OR gate and a wired AND gate are available. It should also be noted that only a three gate arrangement is shown. However, an infinite number of arrangements are possible if additional gates and inverters are used.

Figure 9A:
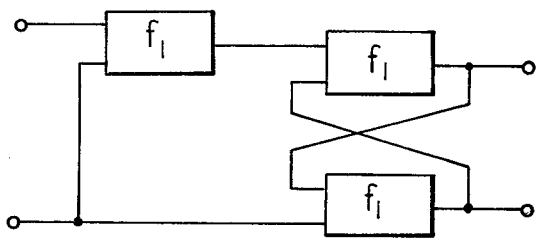
FIGS. 9A through 9H show block diagrams of various gates and set-reset flip flop arrangements which may be used to obtain M Circuits.
Figure 9E:
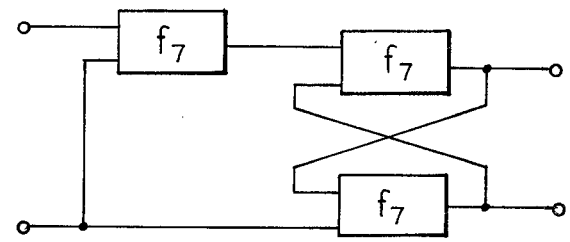
Figure 9B:
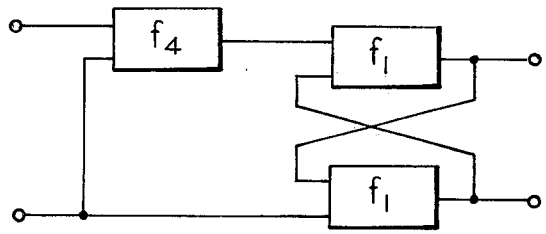
Figure 9F:
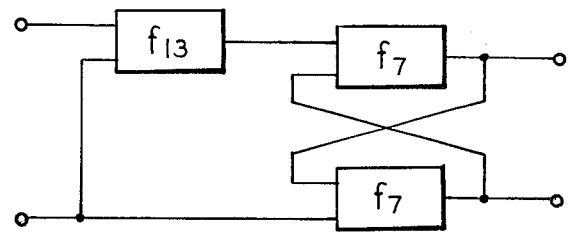
Figure 9C:
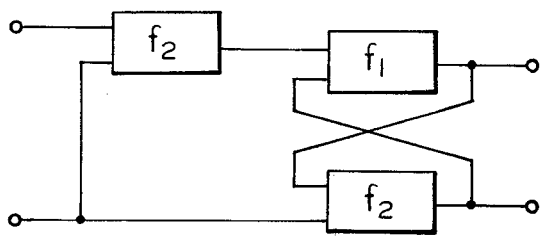
Figure 9G:
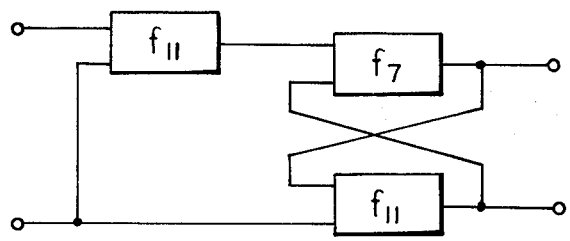
Figure 9D:
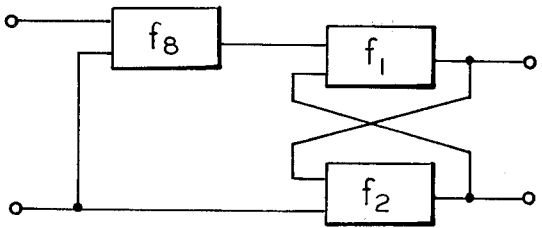
Figure 9H:
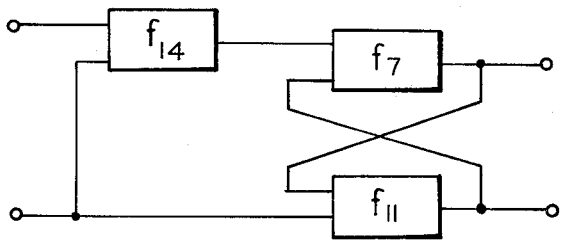

FIG. 9A is the f1 or NOR M Circuit described above. In FIG. 9B, the set-reset flip flop is the same as in FIG. 9A above, but the gate is an f4 gate. FIGS. 9C and 9D show flip flops made up of f1's and f2's with an f2 and f8 gate, respectively. FIGS. 9E and 9F show M Circuits comprising the f7 or NAND set-reset with an f7 and f13 gate, respectively. FIGS. 9G and 9H use set-reset flip flops made up of an f7 gate and an f11 gate with an f11 gate and an f14 gate, respectively. Another possibility not shown therein is the combination of an f1 gate or an f4 gate with a NOT set-reset flip flop shown above in FIG. 4E. This flip flop is equivalent to the f1 or NOR flip flop of FIG. 4A.

The circuits shown in FIGS. 9A-9H are each M Circuits. The truth tables associated with each may not be exactly the same as that of FIG. 7A. For example, the output "1's" and "0's" may be interchanged, Q may be a "1", and $\overline{Q}$ a "0". However, such M Circuits will perform the operations described herein as long as their truth table differences are noted. That is, each of the M Circuits shown in FIGS. 9B-9H have the common characteristics of the f1 or NOR M Circuit shown in FIG. 6 and FIG. 9A, in that each M Circuit will not produce the logic fallacy (Q equals $\overline{Q}$), it will have a two level binary input and a two level binary output, it will have a set condition, a reset condition and a memory condition, and it will provide the dual capability of resetting the M Circuit and enabling the M Circuit to be set under defined conditions in accordance with the truth table method outlined above.

SINGLE M CIRCUITS

Figure 10A:
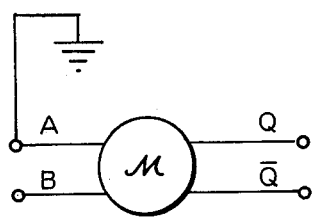
FIGS. 10A through 10E show various M Circuit subsystems.
Figure 10C:
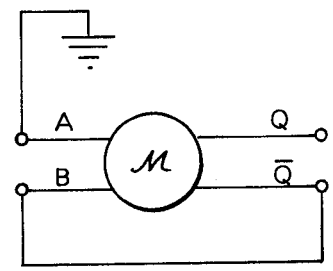
Figure 10D:
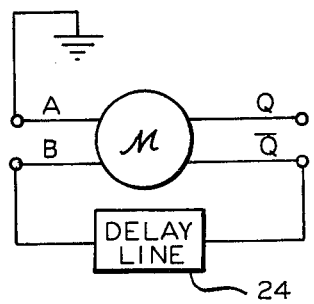
Figure 10E:
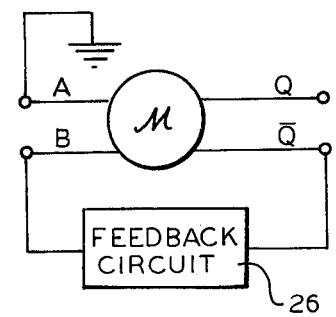
Figure 10B:
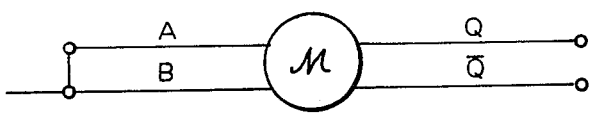

Referring to FIGS. 10A-10E, there are shown various M Circuit subsystems. A single M Circuit may have any of its terminals interconnected to provide various operations. As was stated above, the M Circuit used in the FIGS. is of the f1 or NOR gate form having the characteristics set forth in the truth table of FIG. 7A. In FIG. 10A the A input is grounded. A "1" at the B input will output Q equals "1", and $\overline{Q}$ equals "0". A "0" at the B input will output Q equals "0", $\overline{Q}$ equals "1". Thus, in this configuration, the M Circuit is an inverter outputting the complement of B at $\overline{Q}$ and the complement of $\overline{Q}$ at Q. In FIG. 10B, the inputs A and B are interconnected so that the inputs are always the same. This is another type of inverter.

FIG. 10C shows another M Circuit wherein the A input is placed at logic "0" and the $\overline{Q}$ output is connected to the B input. If $\overline{Q}$ is a "1", B will be a "1", this "1" at B will cause the M Circuit to reset providing Q equals "1", $\overline{Q}$ equals "0". This "0" at B will cause the M Circuit to set since the A input is "0". This sequence will continuously repeat itself at the natural frequency of the M Circuit and thus the M Circuit in this configuration is an oscillator. If means are provided at the A input so that A may be changed at will, or on data demand, from a "0" to a "1" and from a "1" to a "0", the oscillations will stop when A is "1" and the oscillations will start when A is a "0".

The frequency of oscillation of the M Circuit of FIG. 10C may be controlled by placing an element in the $\overline{Q}$ output to B input connection. As shown in FIG. 10D, this may comprise a delay line indicated by the numeral 24. Delay lines may be constructed with high accuracies and stability. Accordingly, the M Circuit shown in FIG. 10D may provide an accurate time base oscillator.

In general, the feedback circuit in the $\overline{Q}$ output to the B input may be of any desirable form and is designated in FIG. 10E as numeral 26. This feedback circuit may be a delay line, a crystal, various combinations of capacitors, inductors, resistors, and so on in known configurations. These may be selected using filter and feedback theories to obtain various outputs in conjunction with the enabling and disabling effect of the A input. The feedback elements are not restricted to passive components. Active elements, such as operational amplifiers and their known analog connections, may also be used. The methods by which assemblages of circuits of this type may be provided to obtain oscillating, pulse generating, and wave shaping systems will be described below.

GATES CONNECTED TO M CIRCUITS

The M Circuit described above and arrangements of M Circuits, some of which will be described below, may be connected to gates. Two types of gates will be referred to herein as "class 1" and "class 2" gates. A class 1 type of gate is defined herein as a gate which operates in a mode wherein a data change will occur at the output for any data change, in any possible combination, at the input where all of the inputs were initially at the same level. A class 2 type of gate is defined as a gate which operates in a mode wherein a data change at the input will not provide a data change at the output unless the gate is enabled.

Figure 11A:
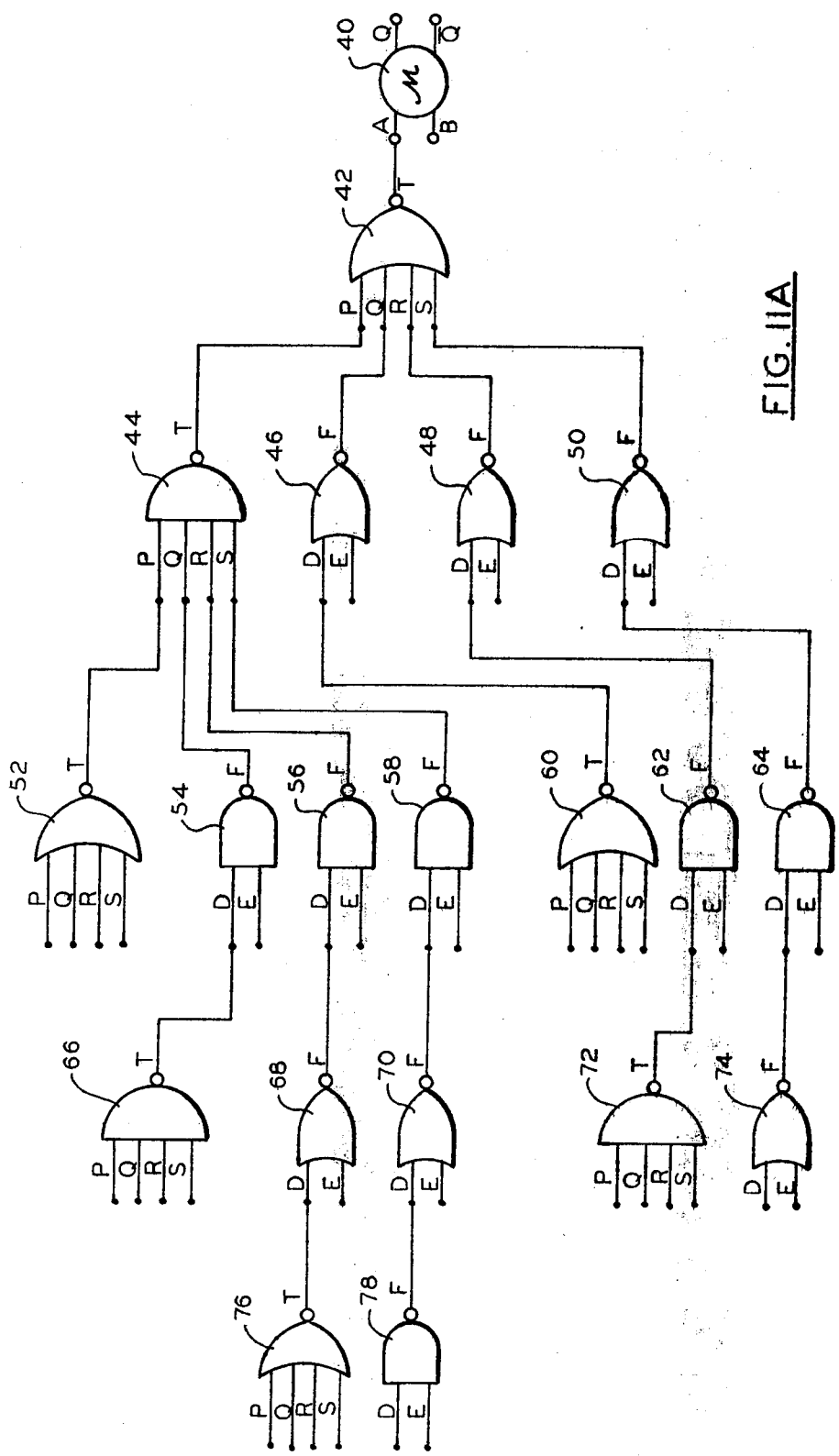

In the FIG. 11A, the gates 42, 44, 52, 60, 66, 72 and 76 are class 1 types of gates in their mode of operation. The input lines of each class 1 type of gate is indicated by the letters P, Q, R and S, and the output line is indicated by the letter T. On the other hand, gates 46, 48, 50, 54, 56, 58, 62, 64, 68, 70, 74 and 78 are class 2 types of gates in their mode of operation. The input lines of each class 2 type of gate is indicated by the letters D and E, and the output line is indicated by the letter F. In terms of the actual hardware which forms the class 1 and class 2 types of gates, such gates are NAND and NOR gates as shown in FIGS. 11A-F.

In FIG. 11A the A input of M Circuit 40, referred to as M40, is connected to the T output of class 1 gate 42. The inputs P, Q, R and S of gate 42 are normally "0" and the output T is normally "1". Any data change or combination of data changes to gate 42 at the inputs will provide a "0" at the output T. This "0" at the A input of M40 will set M40 if the B input is "0".

The P input of class 1 gate 42 is connected to the output of class 1 gate 44. The P, Q, R and S inputs of gate 44 are normally "1" and the output is normally "0". Any data change or combination of data changes to a "0" at the input of gate 44 will appear at the T output as a "1", and M40 will set as described above.

The P input of class 1 gate 44 is connected to the T output of class 1 gate 52. The gate chains which can be connected to the input to gate 52 are of the same type as the gate chains associated with gate 42 and, therefore, a further gate chain for the gate 52 will not be shown or described.

The Q input of gate 44 is shown connected to the F output of class 2 gate 54. The input D of gate 54 refers to data, while the input E refers to an enable of gate 54. These inputs D and E are normally "0" and the output of gate 54 is normally "1". A data change from a "0" to a "1" at the D input of gate 54 will not appear as a data change at the output F if the E input is "0". If the E input is "1", a data change at the D input from a "0" to a "1" will appear at the F output as a "0". As described above, this "0" at the F output of gate 54 will appear at the Q input to gate 44 causing a "1" at the T output of gate 44 which in turn causes a "0" at the T output of gate 42. In turn, the "0" at the T output of gate 42 appears at the A input of M40, and M40 will set if its B input is "0", as described above.

The D input of gate 54 is connected to the output of class 1 gate 66. The gate chains which can be connected to the input of gate 66 are of the same type as the gate chains associated with gate 44 and, therefore, further gate chains for the gate 66 will not be shown or described.

The R input of gate 44 is connected to the F output of class 2 gate 56. The gate chain operation of gate 56 is essentially the same as the operation for gate 54 described above except that the D input is connected to the F output of class 2 gate 68.

The D and E inputs of class 2 gate 68 are normally "1" and the F output is normally "0". A data change from a "1" to a "0" at the D input will not appear as a data change at the output if the E input is a "1". If the E input is "0", a data change at the D input from a "1" to a "0" will appear at the output as a "1", and M40 will set as described above. The D input of gate 68 is connected to the T output of class 1 gate 76. The gate chain operation of class 1 gate 76 is the same as the operation of class 1 gate 42.

The S input of class 1 gate 44 is connected to class 2 gate 58 which in turn is connected at its input to class 2 gate 70. The gate chain operation of gate 58 and gate 70 is the same as the operation of gate 56 and gate 68 described above, except that the D input of gate 70 is connected to the output of a class 2 gate 78. The operation of gate 78 is the same as the operation of gate 54, gate 56 and 58 described above.

The Q output of gate 42 is connected to the output of class 2 gate 46. The gate chain operation of gate 46 is the same as the operation of class 2 gate 68 described above.

The R input of gate 42 is connected to the output of class 2 gate 48. The D input of gate 48 is connected to the output of class 2 gate 62 which in turn is connected at its D input to class 1 gate 72. The operation of gate 48 is the same as the gate chain operation of class 2 gate 70 described above.

The S input of gate 42 is connected to the output of class 2 gate 50. The D input of gate 50 is connected to the output of class 2 gate 64 which in turn is connected at its D input to class 2 gate 74. The gate chain operation of gate 50 is the same as the operation of class 2 gate 58 described above.

Figure 11B:
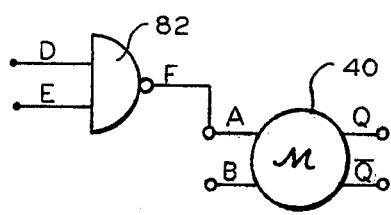

Referring to FIG. 11B, there is shown another method of selectively feeding data to the A input of an M Circuit. FIG. 11B illustrates selective feeding to a class 2 gate 82 as contrasted with the selective feeding of date to the class 1 gate 42 as described above with reference to FIG. 11A. In FIG. 11B, there is shown the F output of class 2 gate 82 connected to the A input of M40. The gate chain operation of gate 82 is the same as the operation of gates 54, 56 and 58 described above except that, here, the change from a "1" to a "0" at the output of gate 82 will set M40.

Figure 11C:
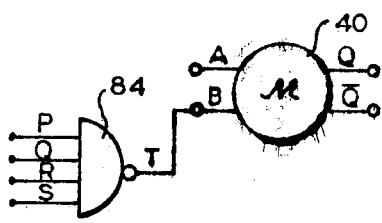

FIG. 11C shows the preferred method of selectively feeding data through a class 1 type of gate 84 to the B input of an M Circuit 40. In FIG. 11C, the T output of class 1 gate 84 is connected to the B input of M40. The gate chain operation of gate 84 is the same as the operation of class 1 gate 44 described above except that, here, the data change at the output of gate 84 will reset M40.

Figure 11D:
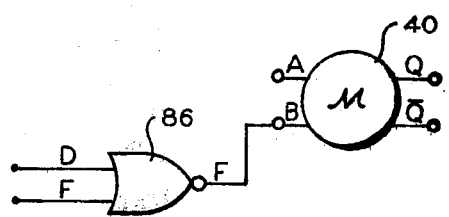
Figure 16:
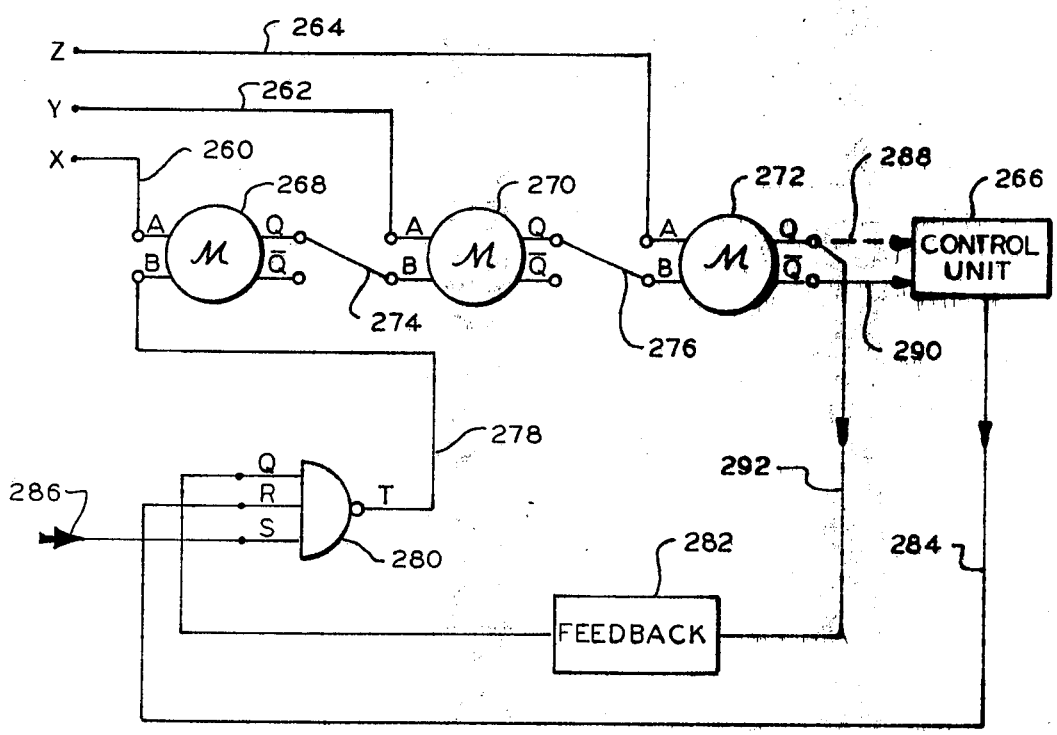

FIG. 11D shows the preferred method of selectively feeding data through a class 2 type of gate 86 to the B input of and M Circuit 40. In FIG. 11D, the input B of M40 is shown connected to the F output of class 2 gate M40. The gate chain operation of gate 86 is the same as the operation of class 2 gates 46, 48 and 50 described above except that, here, a change at the output of gate 86 will reset M40.

In FIG. 11E, there is shown a gating arrangement wherein a plurality of class 2 type of gates 88, 90, 92 and 94 are combined for parallel operation. The gates shown are NAND gates having their E input lines connected to a common enable line 96. In the arrangement shown, a high or "1" signal on the enable line 96 will allow data to pass through the gates.

FIG. 11F shows a parallel arrangement of class 2 type of gates similar to the arrangement shown in FIG. 11E wherein a plurality of class 2 gates 98, 100, and 102 have their E inputs connected to a common enable line 104. In this arrangement, the gates 98, 100 and 102 are NOR gates. In the arrangement of FIG. 11F, a low or "0" provided at line 104 to the E input will enable data to pass through the gates.

In any specific application of M Circuits, arrangements of class 1 gates and class 2 gates may or may not be found in any of the infinite number of arrangements which may be provided using the methods described above. The importance of the concept of these two types of gates and their interconnections is that this type of gating concept provides a method of directly translating specifications for data generating, data processing and data separating systems into the M Circuit systems. That is, prior art generating, data processing and data separating systems ordinarily provide specifications which must first be translated into some form of mathematics, such as Boolean algebra in logic systems, before an appropriate circuit can be designed to implement the specifications. However, through the use of the M Circuit systems including the gate arrays described herein, the need for such mathematical translations is eliminated.

Referring to FIG. 12A, there is illustrated the general method of connecting gates to M Circuits. Here, the C output of a gate 106 providing a Boolean function, indicated as $f_n$, is connected to the A input of M40, and the C output of another $f_n$ function gate 108 is connected to the B input of M40. In FIG. 12B, there is shown an $f_n$ gate 110 connected to M40 as described above. Here, the N input to gate 110 is connected to the C output of a further $f_n$ function gate 112. This process may be extended infinitely.

In FIG. 12C, there is shown another useful connection of general types of gates to an M Circuit. Here, the A input of M40 is connected to the C output of NAND gate 114. The inputs 1, 2, ..., N, of NAND gate 114 are normally "0" and the output C of NAND gate 114 is normally "1". Also, a NAND gate 116 operates in a similar manner as the NAND gate 114 except that the C output of NAND gate 116 is connected to the B input of M40. For M40 to set, the 1, 2, ... N inputs of NAND gate 114, and the 1, 2, ... N inputs of NAND gate 116 must all be "1" thereby providing a "0" at both the A and B inputs to M40. This is a coincidence circuit.

LINEAR M CIRCUIT ARRAYS

The M Circuit is useful when used in combination with other M Circuits. In general, all interconnections of inputs and inputs, outputs and inputs, outputs and outputs, and combinations thereof are useful. The only care which must be exercised is to insure that outputs are not interconnected unless the M Circuit design provides for wired AND or wired OR at the outputs.

In FIG. 13, there is shown a number of possible two M Circuit interconnections. In the arrangement of FIG. 13A, two M Circuits M120 and M122 have their A inputs connected together by line 124. In this case a "0" on the A line will set M120 or M102 or both, if the respective B inputs are "0". This connection is useful in the selective transfer of data from an M system to M120 and/or M122 which may be a type of memory bank. In FIG. 13B, the A input of M126 is connected by a line 130 to the B input of M128. In this arrangement, a "0" at the A input of M126 will prevent M128 from being reset if M128 is set during the "0" at the A input. When the A input of M126 is "1", M128 will always be reset. In FIG. 13C, the B input of M132 is connected via line 136 to the A input of M134. Here, a "0" at the B input of M132 will enable M134 to set if the B input of M134 is "0" or goes to "0" while the B input of M132 is "0". When the B input of M132 is "1", M134 is set or reset depending upon the input history at the B input of M134. That is, the M134 is placed in memory, set or reset, when its B input is at "0" and its A input is at "1". The Q and $\overline{Q}$ outputs of M134 are determined by whether M134 was in the set or reset condition prior to being placed in memory. In FIG. 13D, the B input of M138 is connected via line 142 to the B input of M140. Here, a "1" on the B line resets both M138 and M140, and a "0" on the B line enables M138 and M140 to be set. In FIG. 13E, the Q output of M144 is connected via line 148 to the A input of M146. Here a "0" at the Q output of M144 will be applied on line 148 to set M146 if the B input of M146 is "0". This interconnection is also used to transfer data from an M Circuit or M Circuit system to a memory bank. In FIG. 13F, the $\overline{Q}$ output of M150 is connected via line 154 to the B input of M152. In this interconnection, when M150 is reset, M152 is enabled to be set at the B input, and when M150 is set, M152 is reset.

Figure 13A:
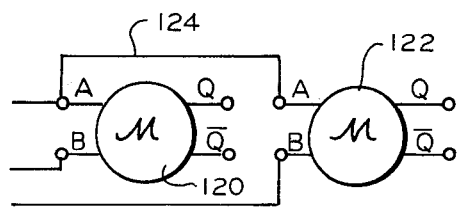
FIGS. 13A through 13I show various arrangements of two M Circuits interconnected at their input and output terminals.
Figure 13B:
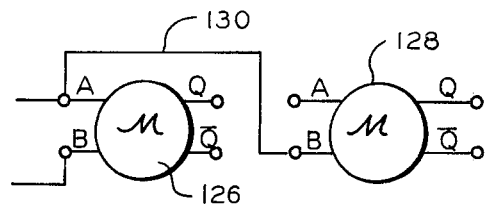
Figure 13C:
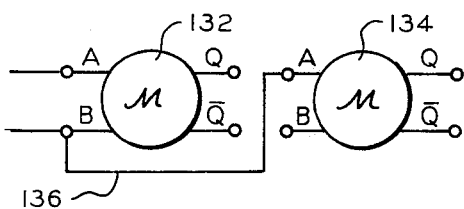
Figure 13D:
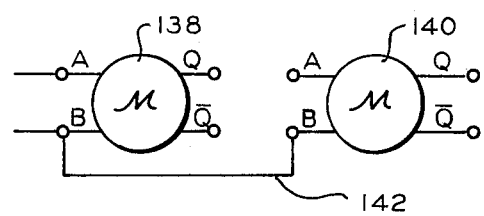
Figure 13E:
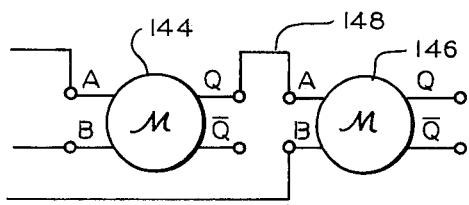
Figure 13F:
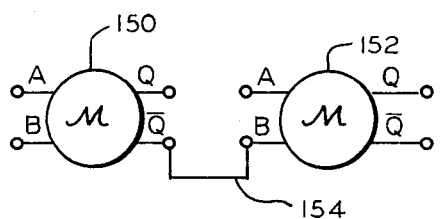
Figure 13G:
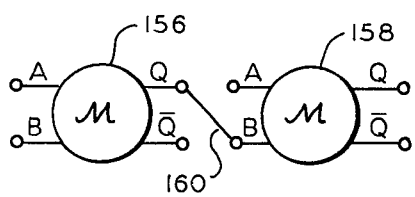
Figure 13H:
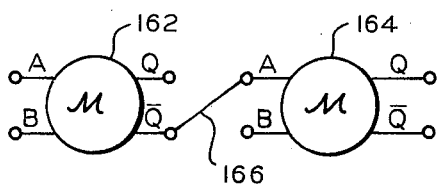
Figure 13I:
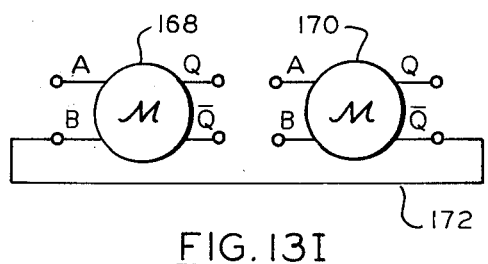

Another very useful M Circuit interconnection is shown in FIG. 13G. In this arrangement, the Q output of M156 is connected via line 160 to B input of M158. When M156 is reset, M158 is also reset. When M156 is set, M158 is enabled by a "0" at its B input and a "0" at its A input will set M158. If both M156 and M158 are set, a "1" at the B input of M156 will reset both M156 and M158. It may be noted that, in this interconnection, the ability of the B input of M156 to both enable M156 and M158 to set, and to reset both M156 and M158 is an operation previously performed in known systems by separate inputs. In FIG. 13H, the $\overline{Q}$ output M162 is connected via line 166 to the A input of M164. In this interconnection, when M162 is reset, M164 is enabled at the A input to set if the B input of M164 is or goes to "0". Now, if M162 is set, the A input of M165 is "1" and M164 is set or reset depending upon the input history at the B input of M164. In FIG. 13I, the $\overline{Q}$ output of M170 is connected via line 172 to the B input of M168. In this interconnection, if M170 is reset, M168 is enabled at the B input to be set, and if M170 is set, M168 is reset. Interconnections using more than two M Circuits are described below.

Figure 14A:
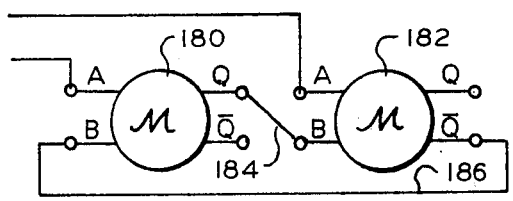
FIGS. 14A through 14F show various combinations of interconnections of two M Circuits.

Referring to FIGS. 14A-14F there are shown, by way of example, combinations or interconnections. It is obvious that the number of possible interconnections is infinite when the gates and gate chains described above are placed at the input and output terminals of M Circuits. In FIG. 14A, the combination of the interconnections of FIG. 13G and FIG. 13I is shown, wherein the Q output of M180 is connected via line 184 to the B input of M182, and the B input of M180 is connected via line 186 to the $\overline{Q}$ output of M182. In this combination of interconnections, if M180 and M182 are set, M180 and M182 are immediately reset by the "1" at $\overline{Q}$ of M182 applied via line 186 to the B input of M182. To illustrate the operation, assume as a first input condition, that a "1" is applied to the A input of M180 and a "0" is applied to the A input of M182. Here, M180 is in memory in reset, and M182 is reset. M180 is in memory in reset because any B input to M180 could not possibly be a "1". This can be shown by assuming that the B input of M180 is a "1" thereby causing M180 to be reset with its Q output providing a "1" which in turn resets via line 184 the M182 resulting in a "0" at the $\overline{Q}$ output of M182. This "0" at the $\overline{Q}$ of M182 is fed back on line 186 to the B input of M180. Thus, M180 cannot be in reset since its B input is a "0". Also, since, according to the assumption, the A input of M180 is a "1", then M180 cannot be set. Now, let us assume as a second input condition that a "0" is applied to the A input of M180 and a "1" is applied to the A input of M182. This "0" at the A input of M180 will set M180 and thereby provide a "0" on line 184 to the B input of M182. The "0" at the B input of M182 enables M182 to be set. With a "1" at the A input and a "0" at the B input of M182, M182 will be in memory in reset, since its last condition was reset. It is noted at this point that the set, reset and memory logic associated with the M Circuits is described above in reference to FIGS. 7B, 7C and 7D. Assume that as a third condition a "1" is placed on the A input of M180 and a "0" is placed at the A input of M182. The "1" at the A input of M180 places M180 in memory in set while the "0" at the A input of M182 sets M182. With M182 set, a "1" at the $\overline{Q}$ output of M182 will reset M180, and the resulting "1" at the Q output of M180 will be applied via line 184 to the B input of M182 to reset M182. With M182 reset, the "0" at the $\overline{Q}$ output will place M180 in memory in reset. It is noted that M180 is in memory in reset because its last condition was the reset condition prior to being placed in memory according to the circuit analysis described above. Thus, M180 is in memory in reset and M182 is reset for the third input condition described above.

Figure 14B:
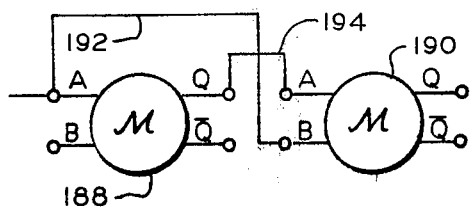

FIG. 14B shows the combination of the interconnections of FIGS. 13B and 13E above, wherein the A input of M188 is connected via line 192 to the B input to M190, and the Q output of M188 is connected via line 194 to the A input of M190. In this arrangement, a "0" at the A input of M188 will set M188 and will set M190 since the Q output of M188 will be "0". The A input of M190 will be "0" and the B input of M190 will be "0" since the A input of M188 is "0". Thus, M190 will be set as long as the A input of M188 is "0". Of course, a "1" at the B input of M188 will reset M188 and place a "1" at the A input of M190.

Figure 14C:
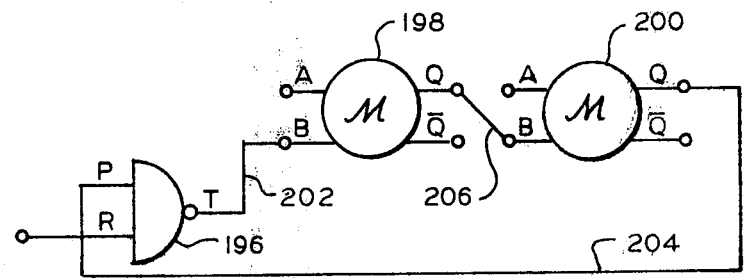

In FIG. 14C, the use of class 1 gates described with reference to FIGS. 11A-11E is shown in an M Circuit interconnection. Gate 196 is a class 1 type of gate having its T output connected via line 202 to the B input of M198, and the P input of such gate 196 is connected via line 204 to the Q output of M200. Also, the Q output of M198 is connected via line 206 to the B input of M200. M198 and M200 initially will be reset. This may be accomplished, for example by placing a momentary "0" on input line R to class 1 gate 196, which produces a "1" at the T output of gate 196 to reset M198 and in turn reset M200. By removing the "0" at the R input to gate 196, its T output will return to "0" and thereby enable M198 to be set. If M198 and M200 are then set, the "0" at the Q output of M200 will provide a "0" at the P input of gate 196 thereby resetting M198 and M200.

Figure 14D:
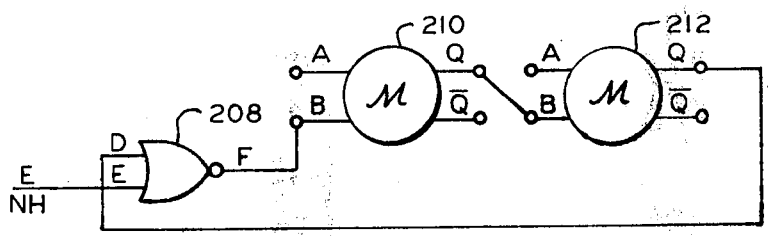
Figure 14E:
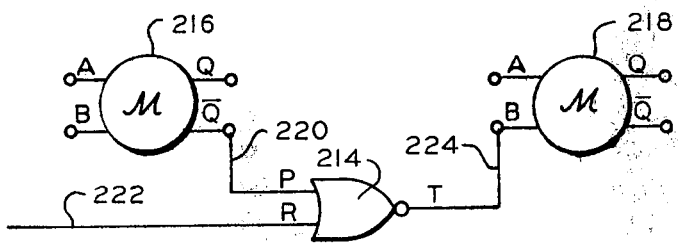

A similar circuit is shown in FIG. 14D except that, here, a class 2 type of gate 208 is used in place of the class 1 gate 196. Gate 208 will not permit M210 and M212 to be reset by the setting of M212 unless the enable input E of gate 208 is "0". In FIG. 14E, there is shown a class 1 gate 214 connected between M216 and M218. In this arrangement M218 will be enabled at its B input if M216 is set or if the R line of class 1 gate 214 is "1". This is because the gate 214 normally receives a "0" or low at its P and R input lines 220 and 222 and provides a "1" or high at its T output line to the B input of M218, thereby holding M218 reset. A change at either of the input lines 220 and 222 to the gate 214 will produce a low or "0" at its output, thereby enabling M218. If, however, the R input line 222 or gate 214 is normally "0", a "1" on line 222 will reset M218. In this form, this connection may be used to provide high speed resetting at any or all stages of an M Circuit system.

Figure 14F:
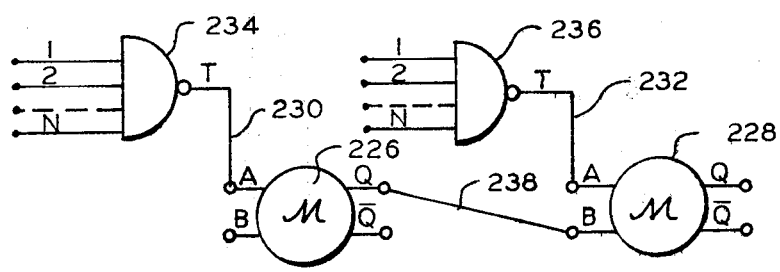
Figure 15A:
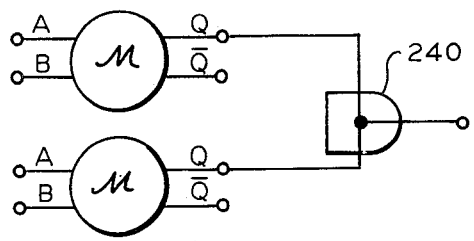
Figure 15E:
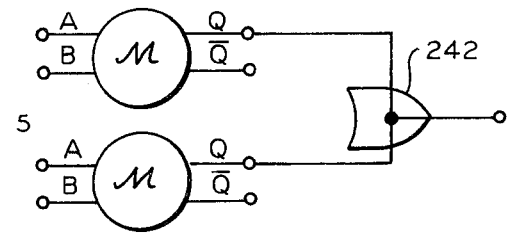
Figure 15B:
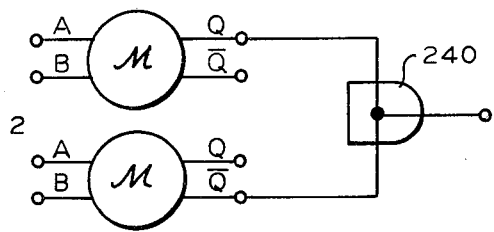
Figure 15F:
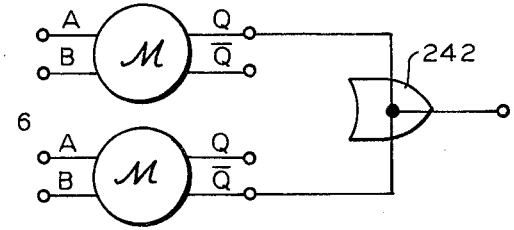
Figure 15C:
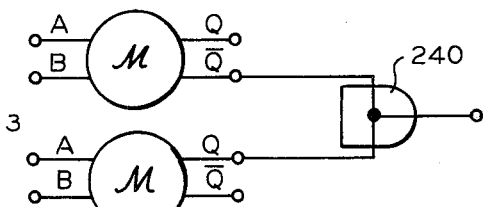
Figure 15G:
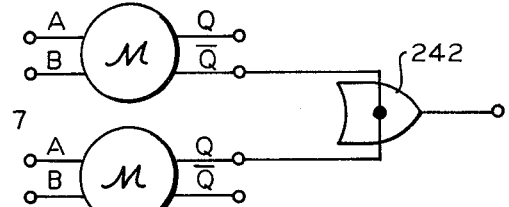
Figure 15D:
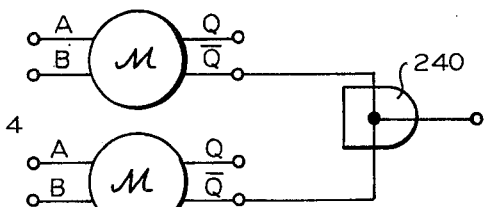
Figure 15H:
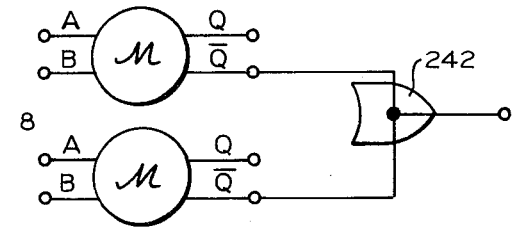
Figure 15I:
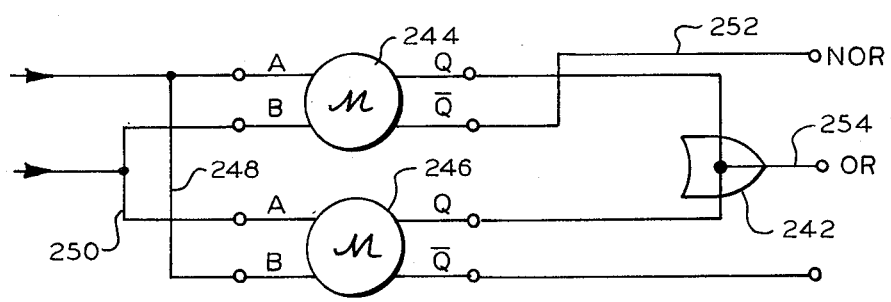
Figure 18:
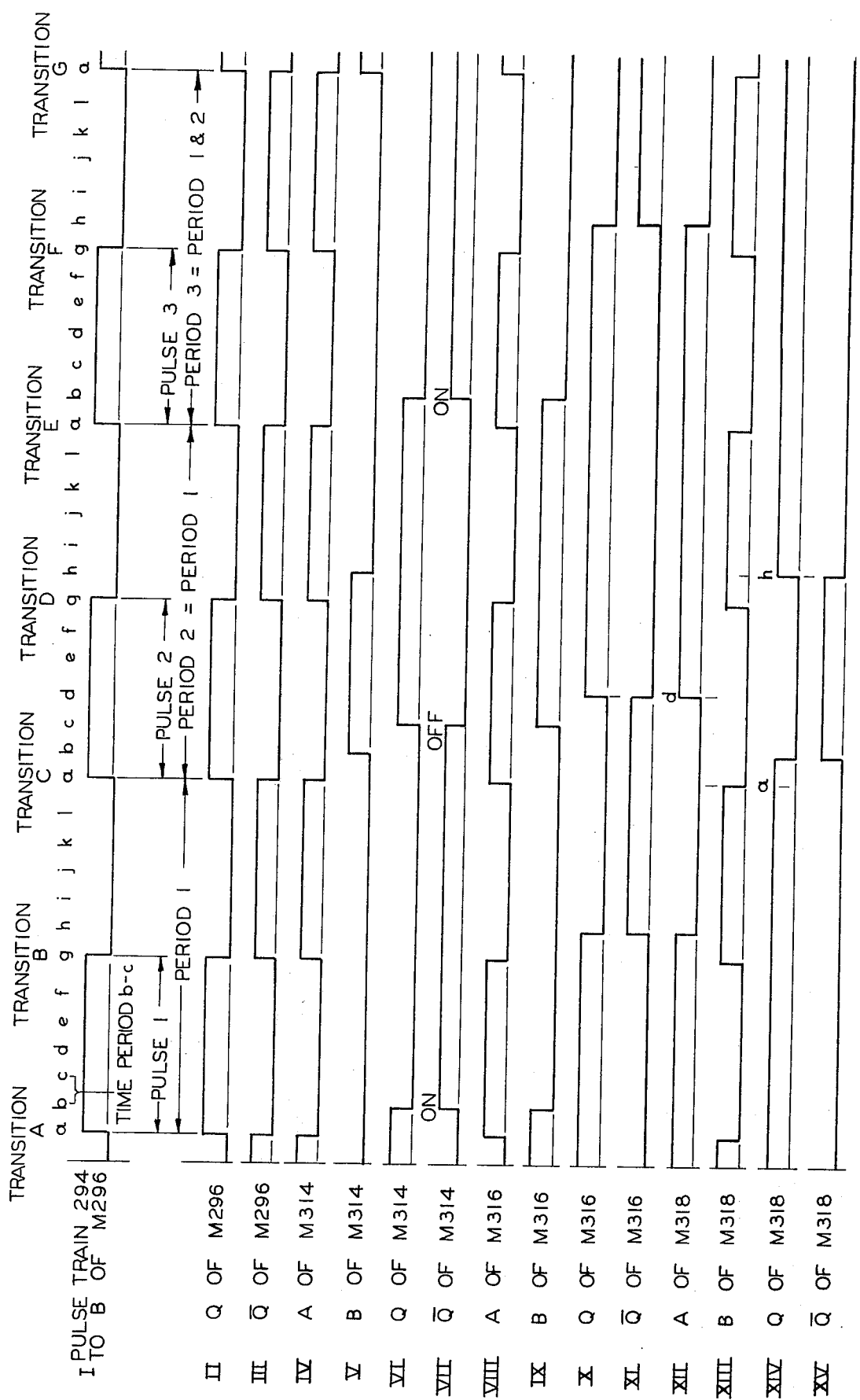
Figure 19:
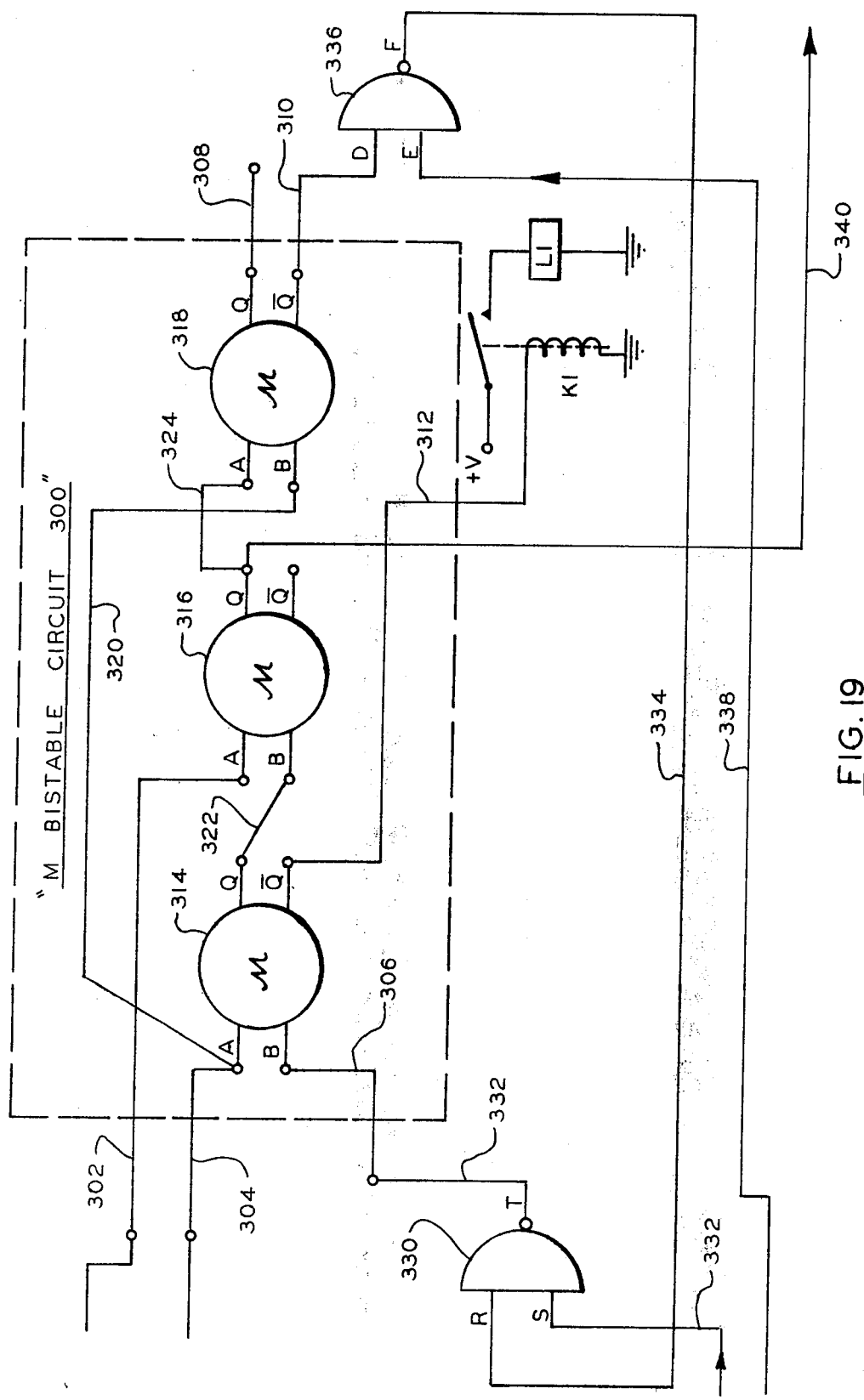
Figure 20A:
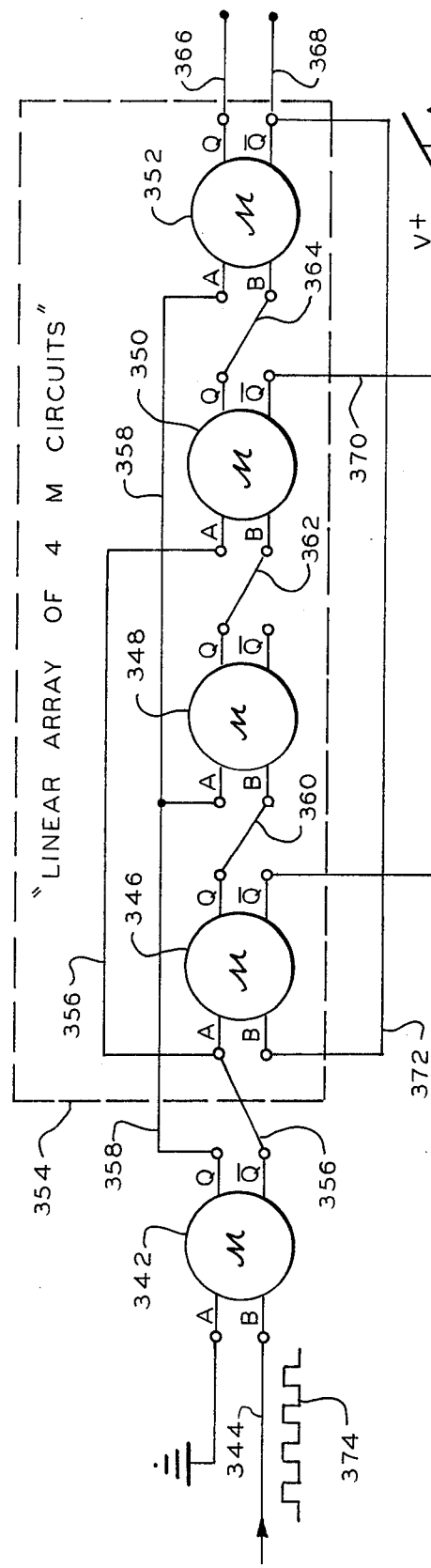
Figure 20B:
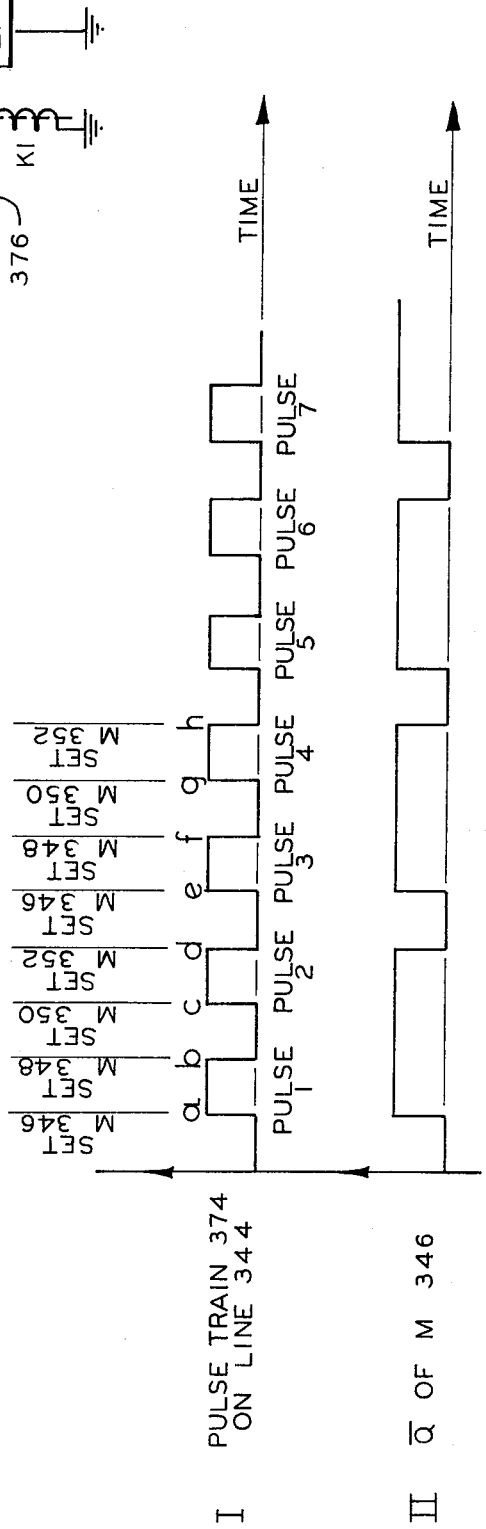
Figure 21:
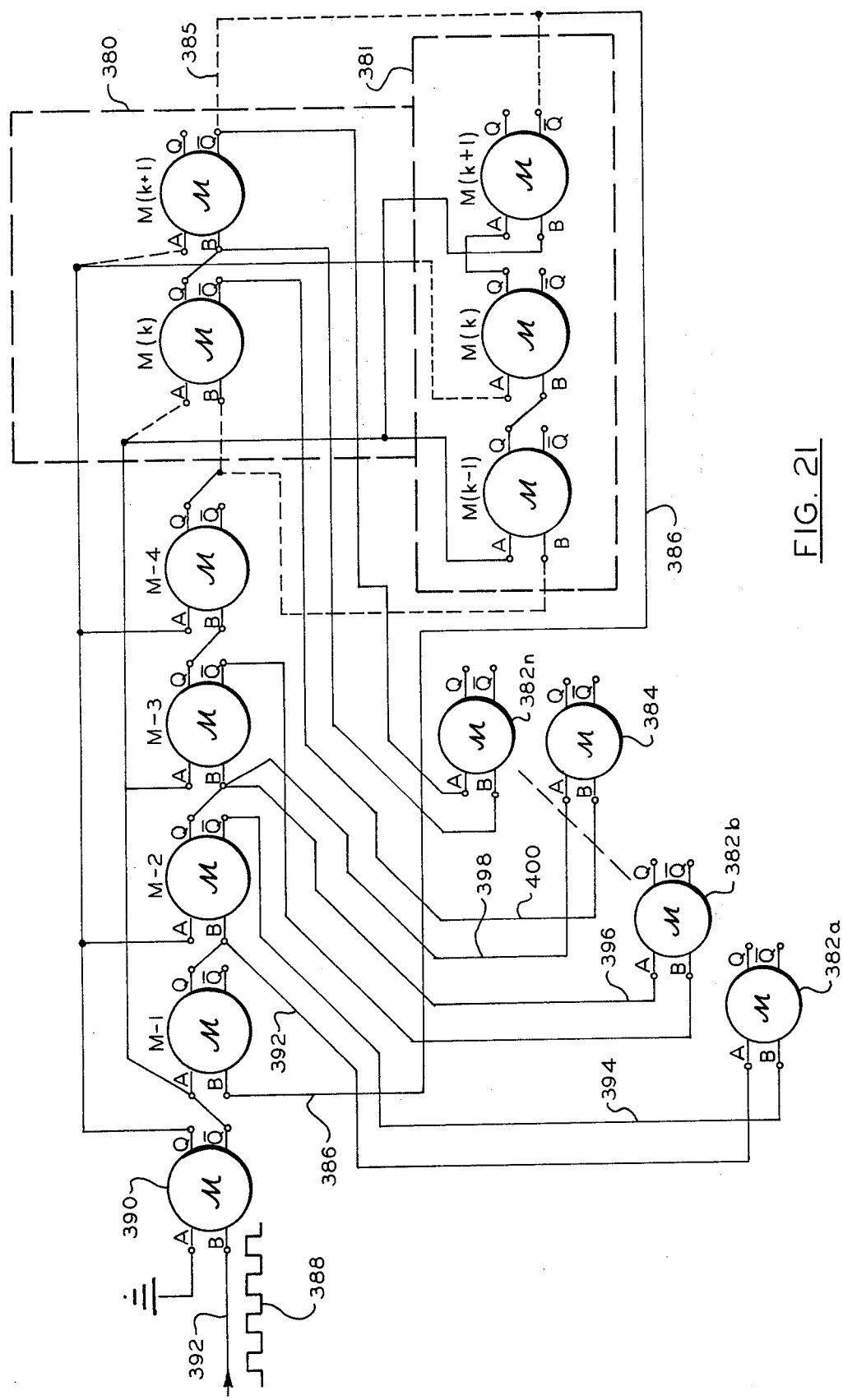
Figure 22:
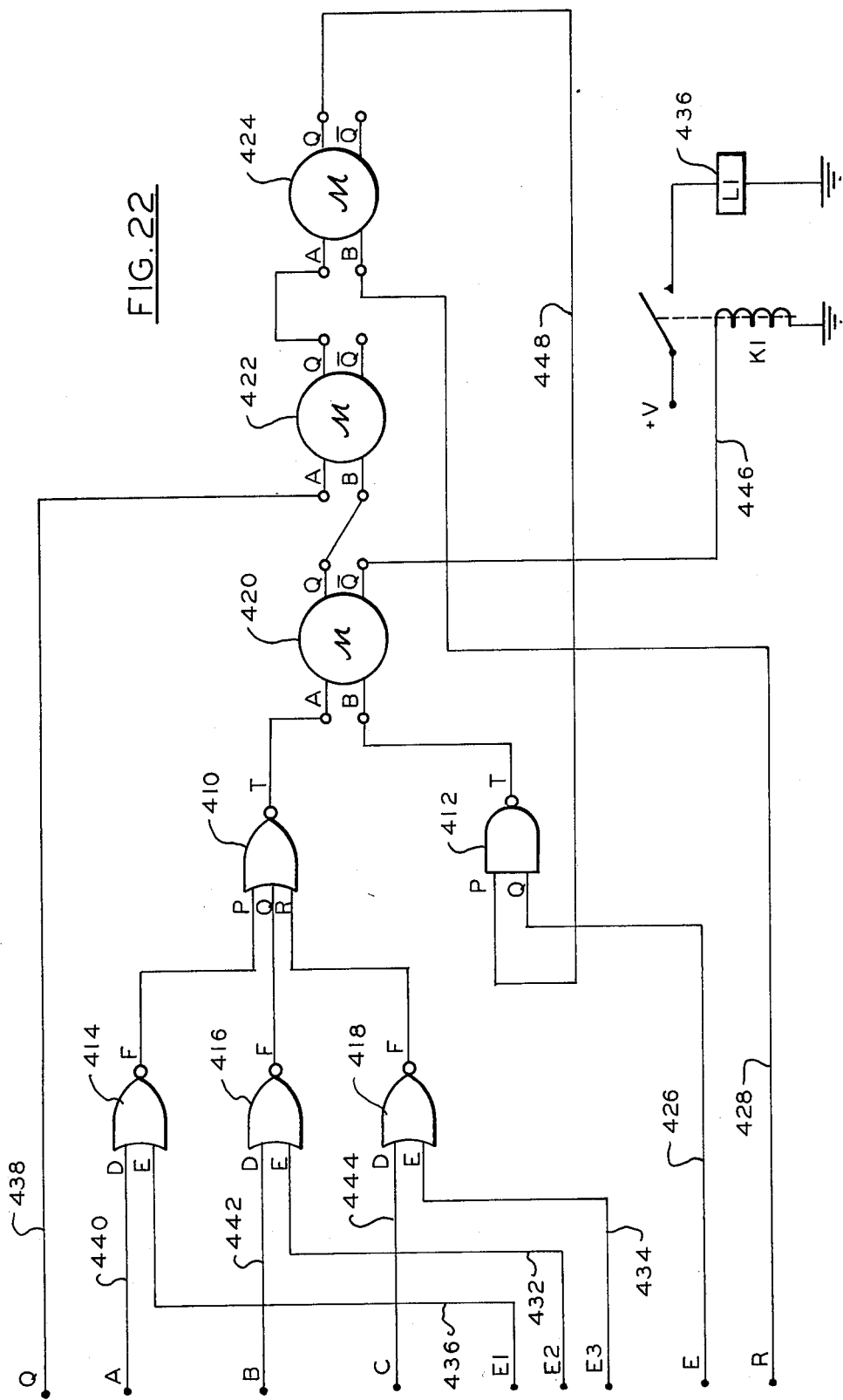
Figure 23:
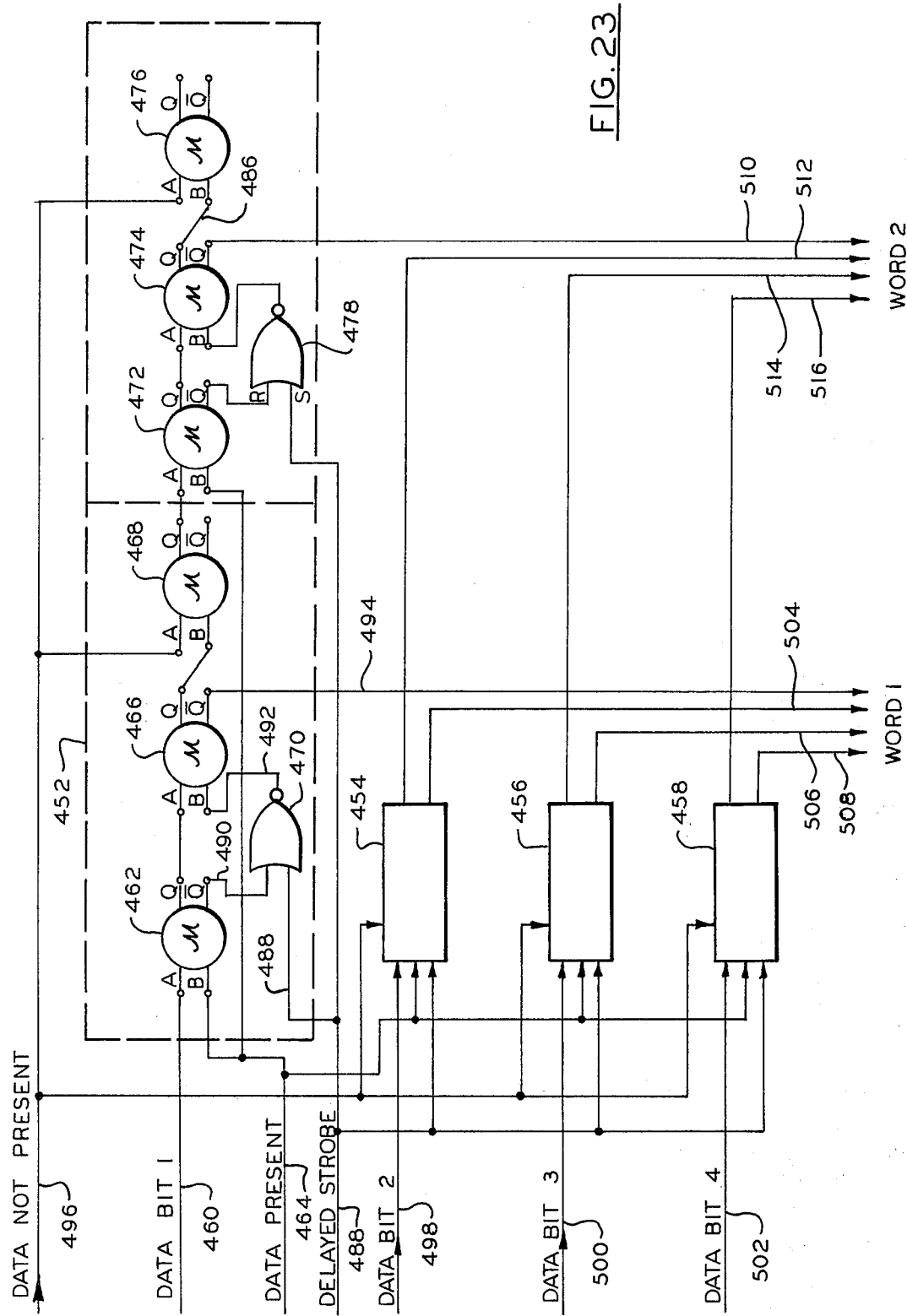
Figure 24:
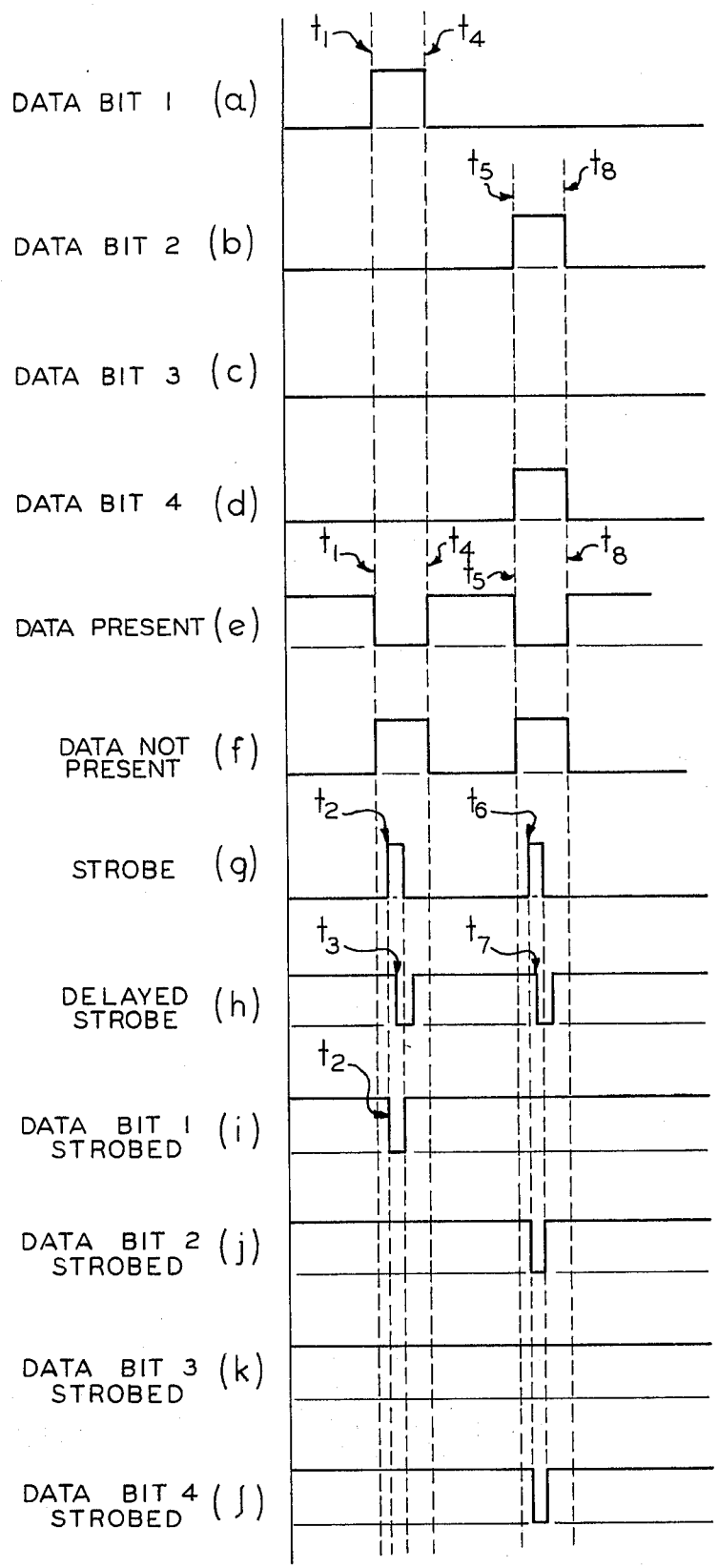
Figure 25A:
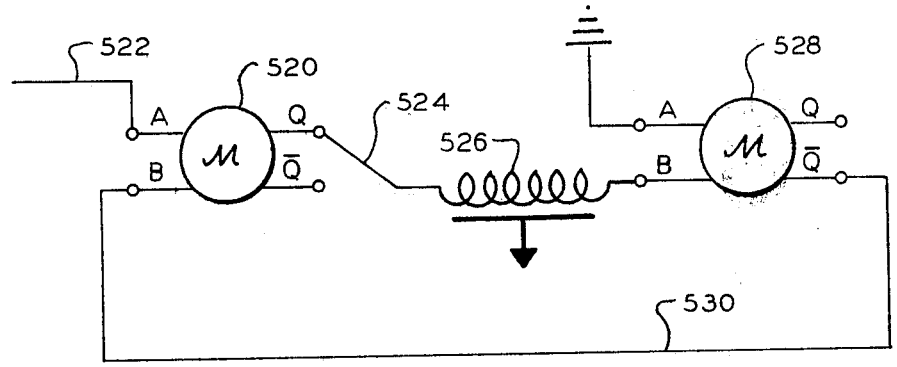
Figure 25B:
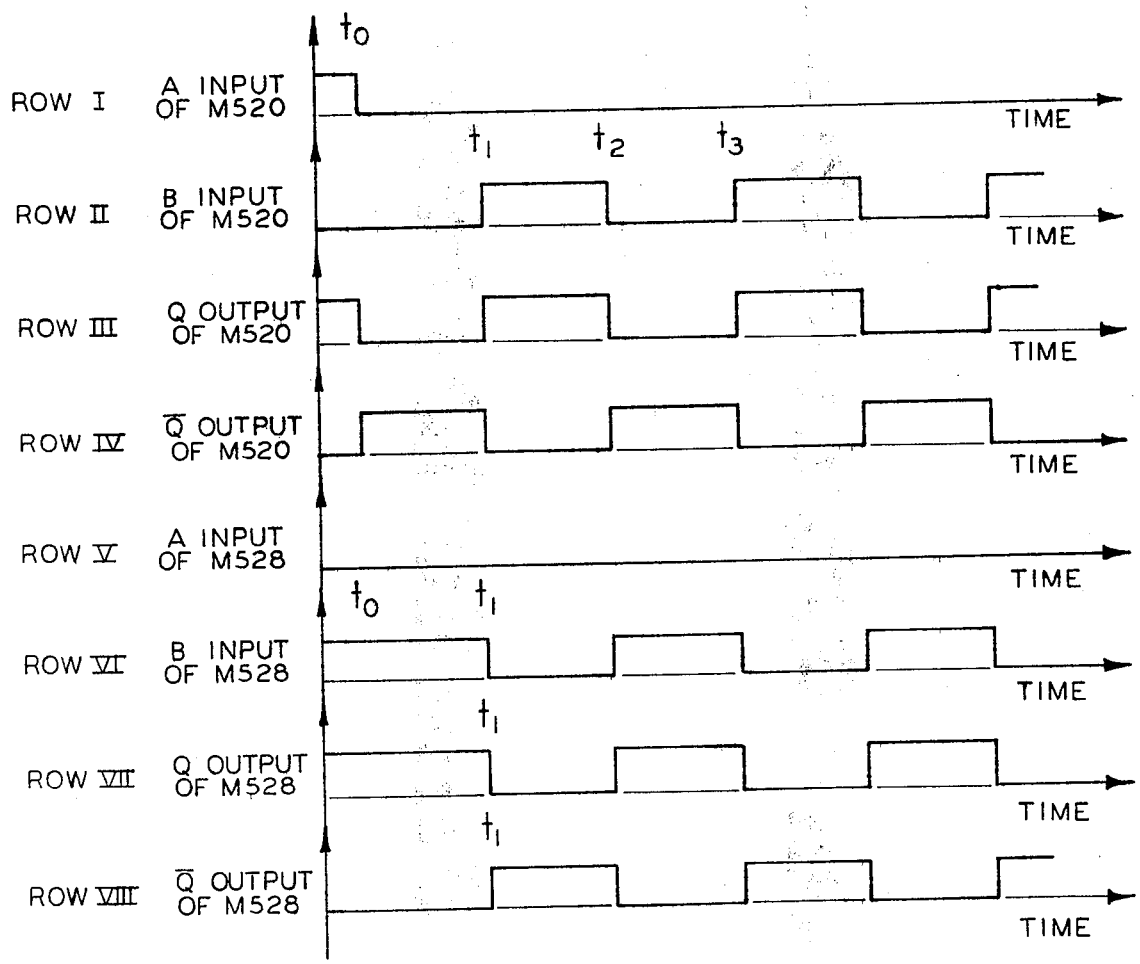
Figure 26A:
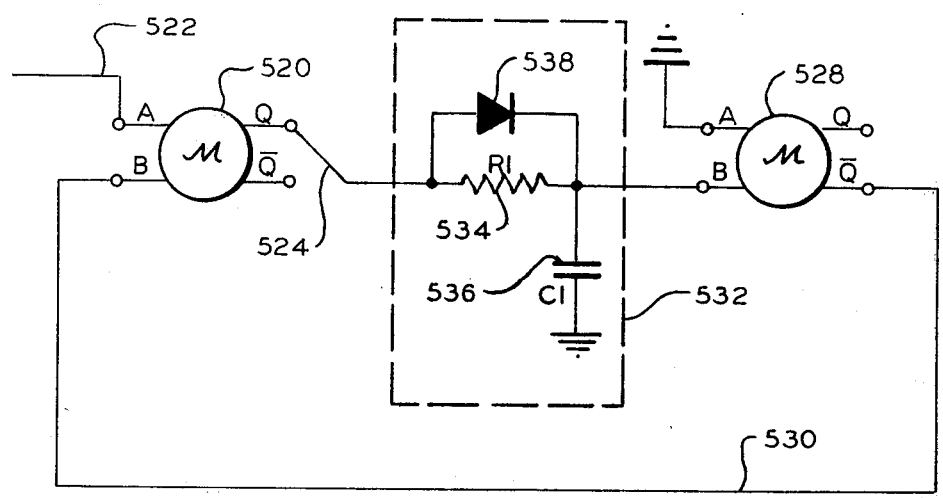
Figure 26B:
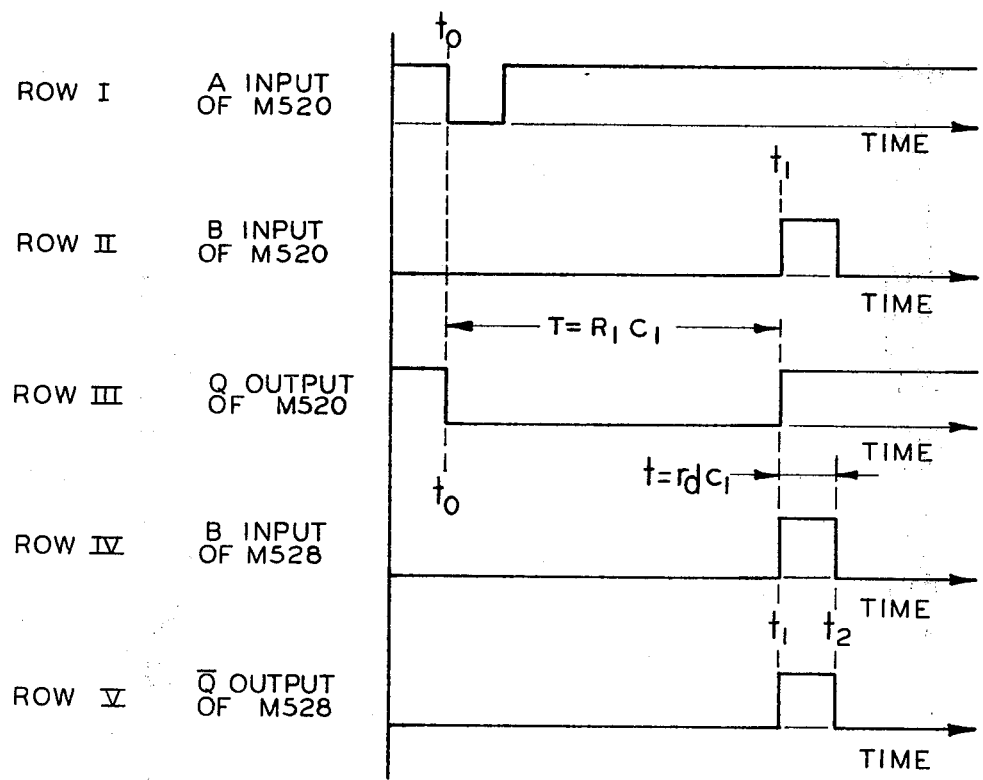
Figure 27A:
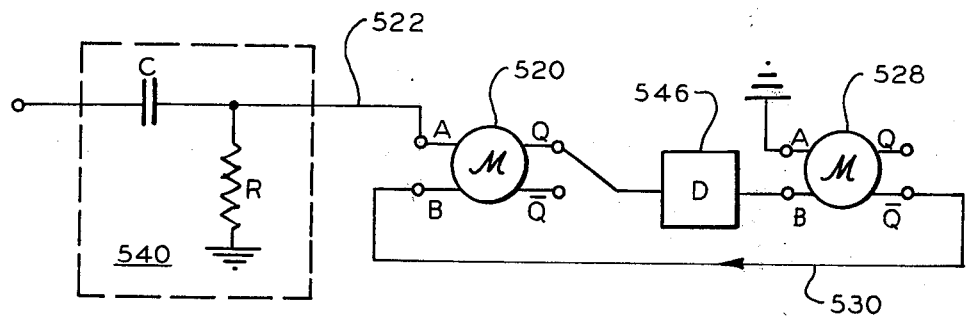
Figure 27B:
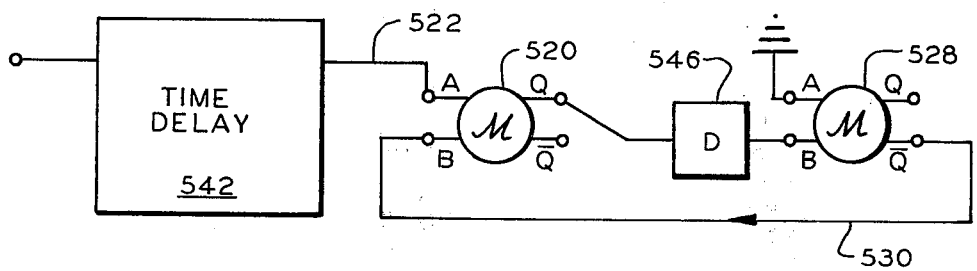
Figure 27C:
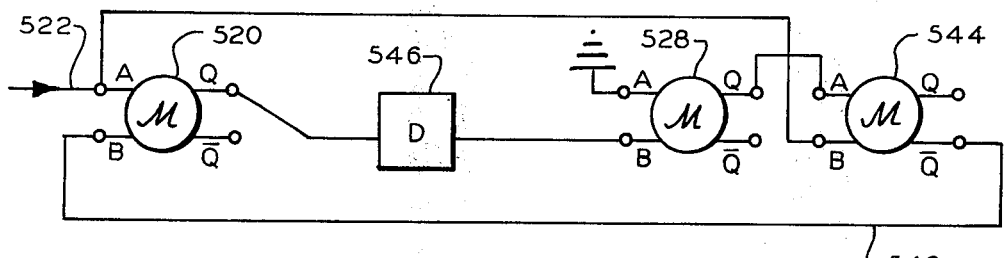
Figure 27D:
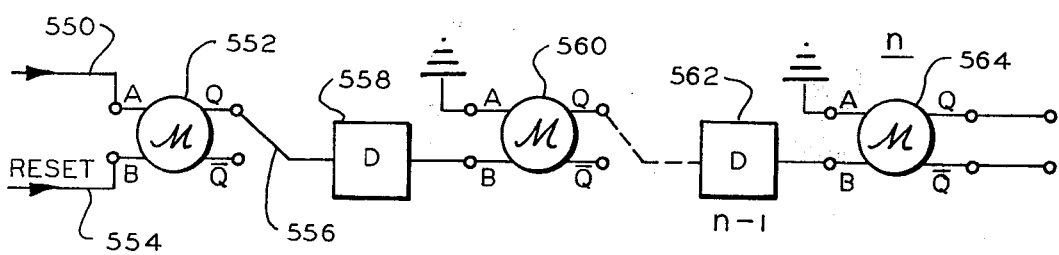
Figure 28:
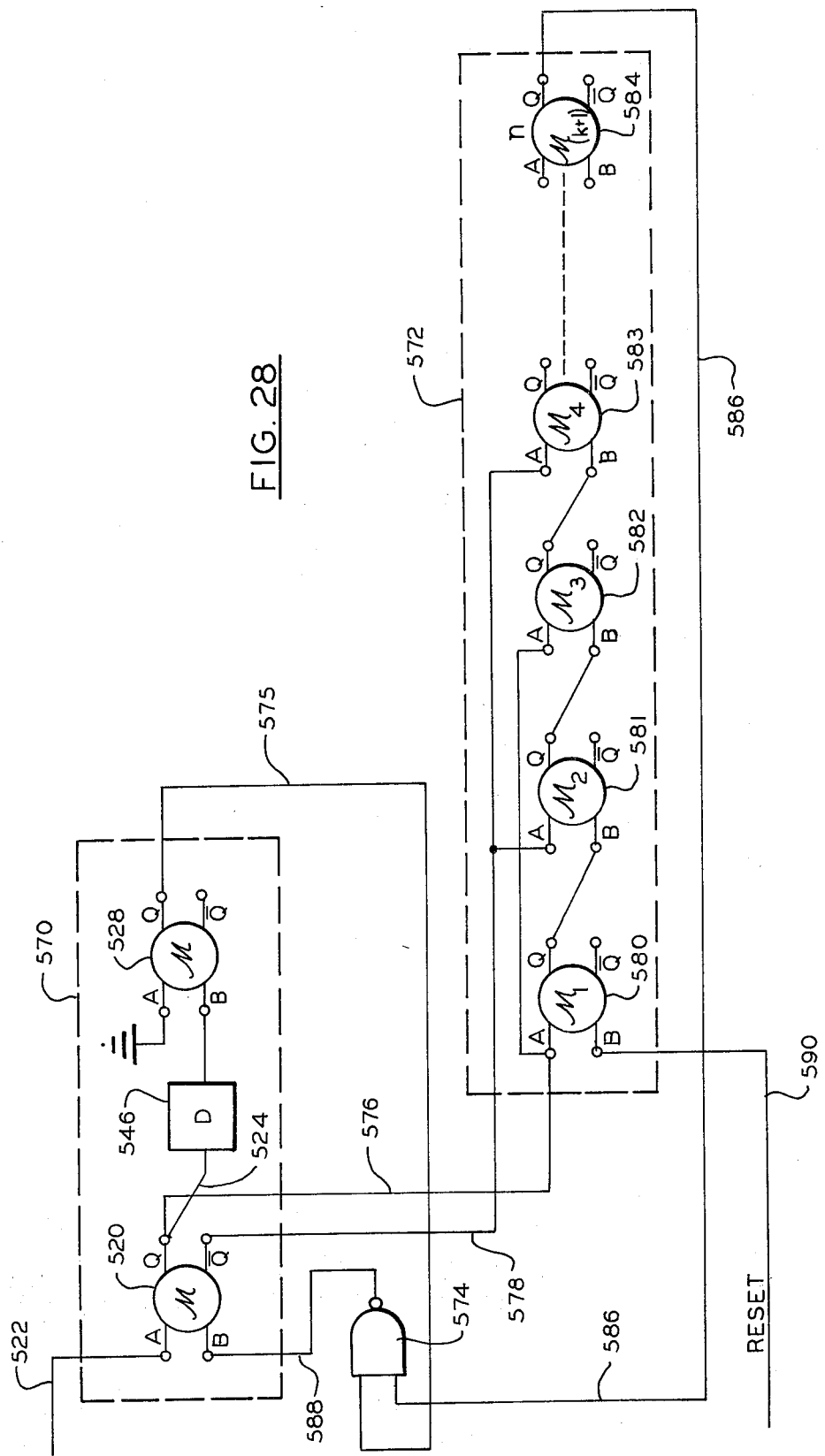
Figure 29:
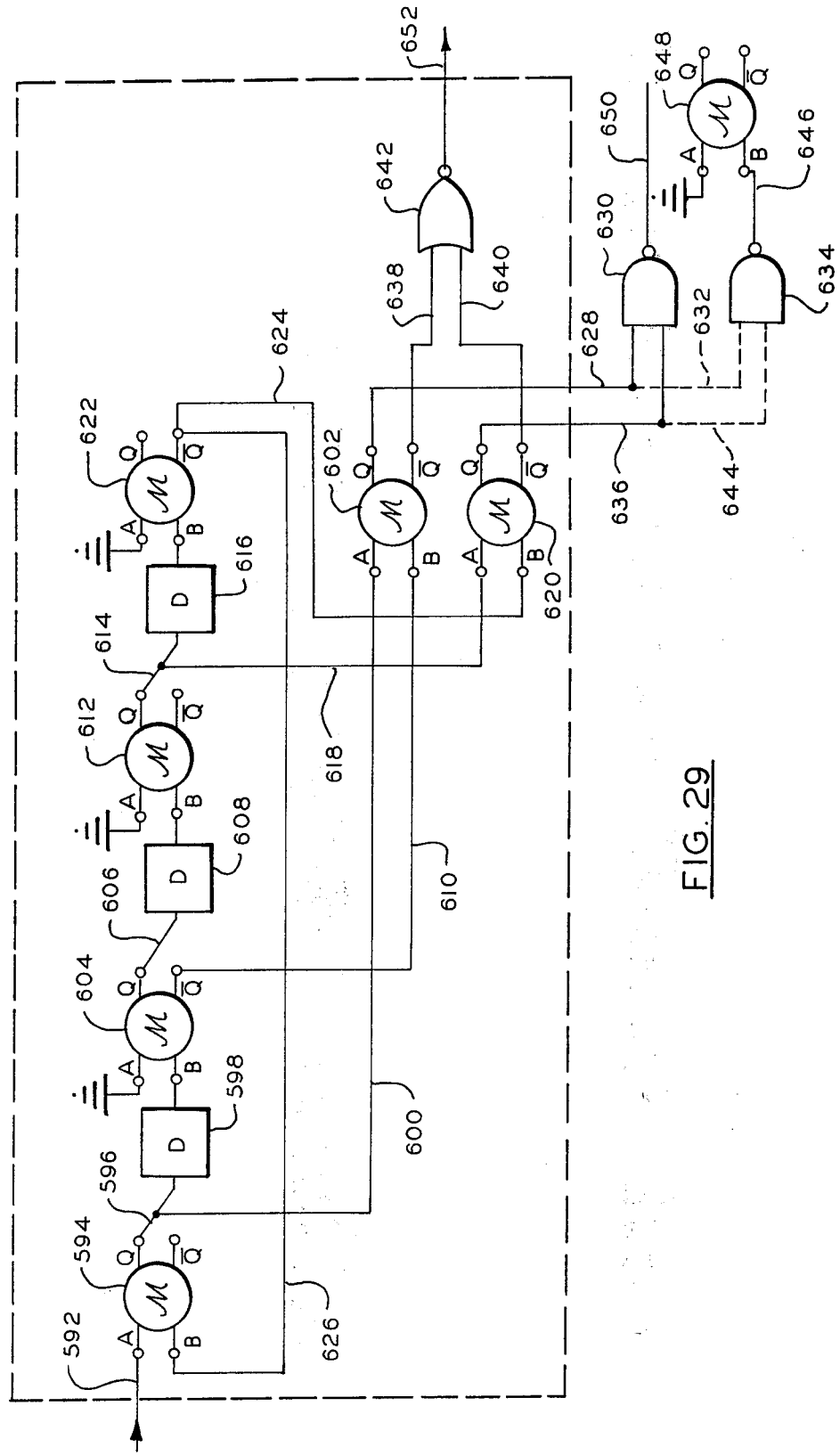
Figure 30:
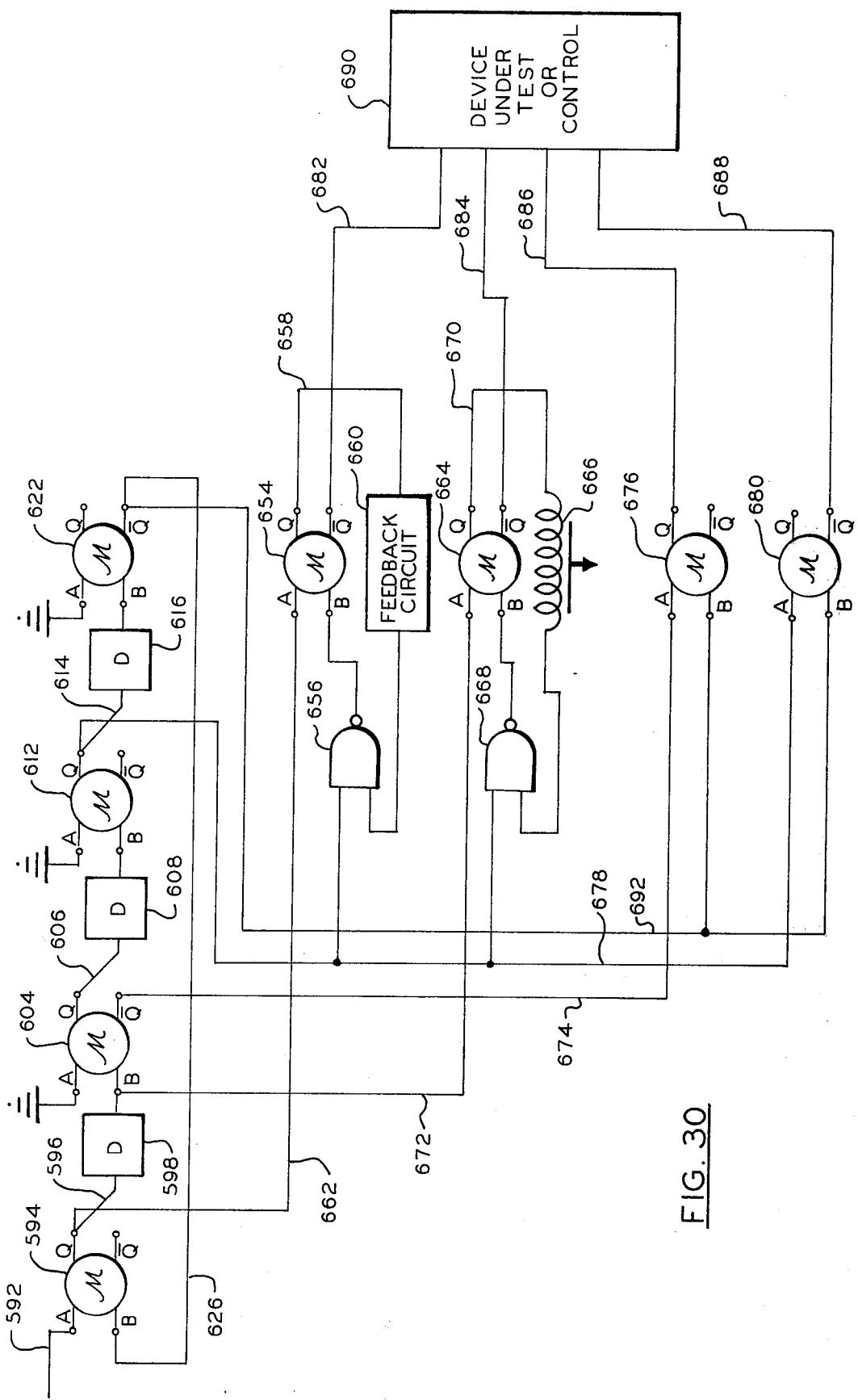
Figure 31:
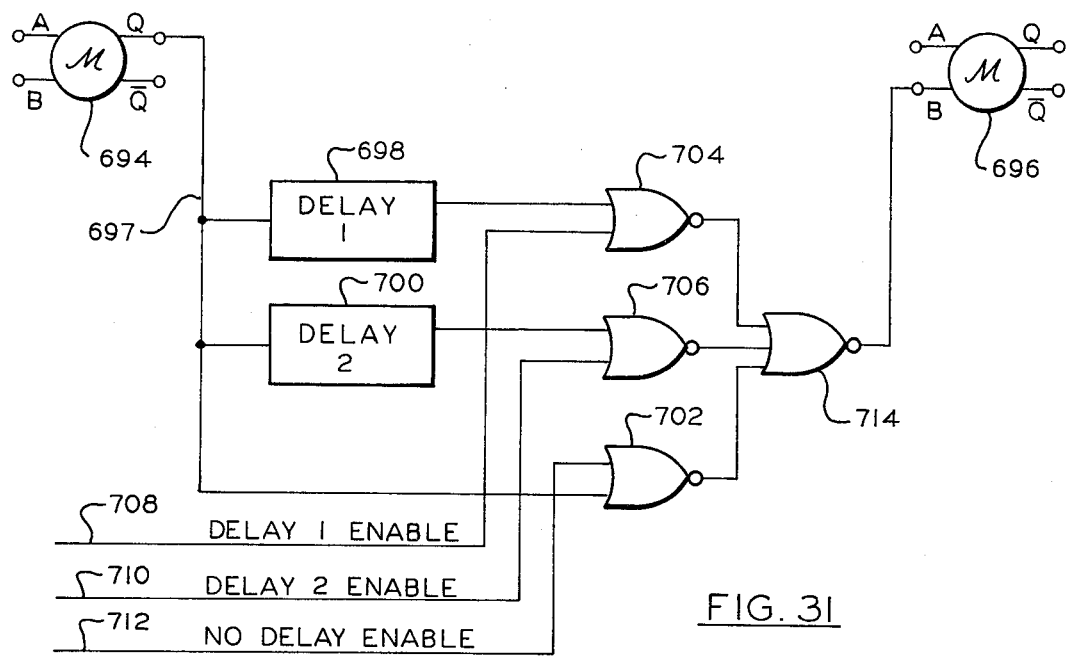
Figure 32:
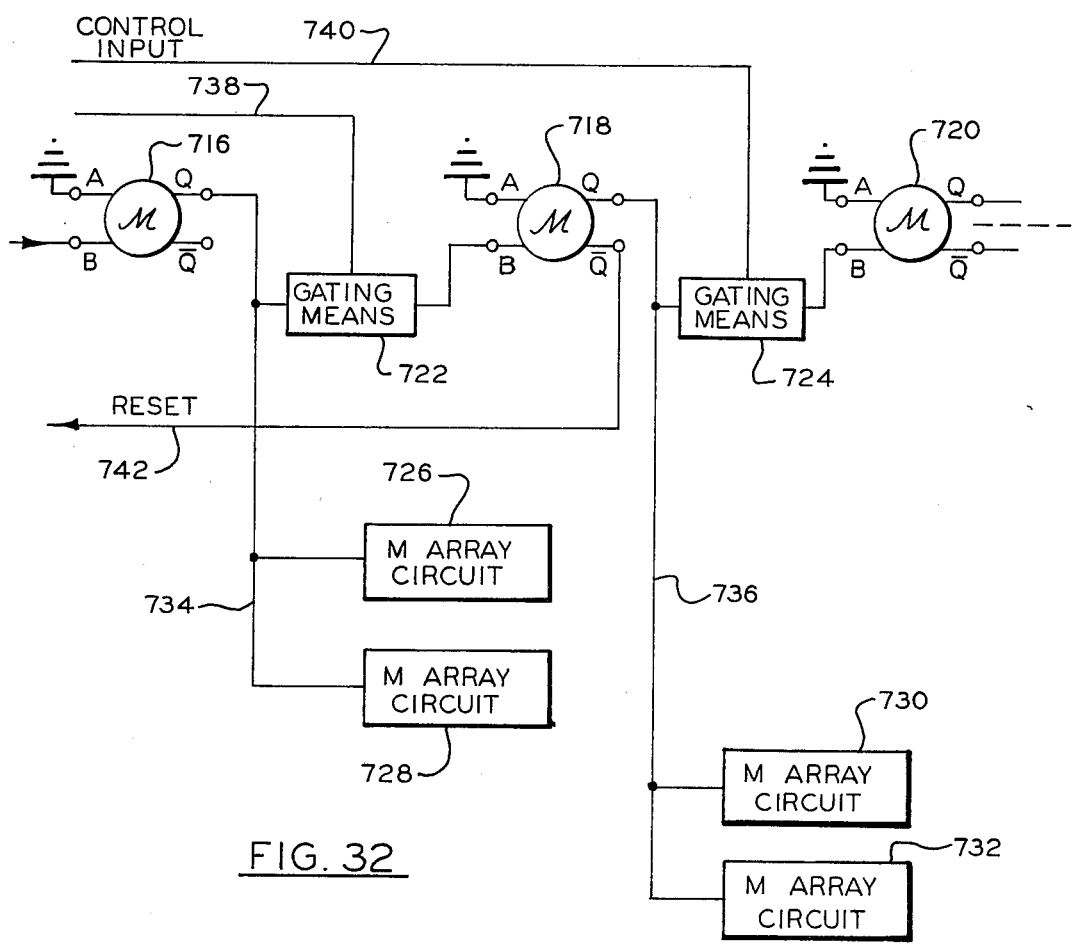
Figure 33:
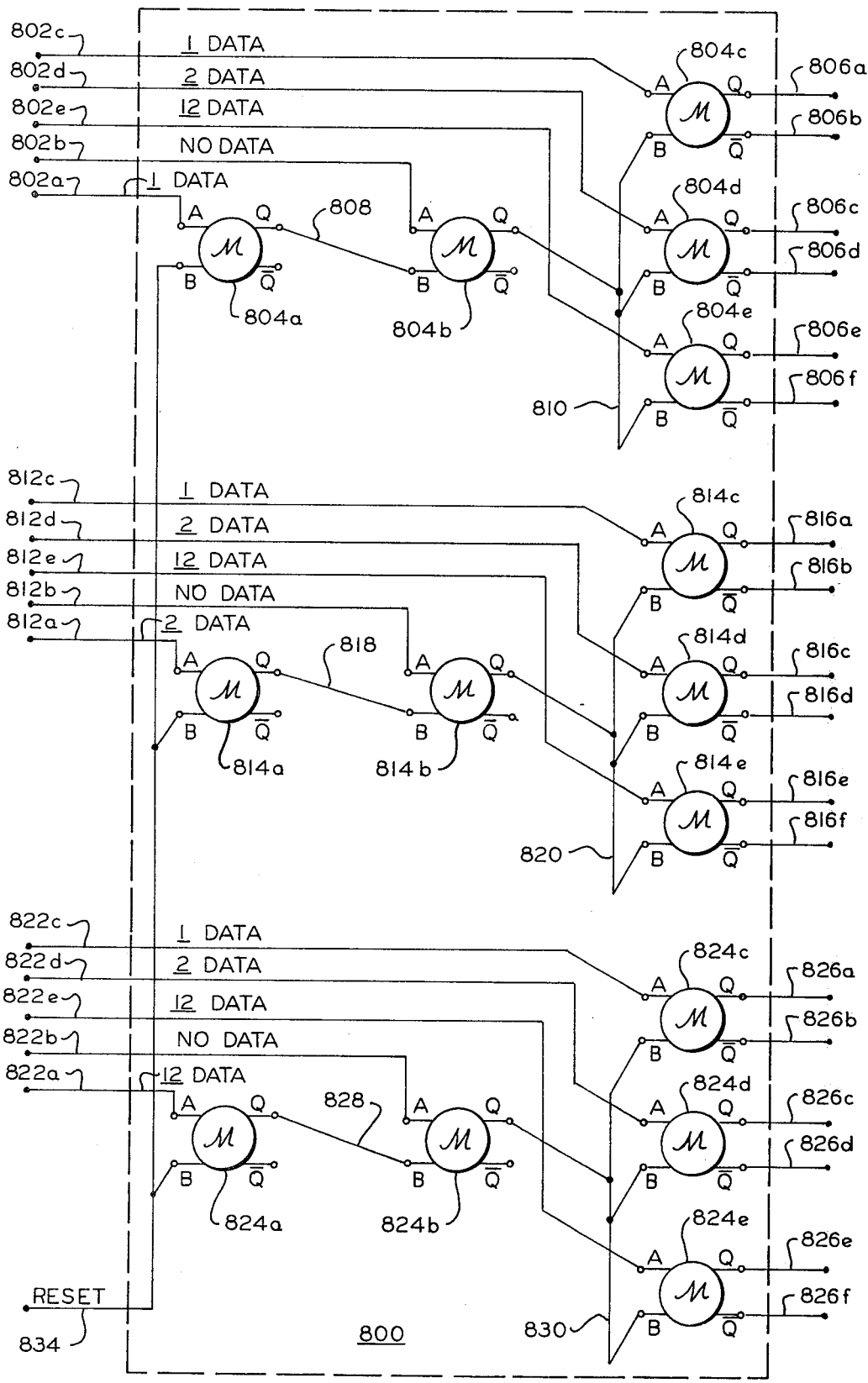
Figure 34:
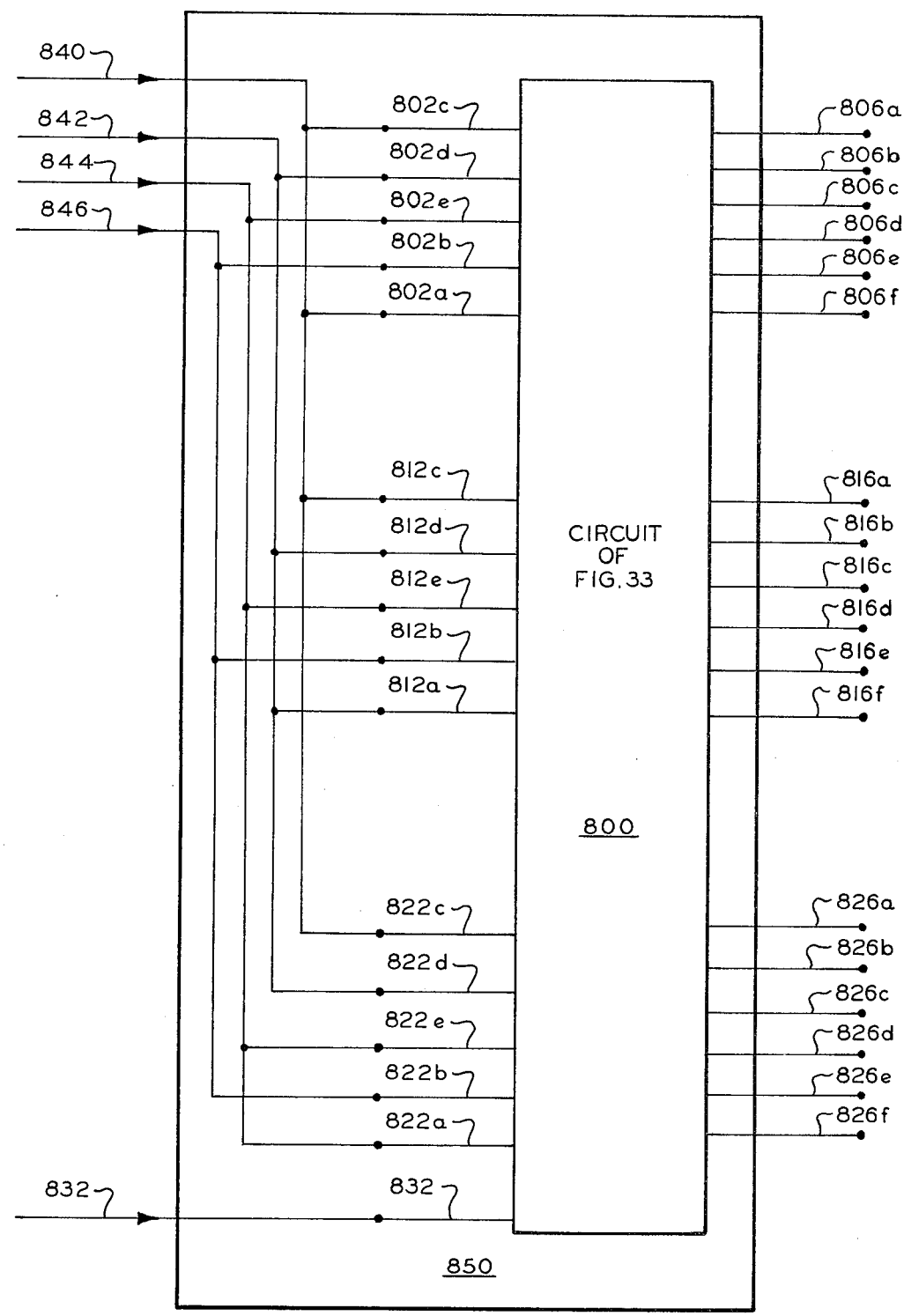
Figure 35:
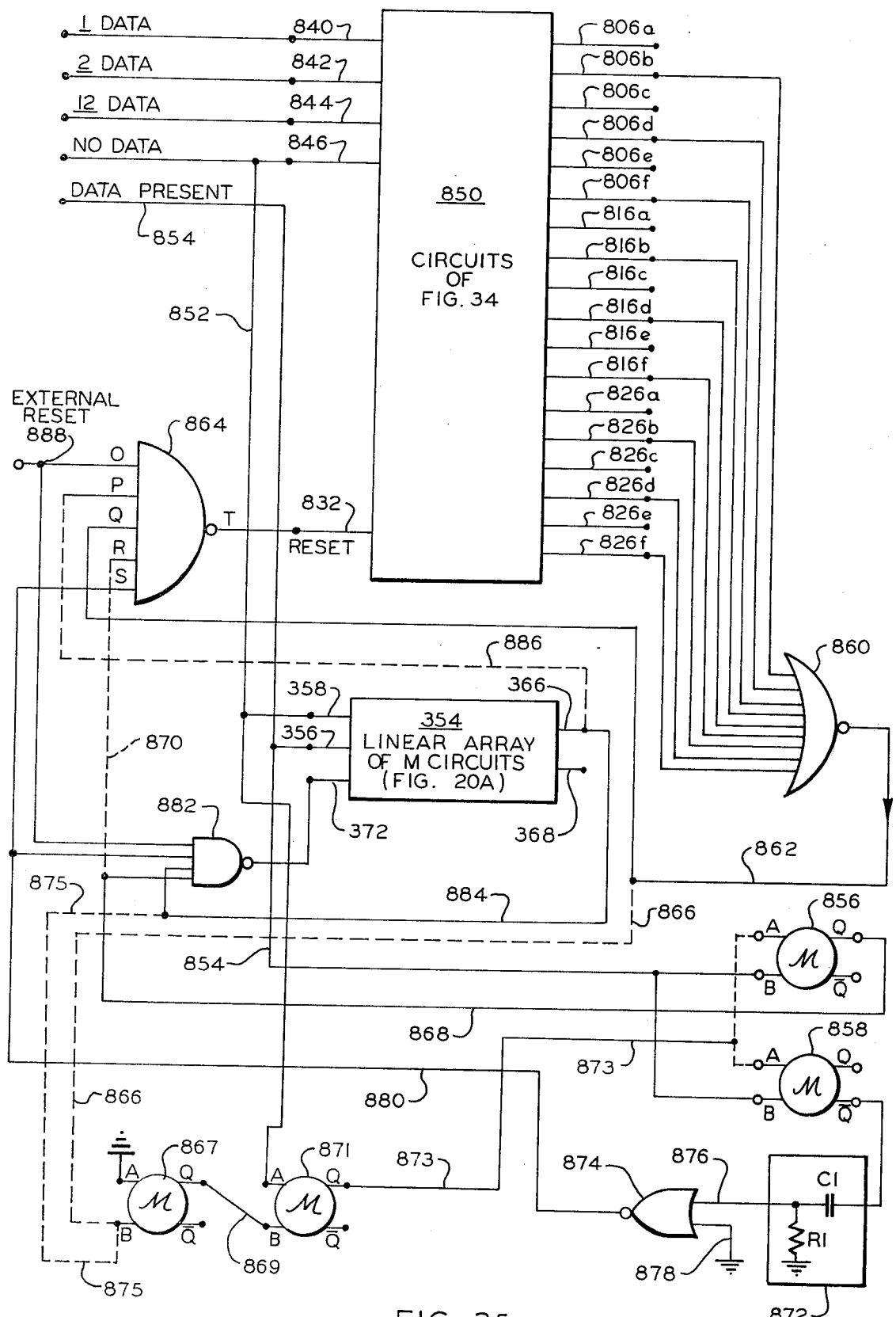
Figure 37:
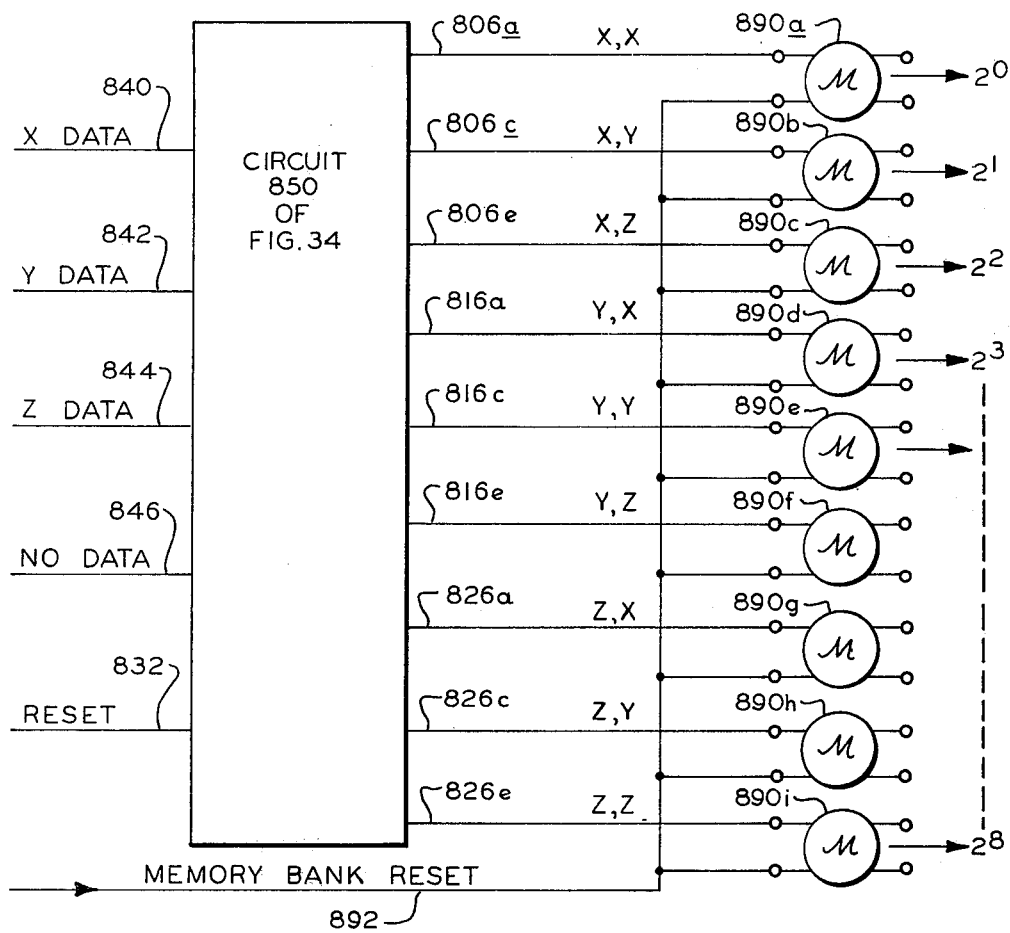
Figure 38:
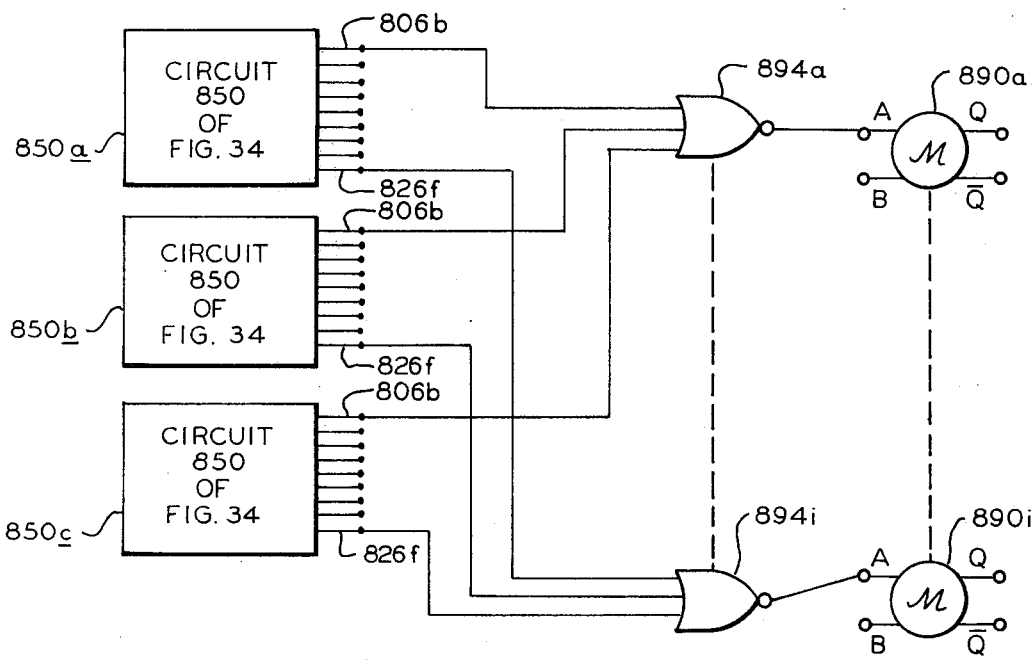
Figure 39B:
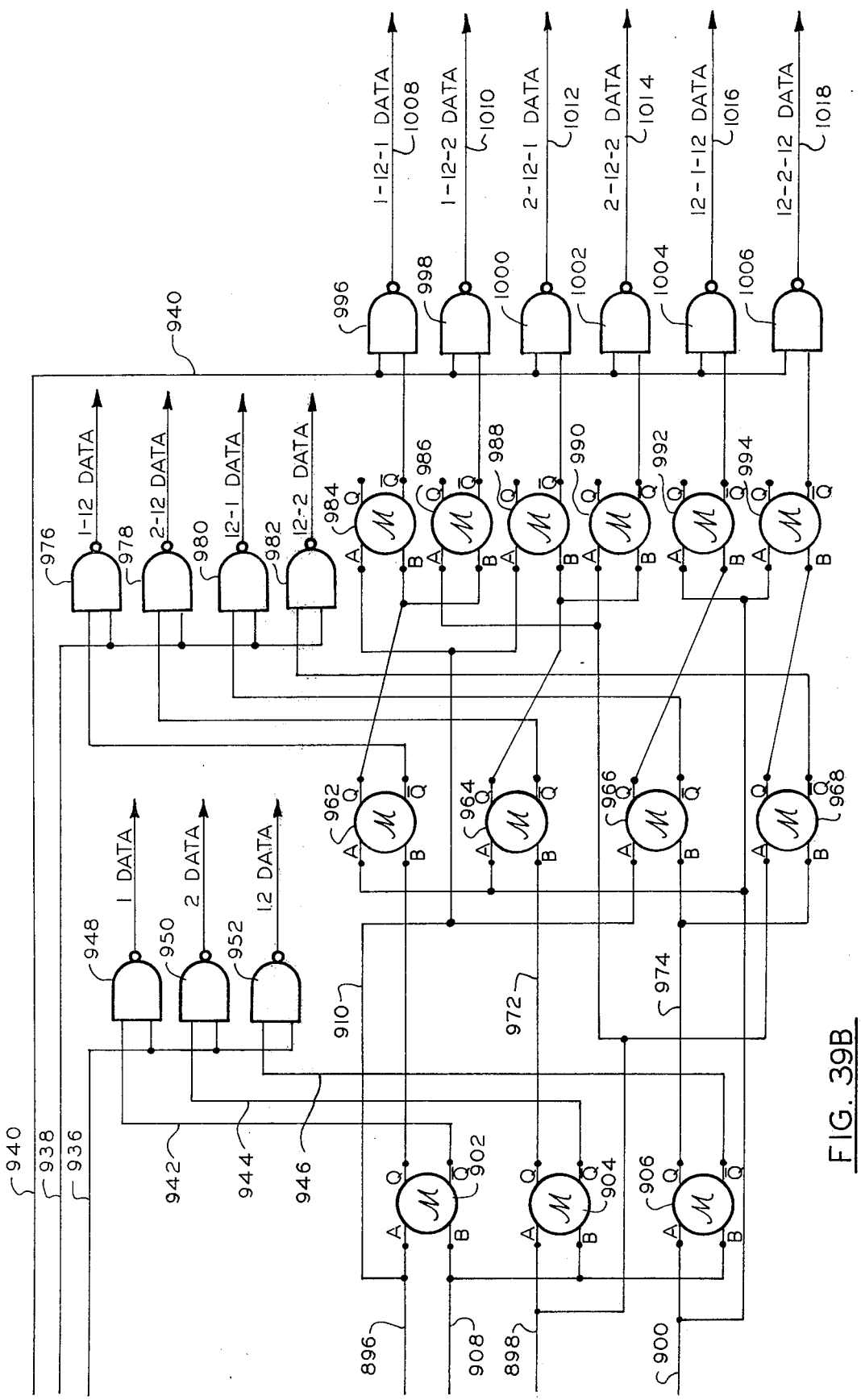
Figure 40:
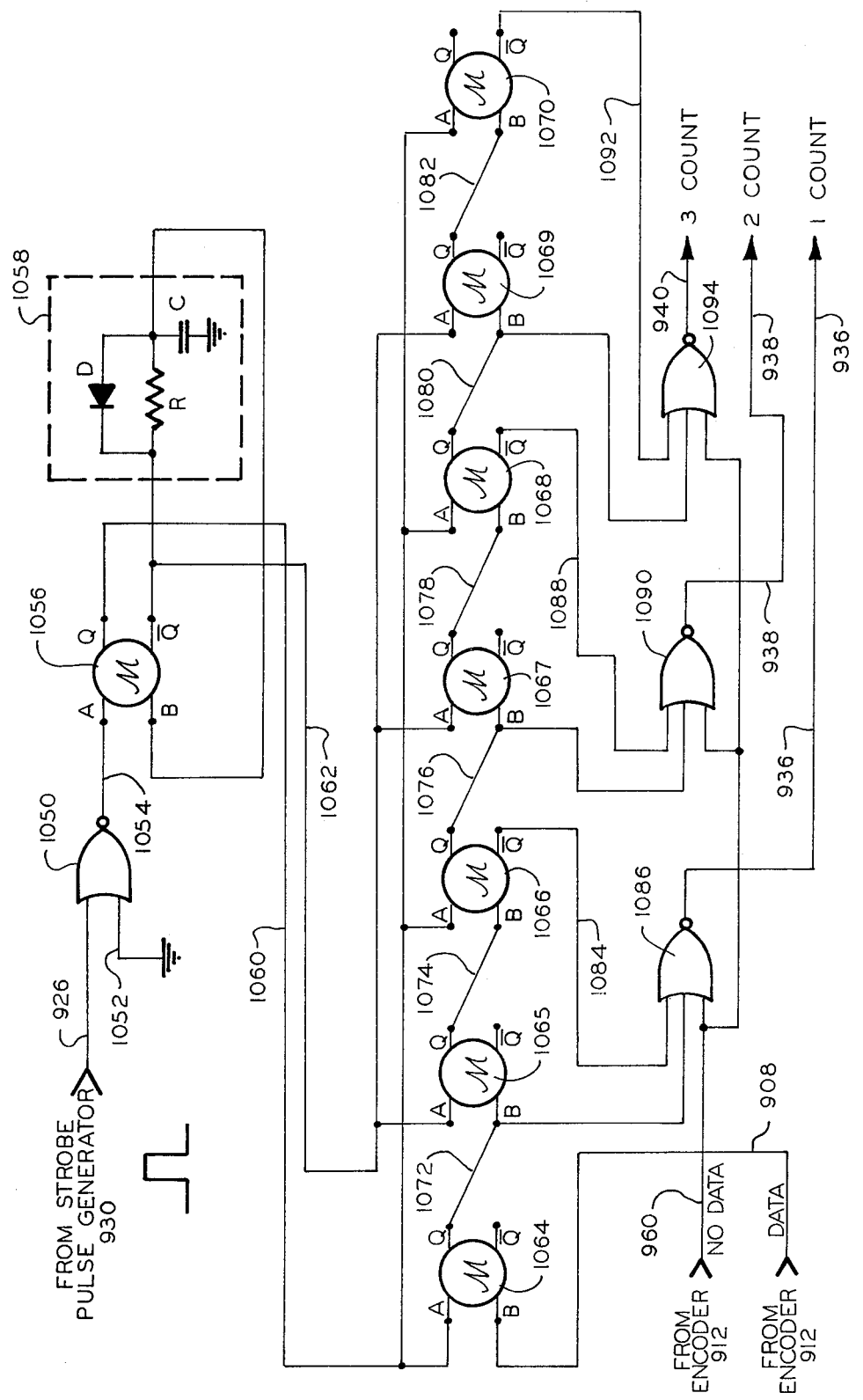
Figure 41:
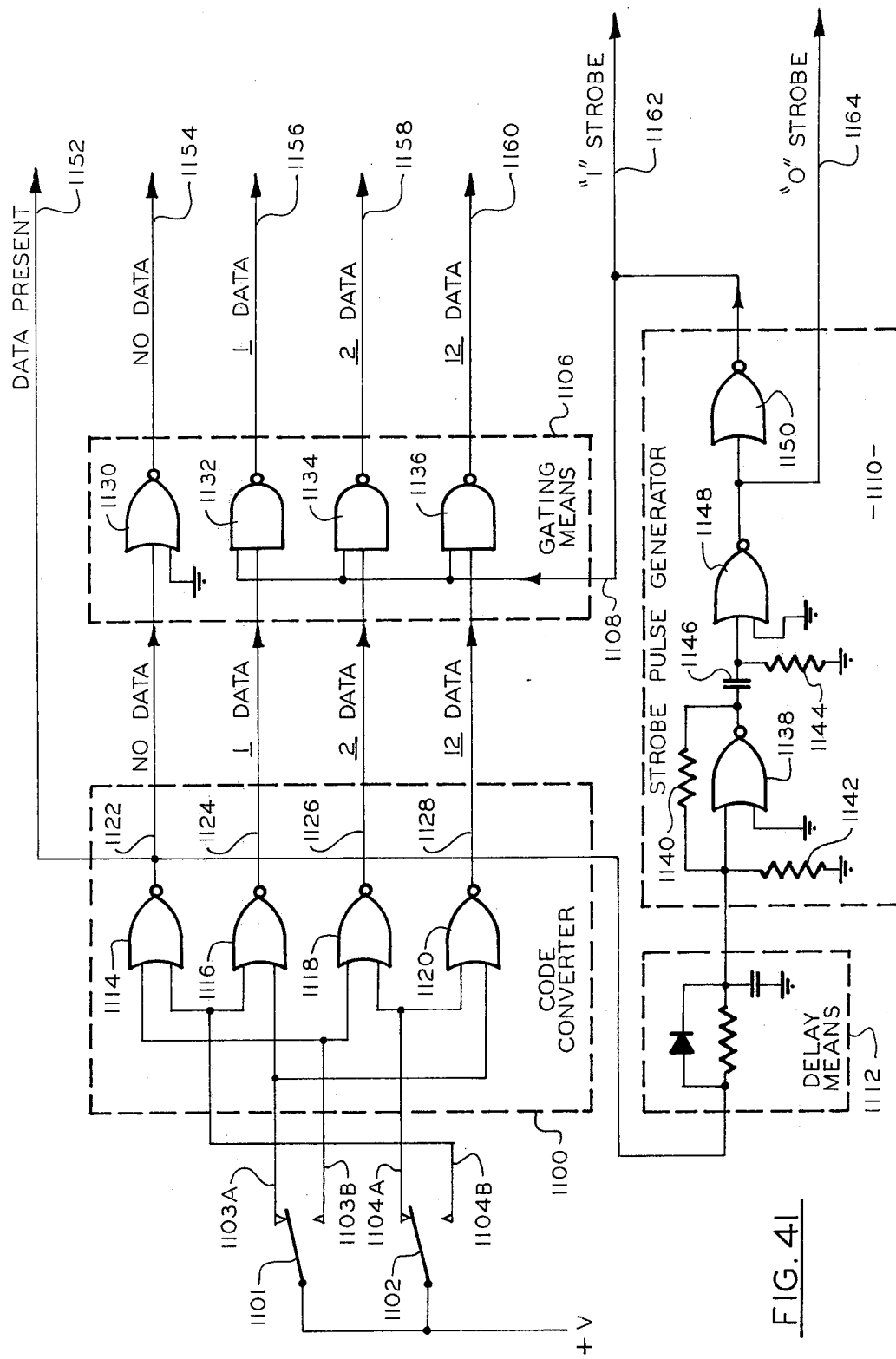
Figure 42:
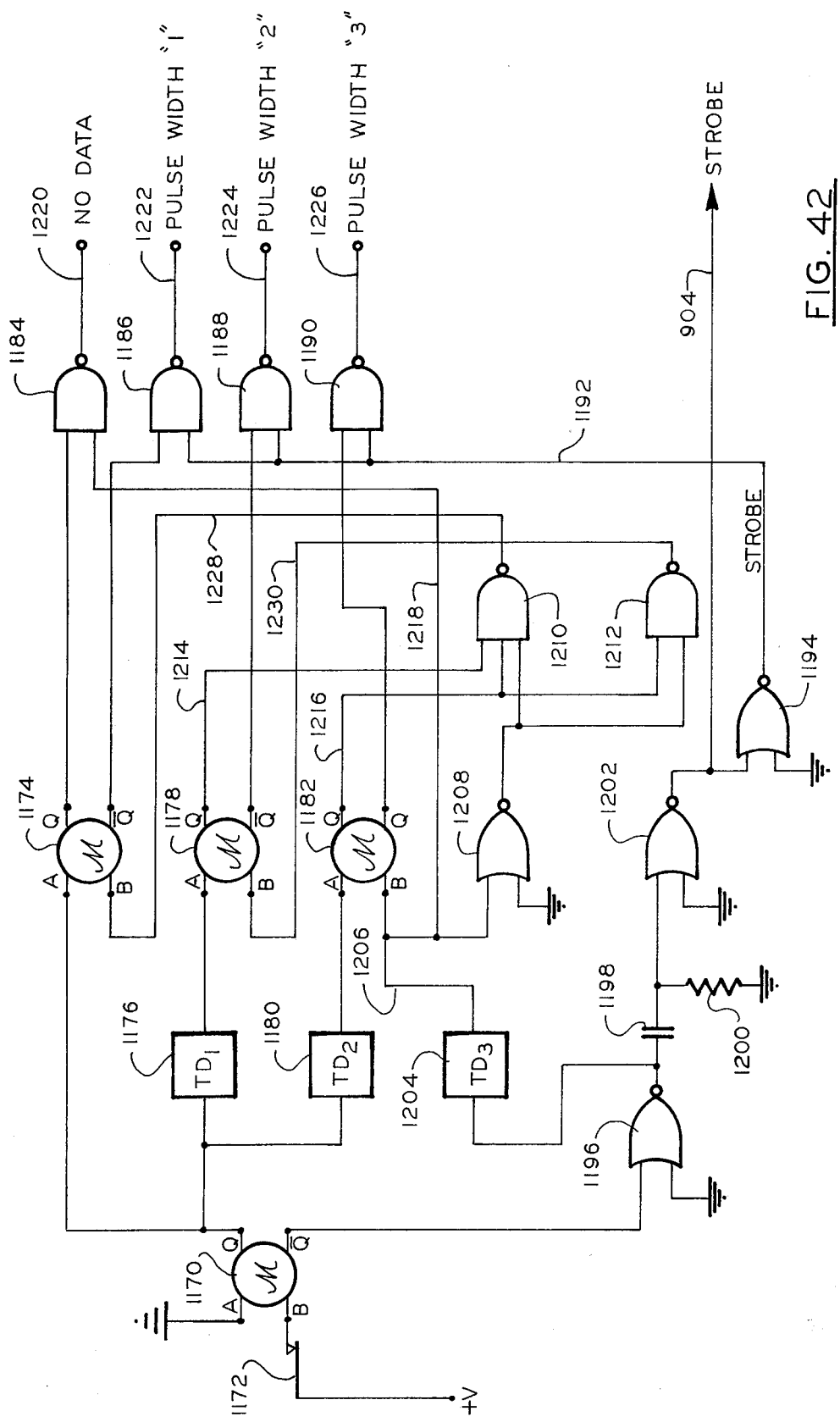
Figure 43:
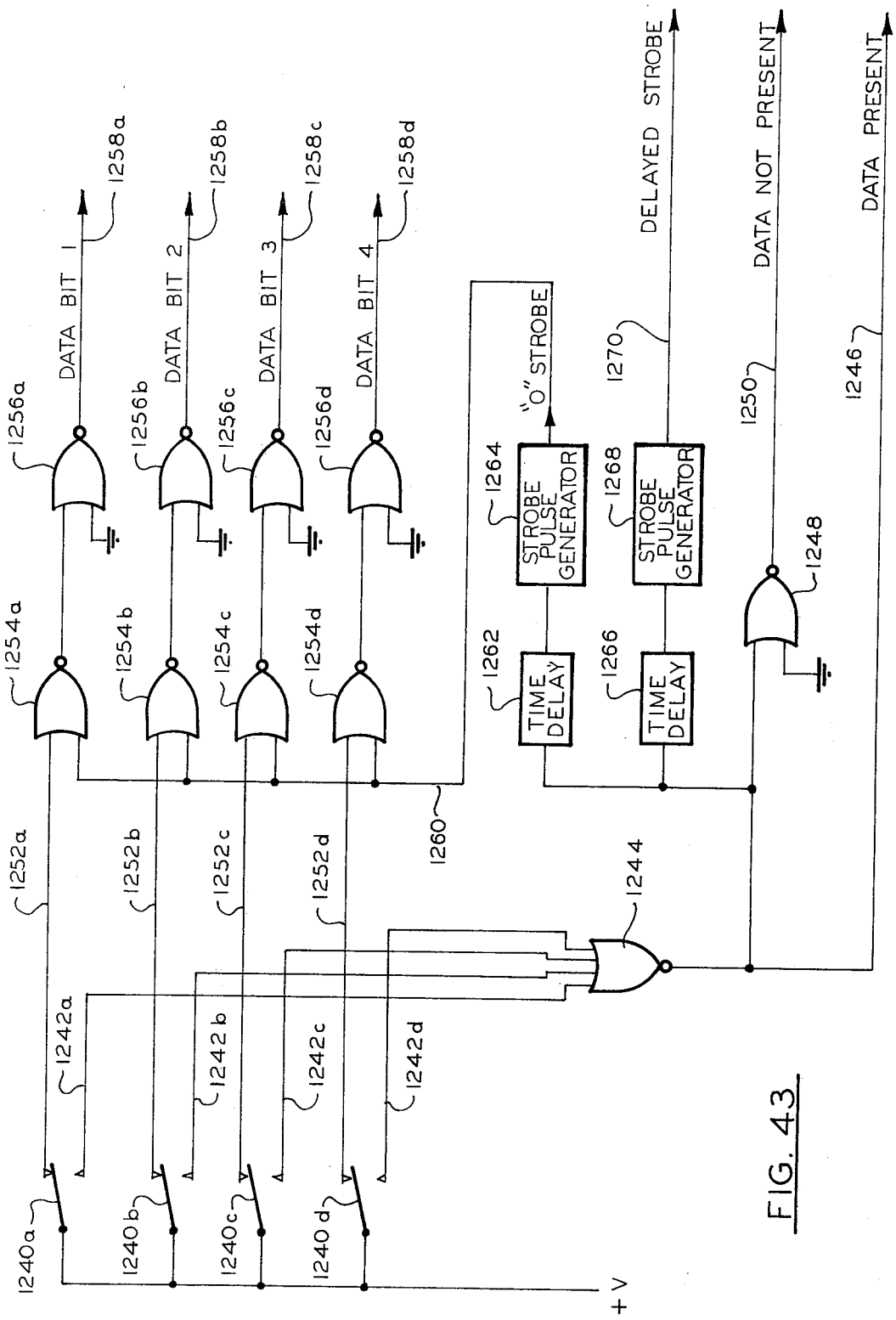
Figure 44:
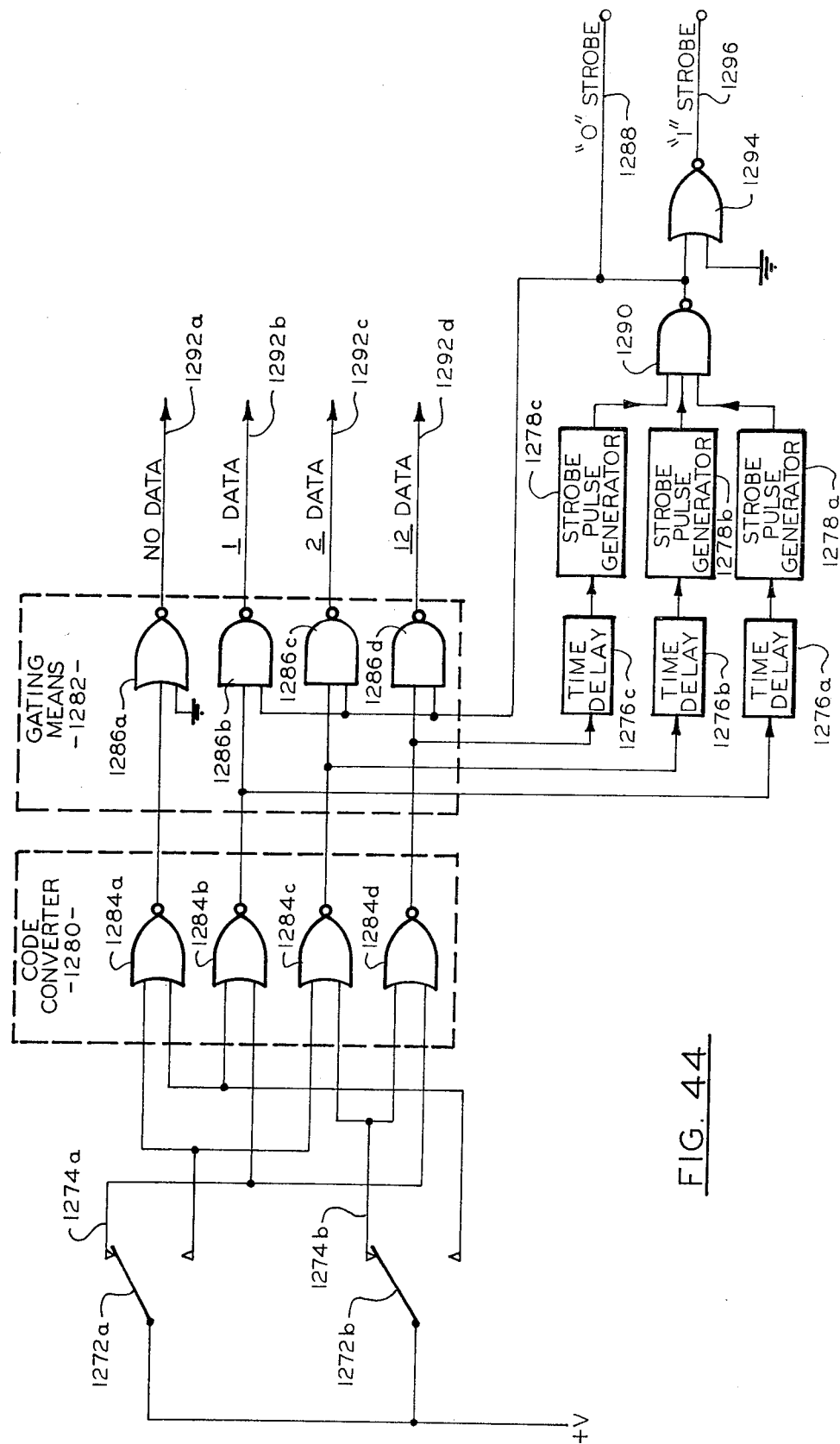
Figure 45A:
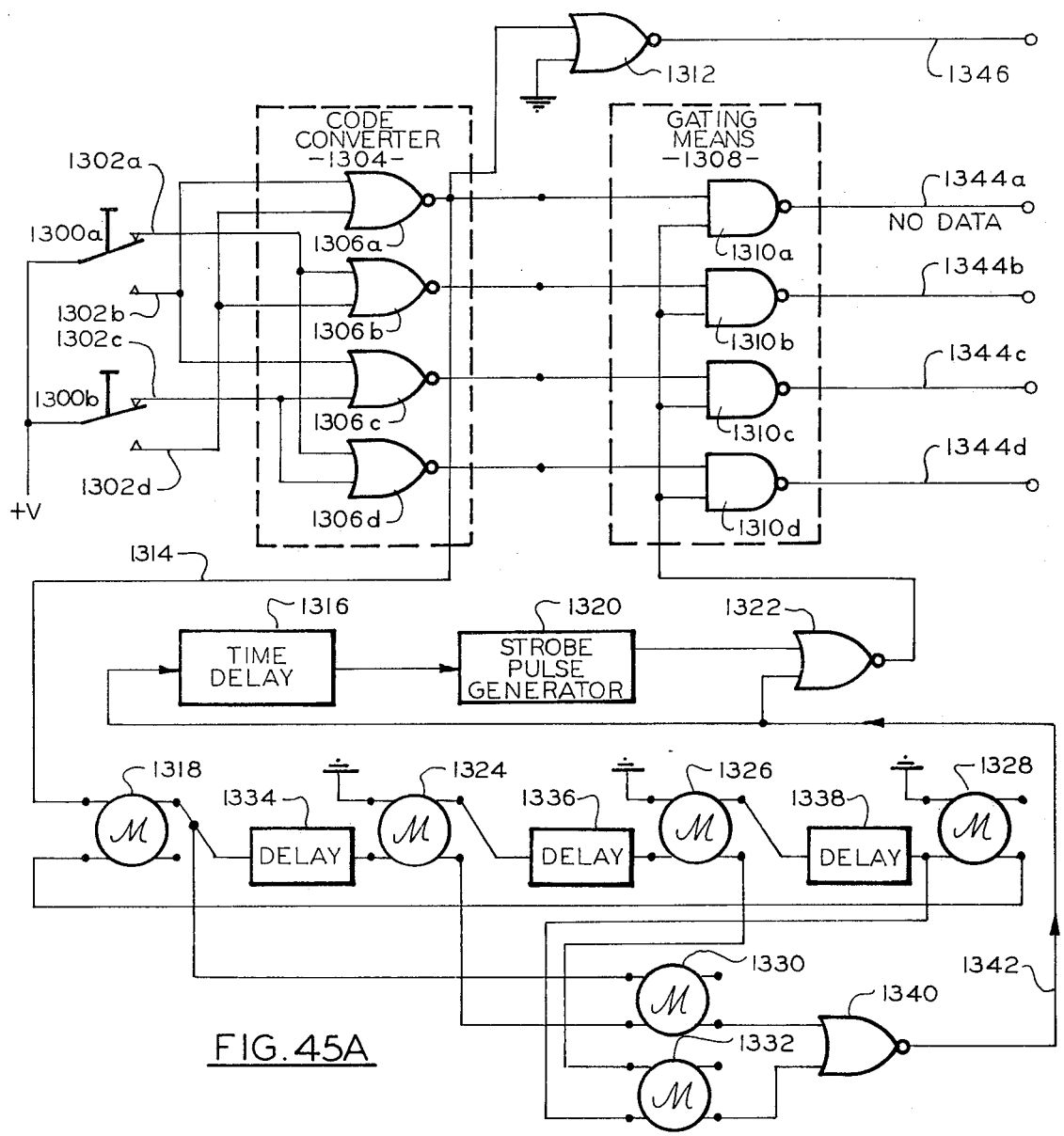
Figure 45B:
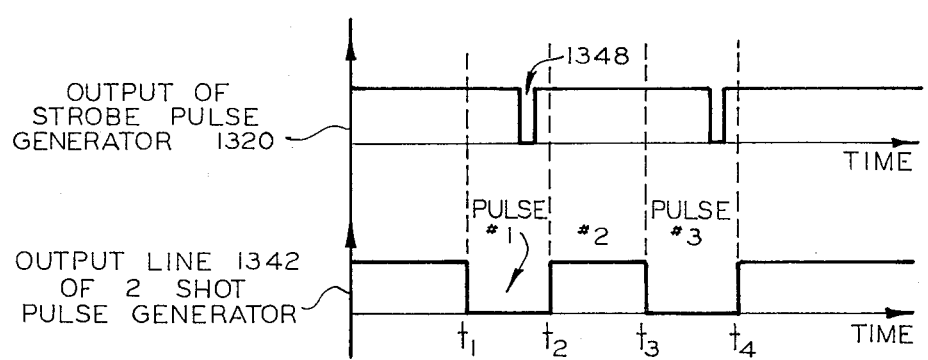
Figure 46A:
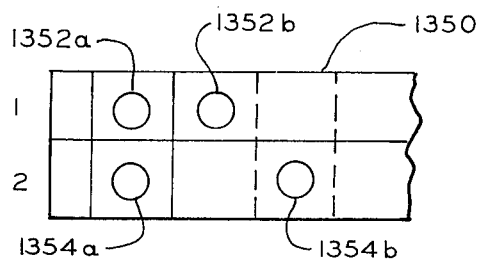
Figure 46B:
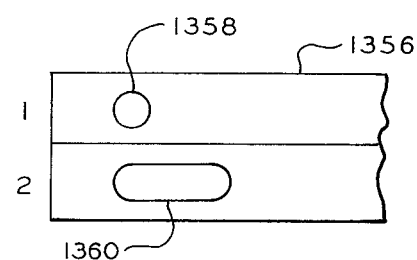
Figure 46C:
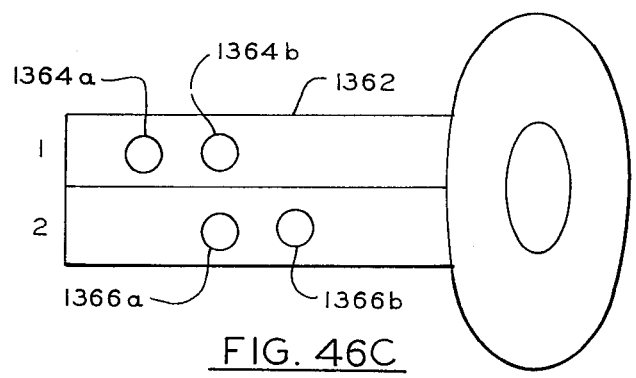
Figure 46D:
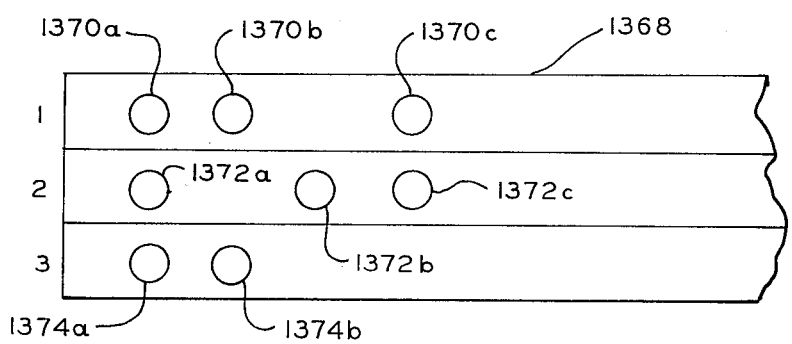
Figure 46E:
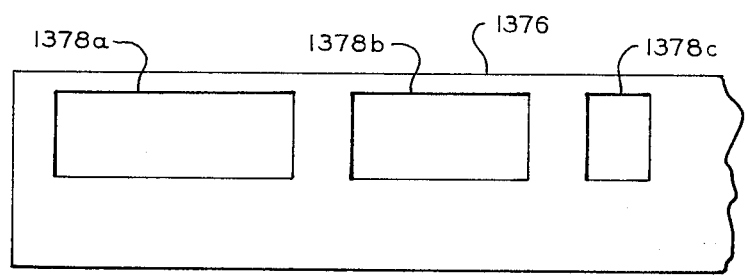
Figure 47:
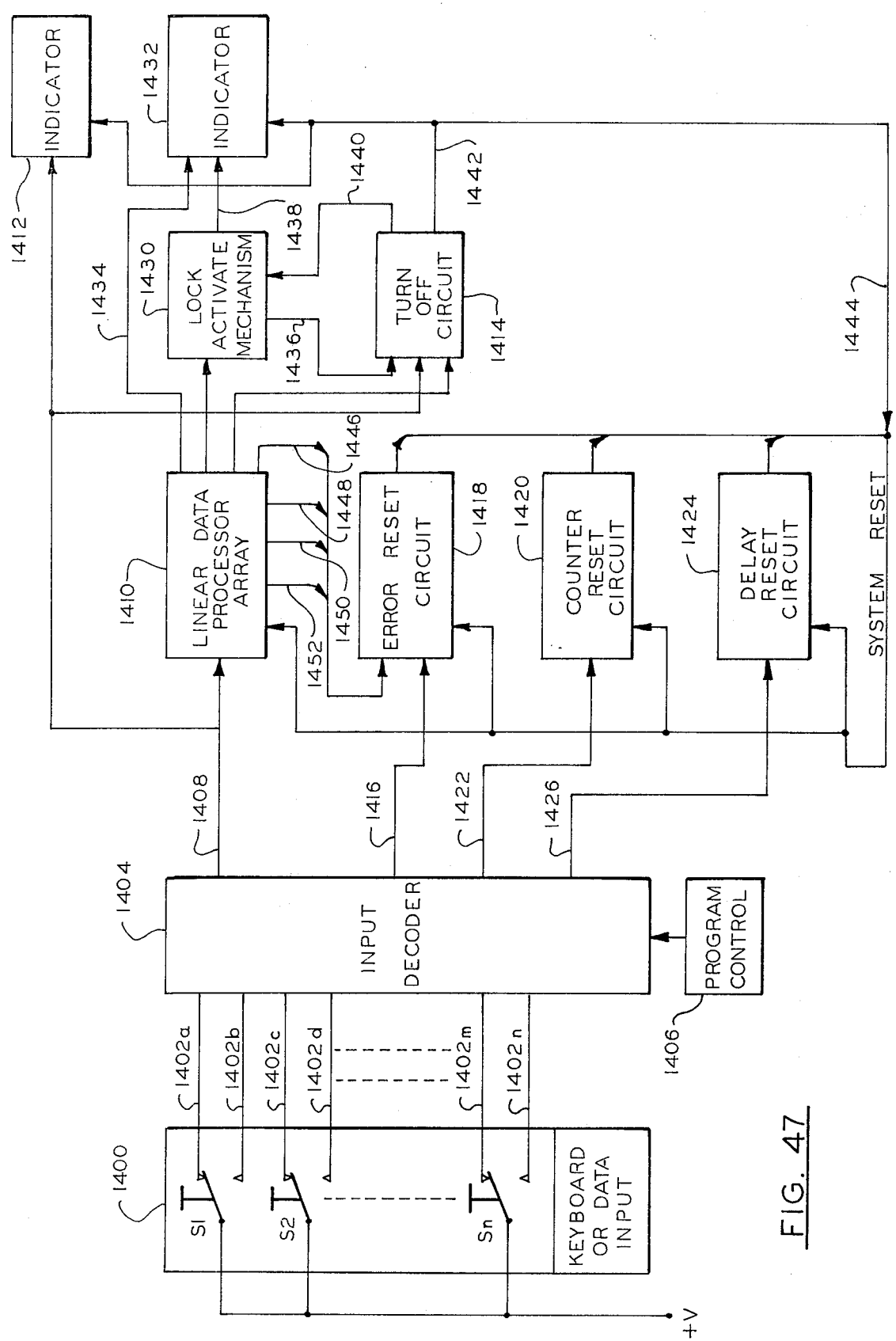
Figure 48:
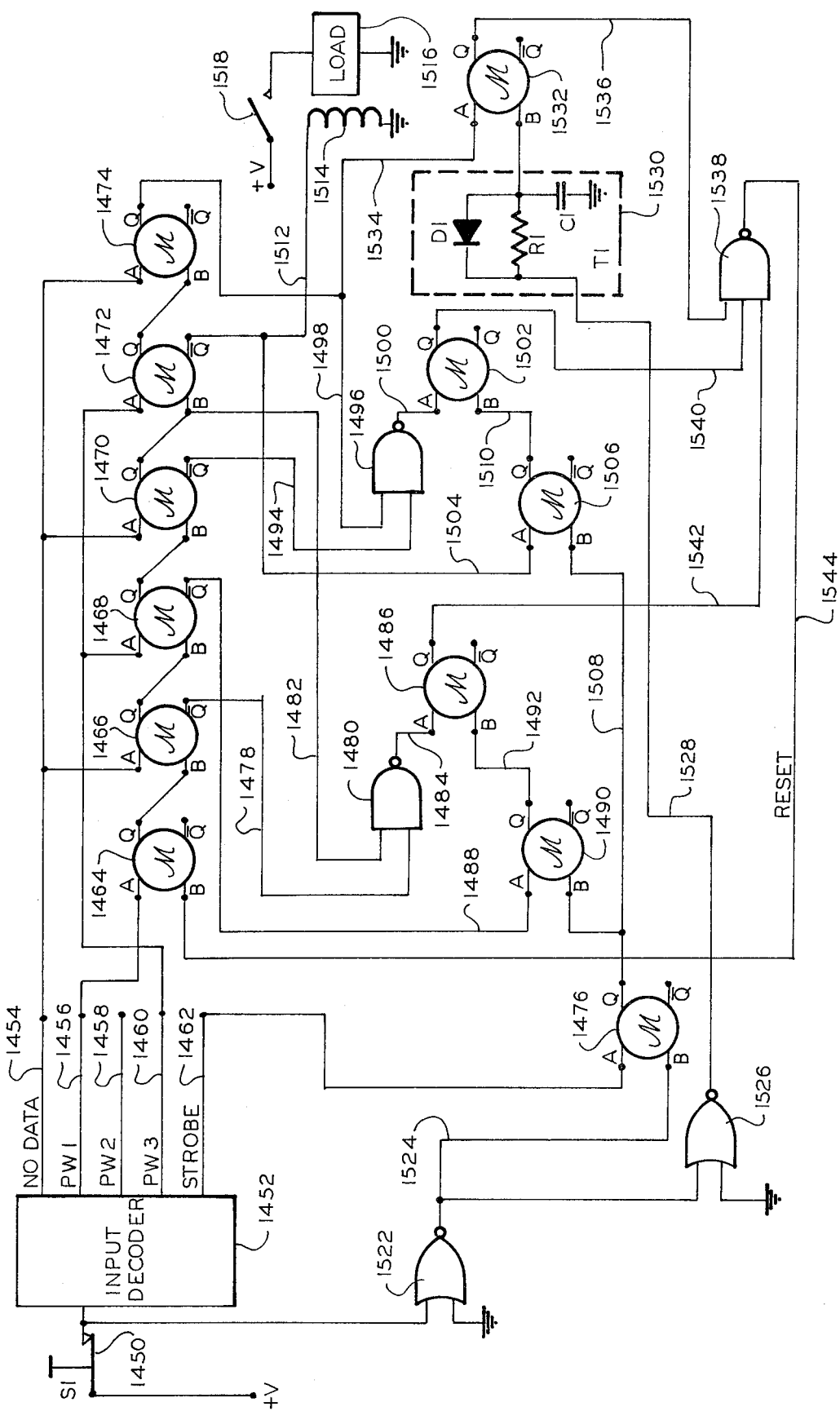
Figure 49:
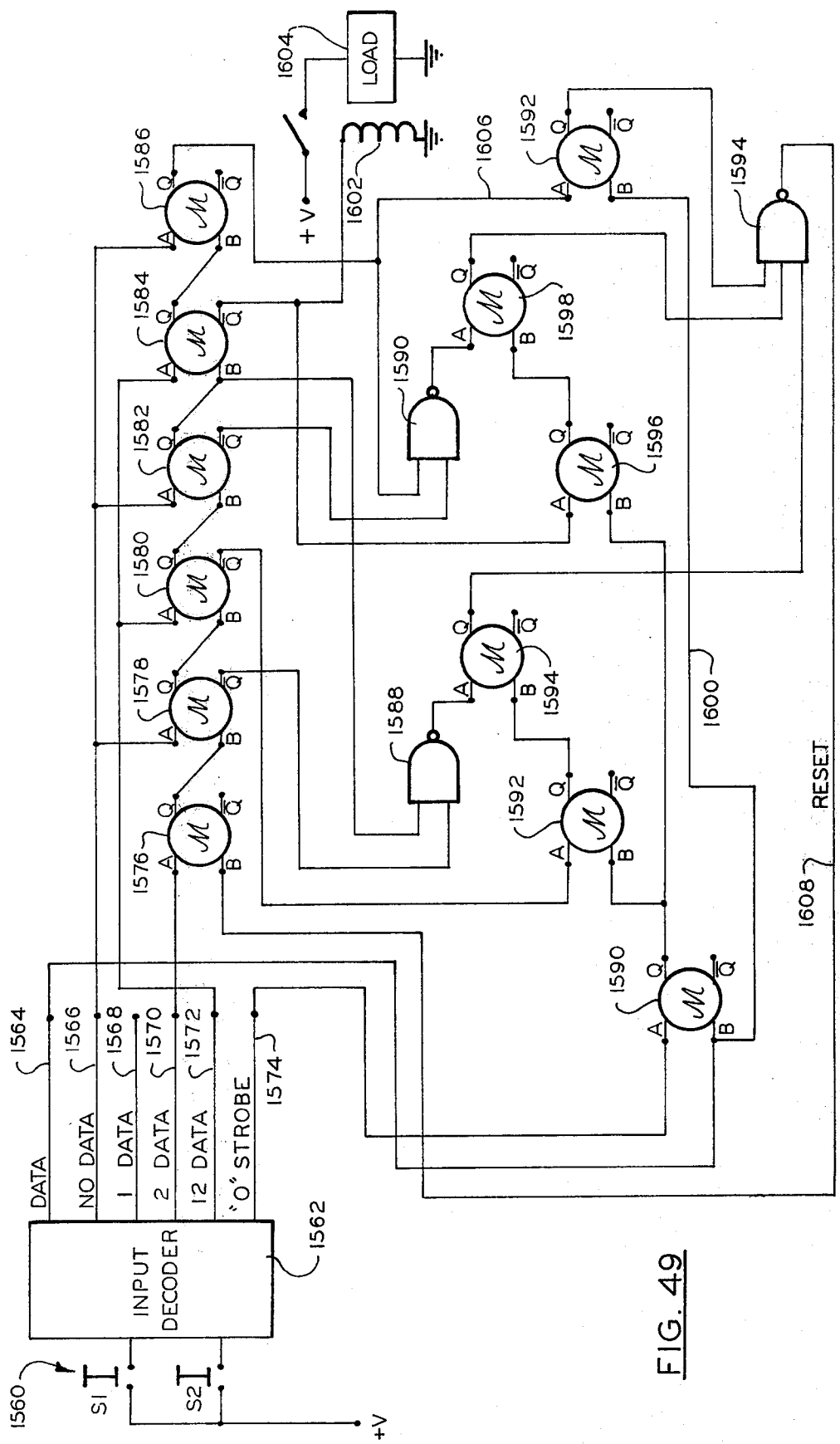
Figure 50:
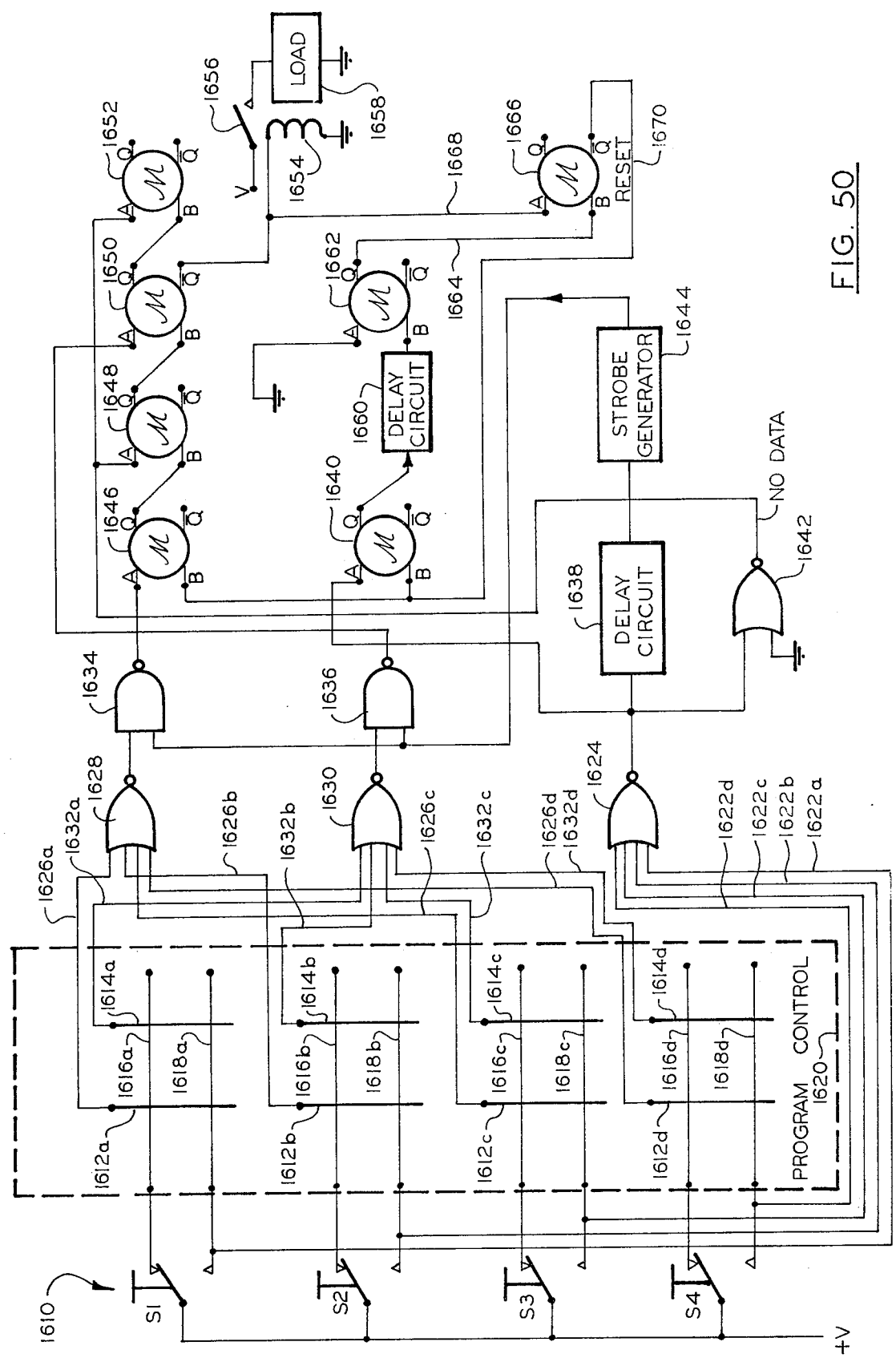
Figures 51, 52:
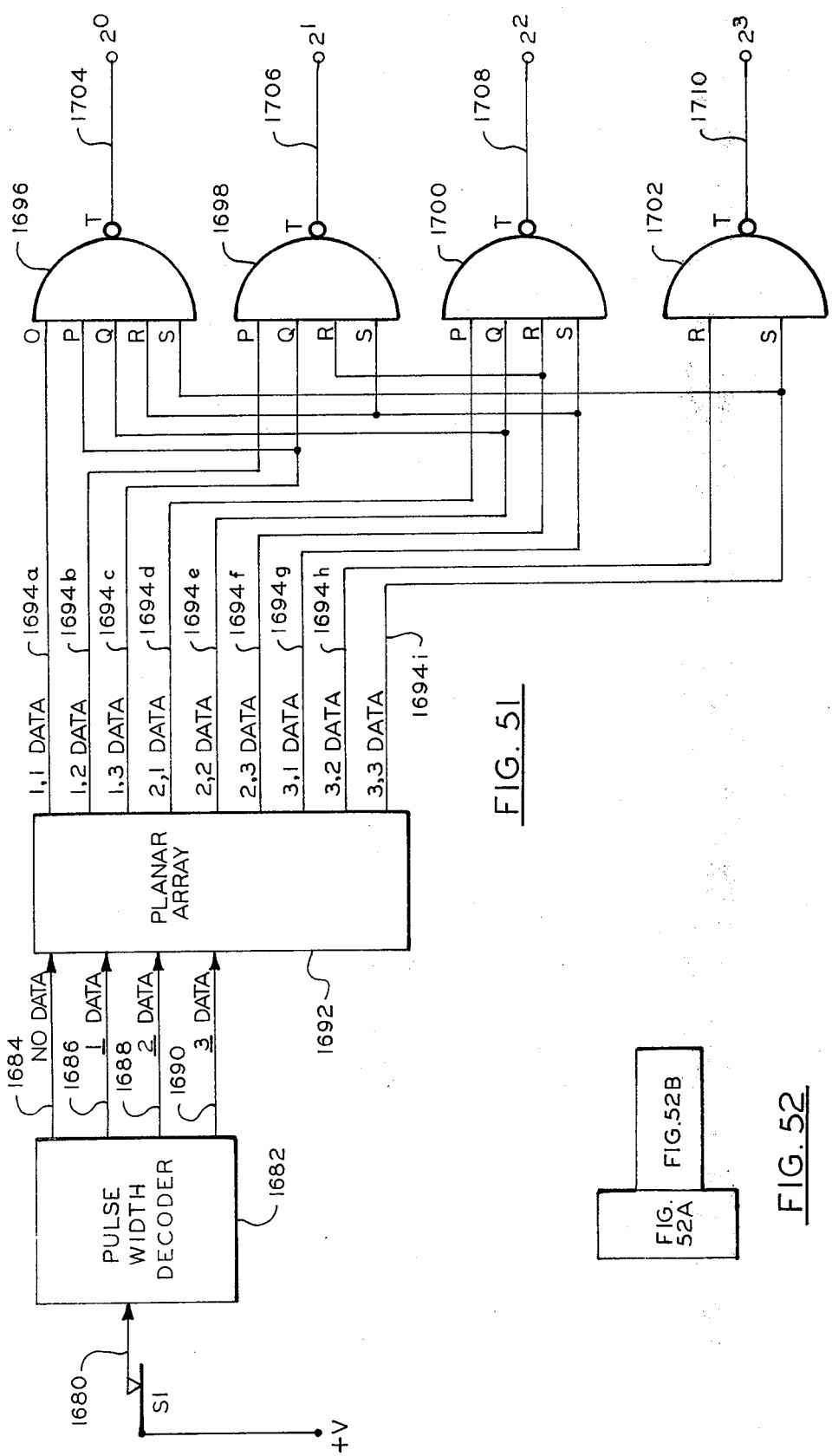
Figure 52A:
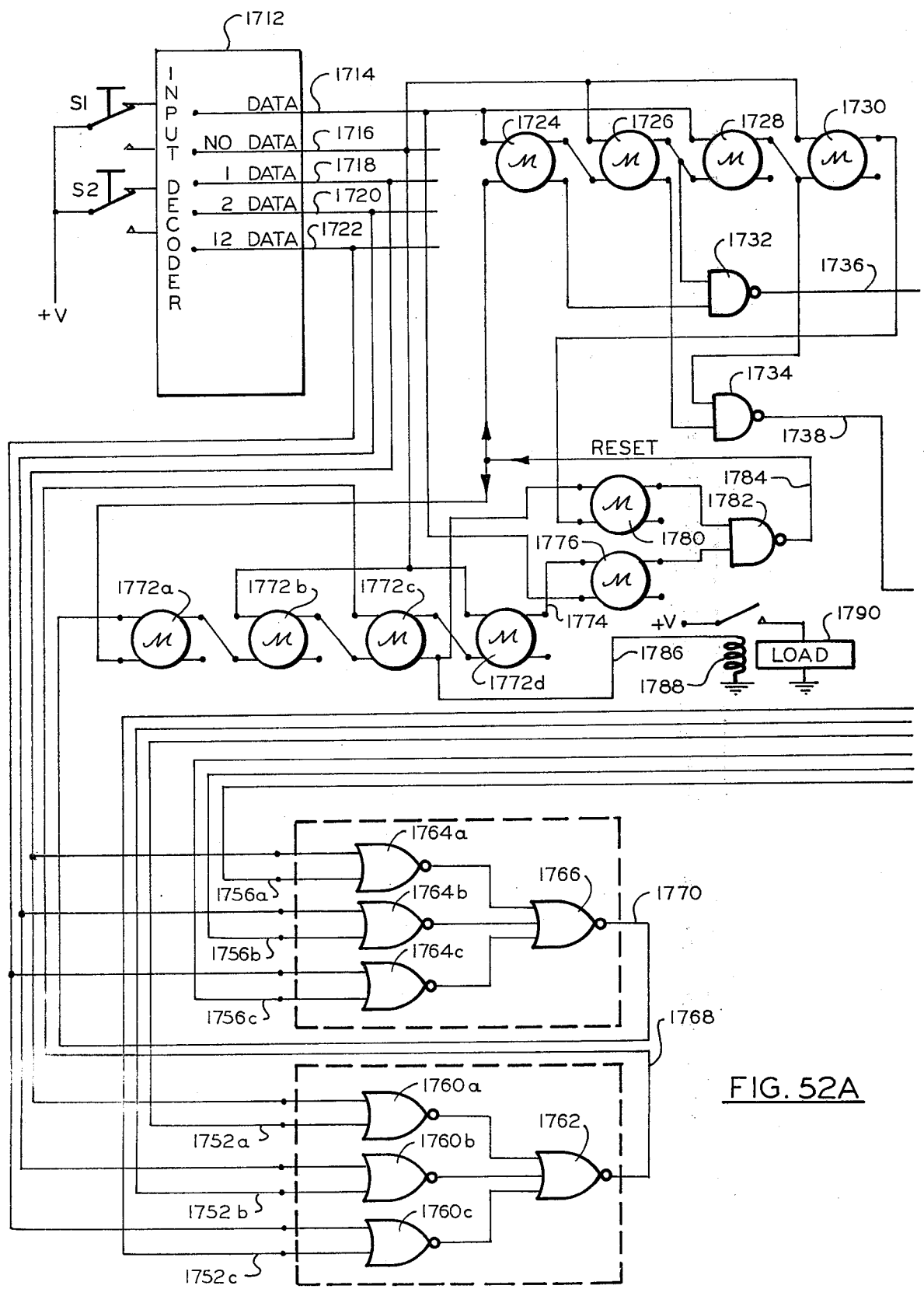
Figure 52B:
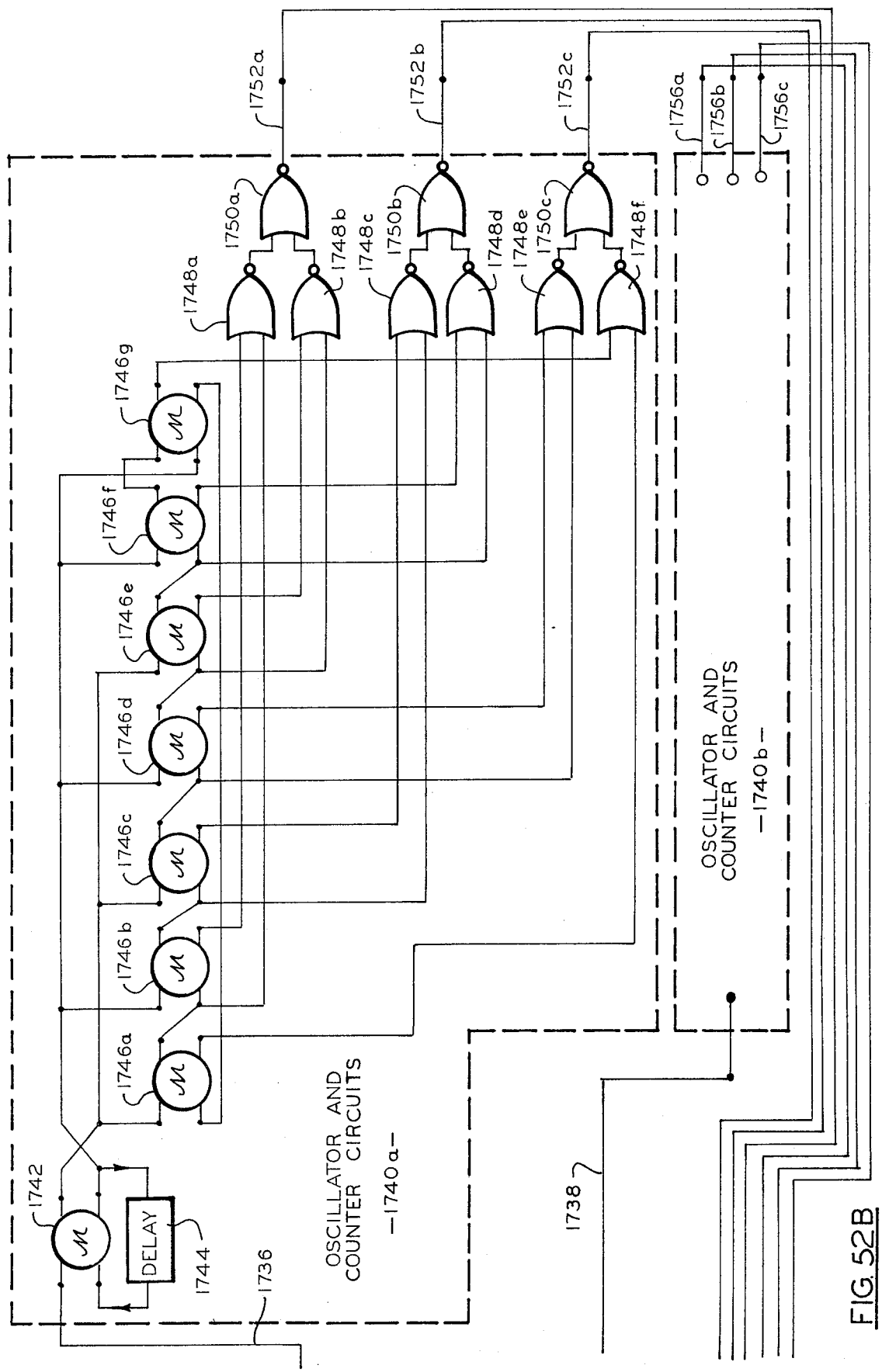
Figure 53:
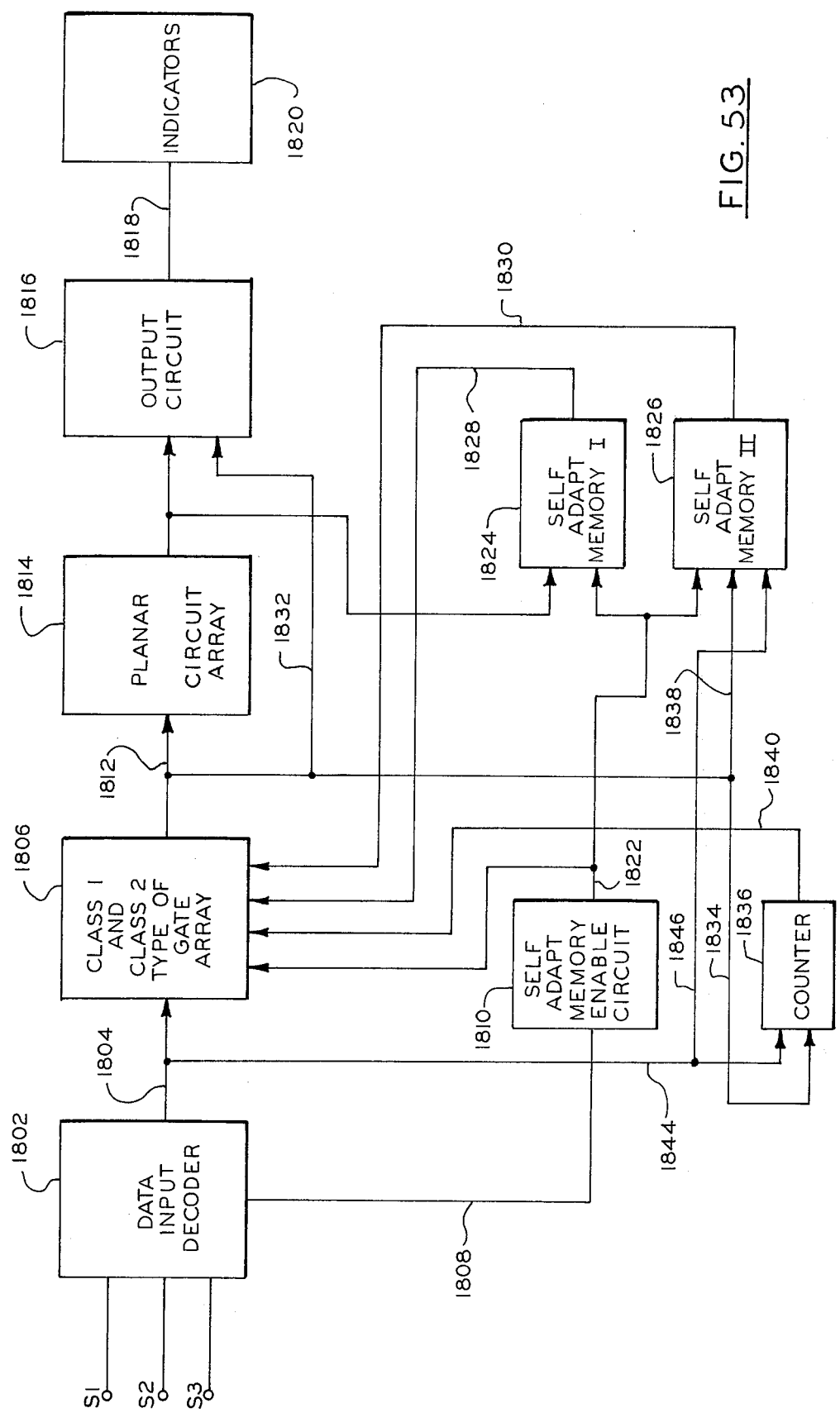
Figures 54A, 54B, 55:
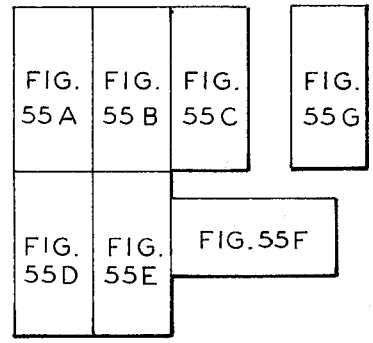
Figure 55A:
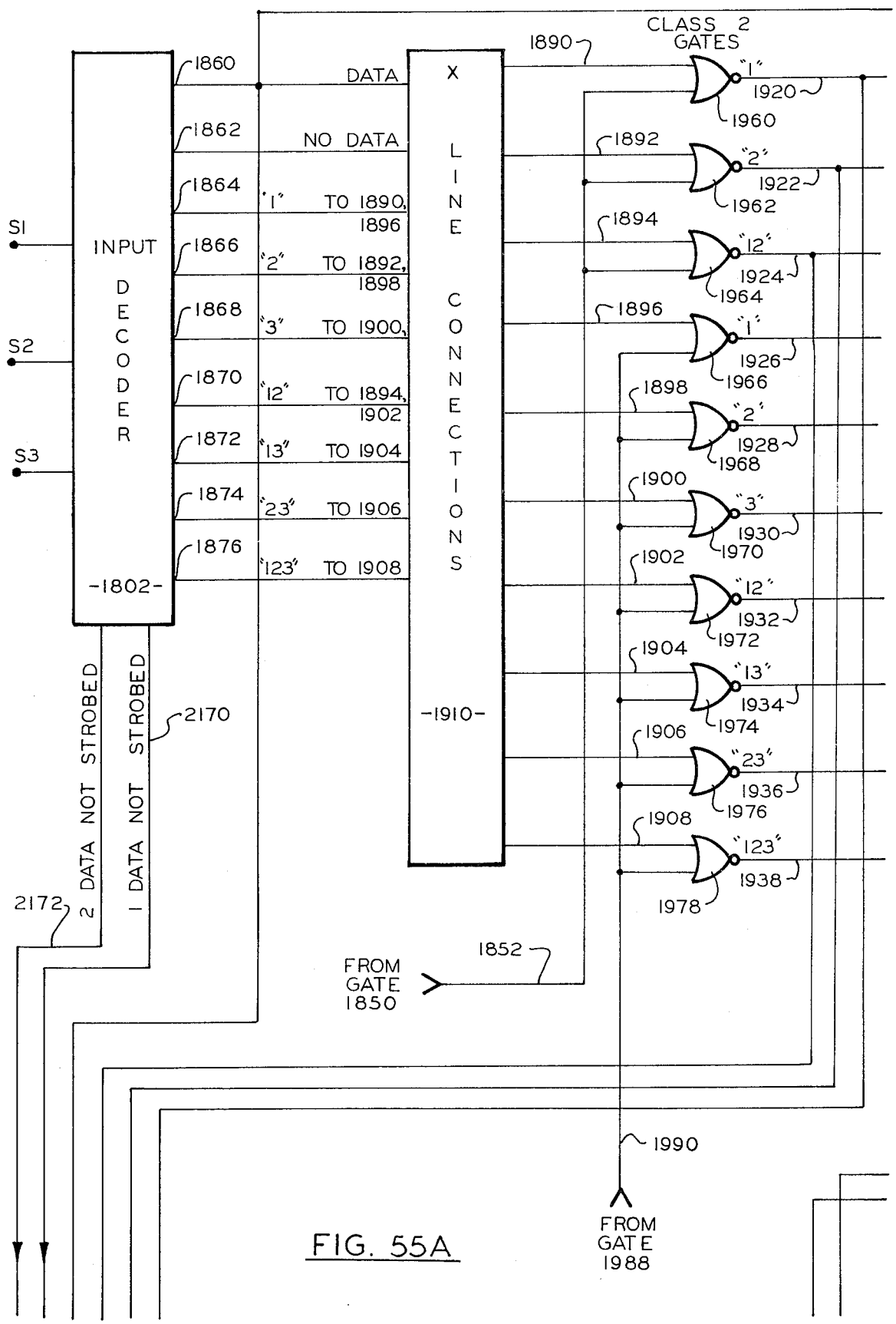
Figure 55B:
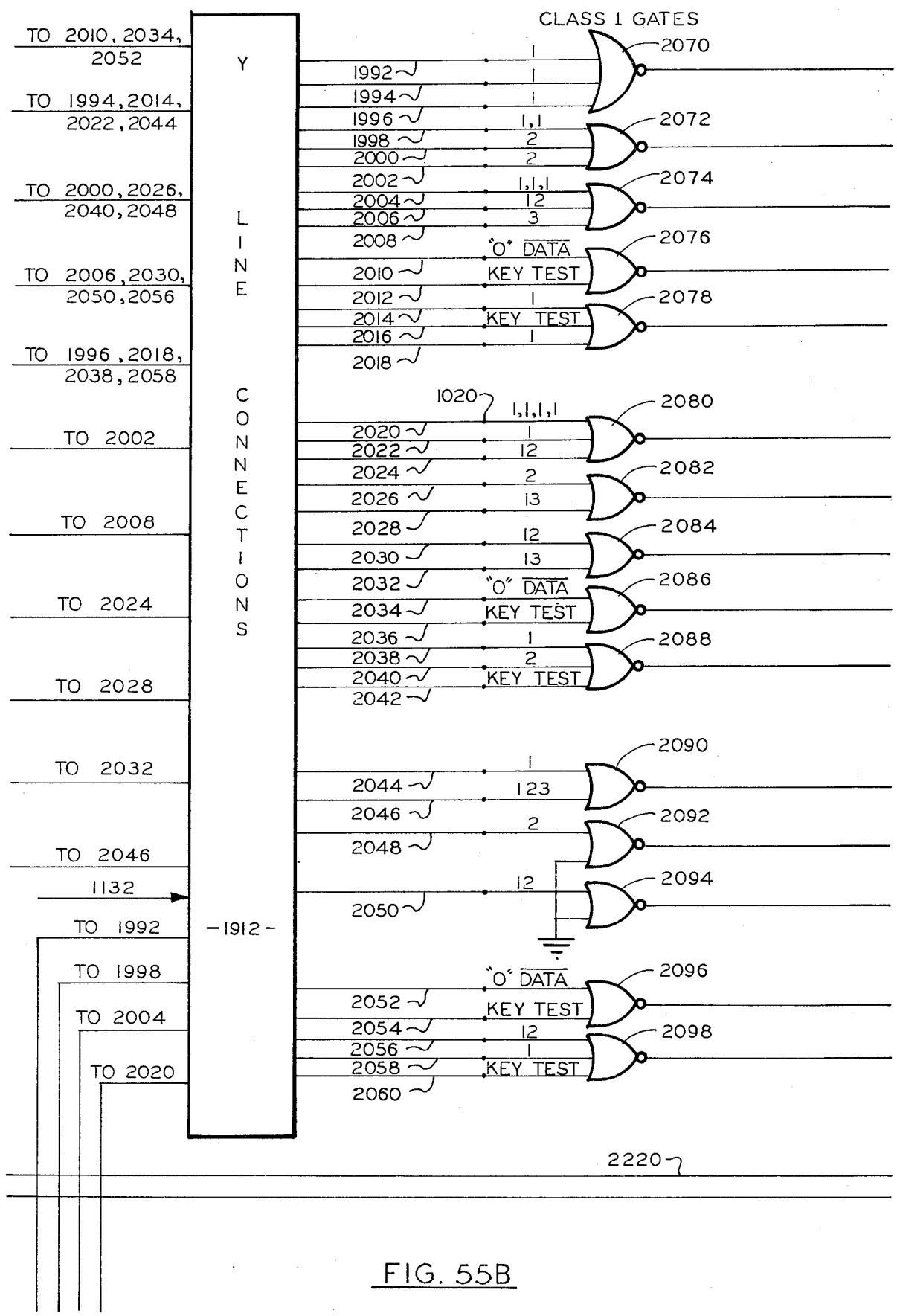
Figure 55C:
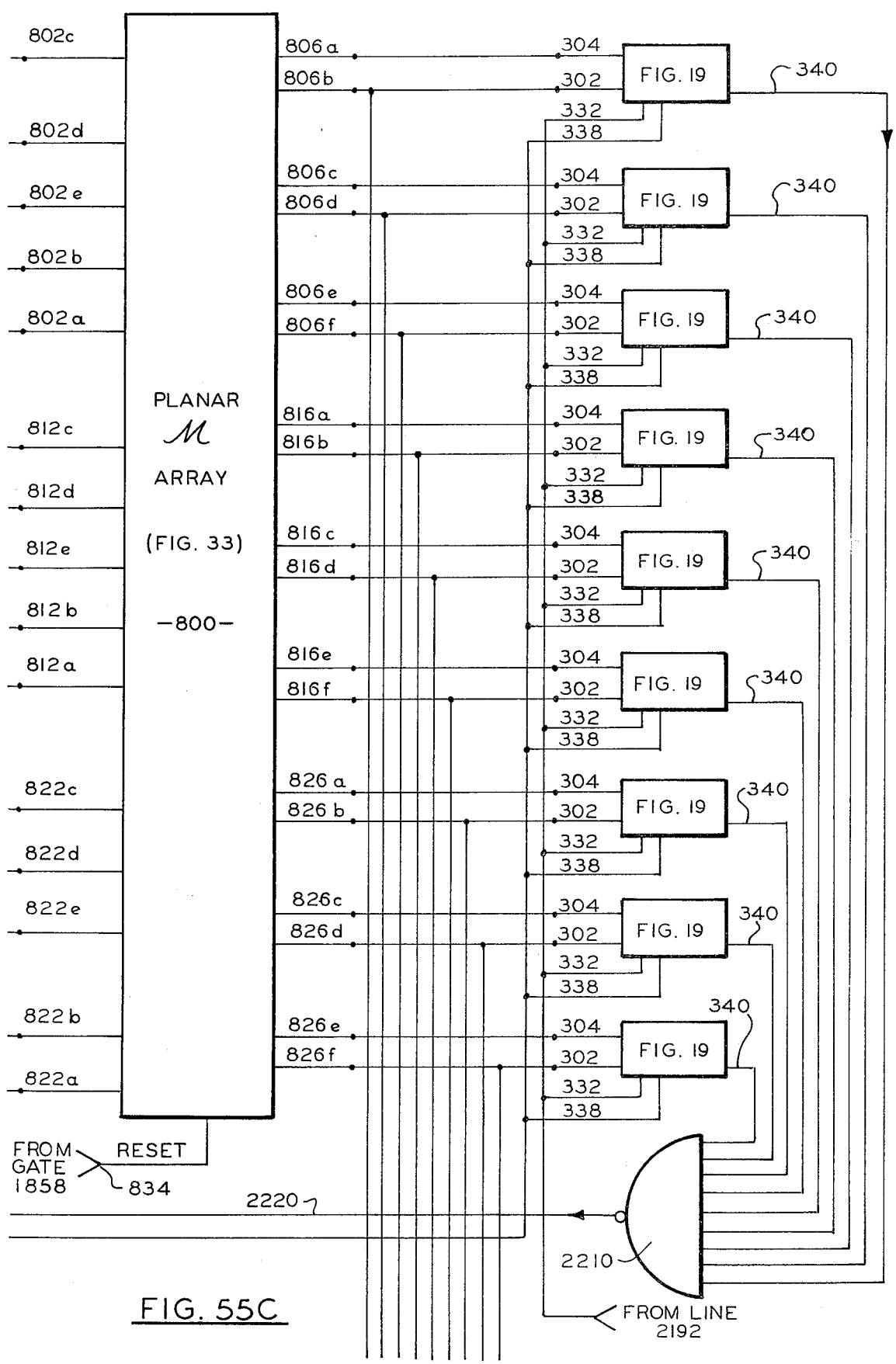
Figure 55D:
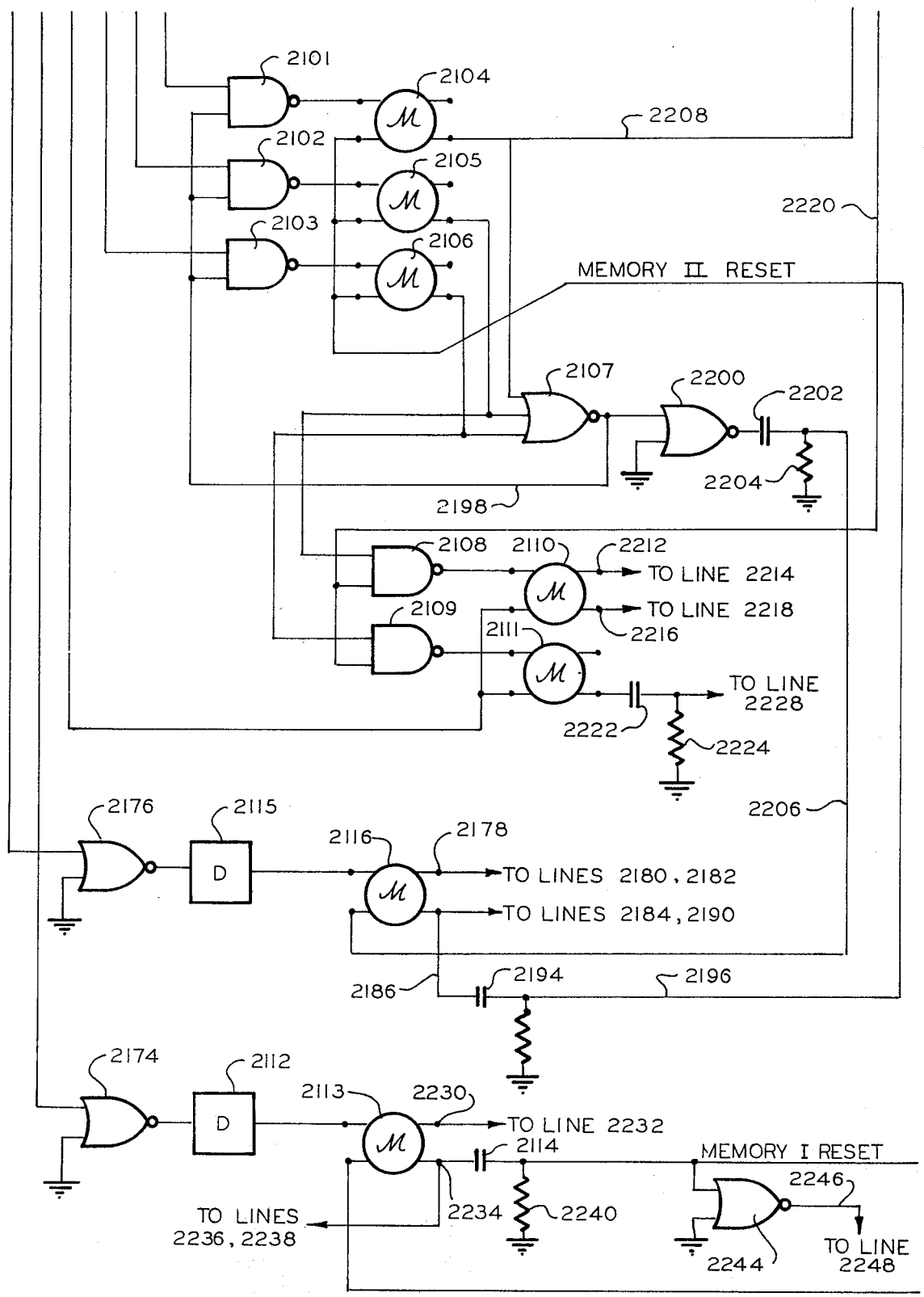
Figure 55E:
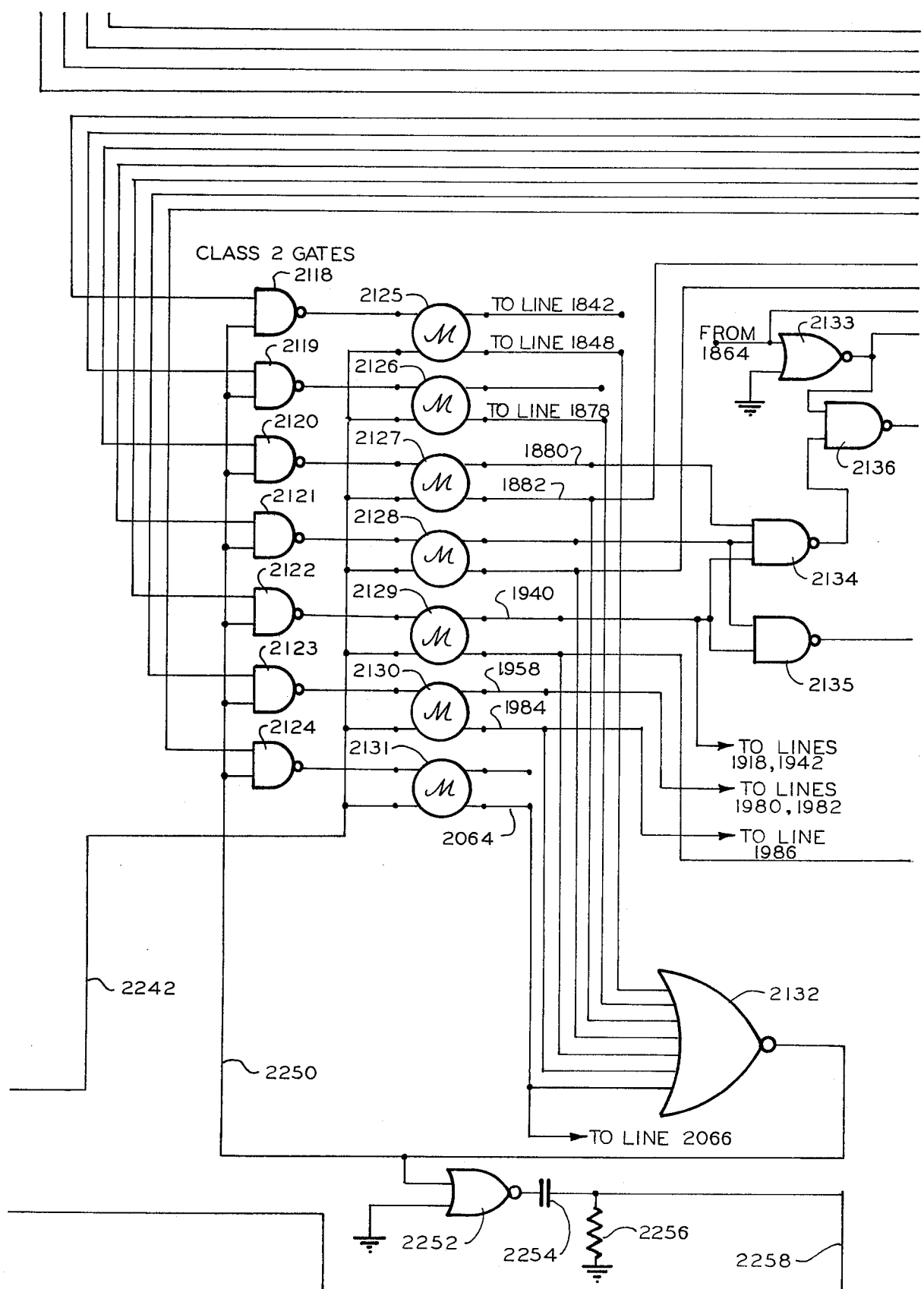
Figure 55F:
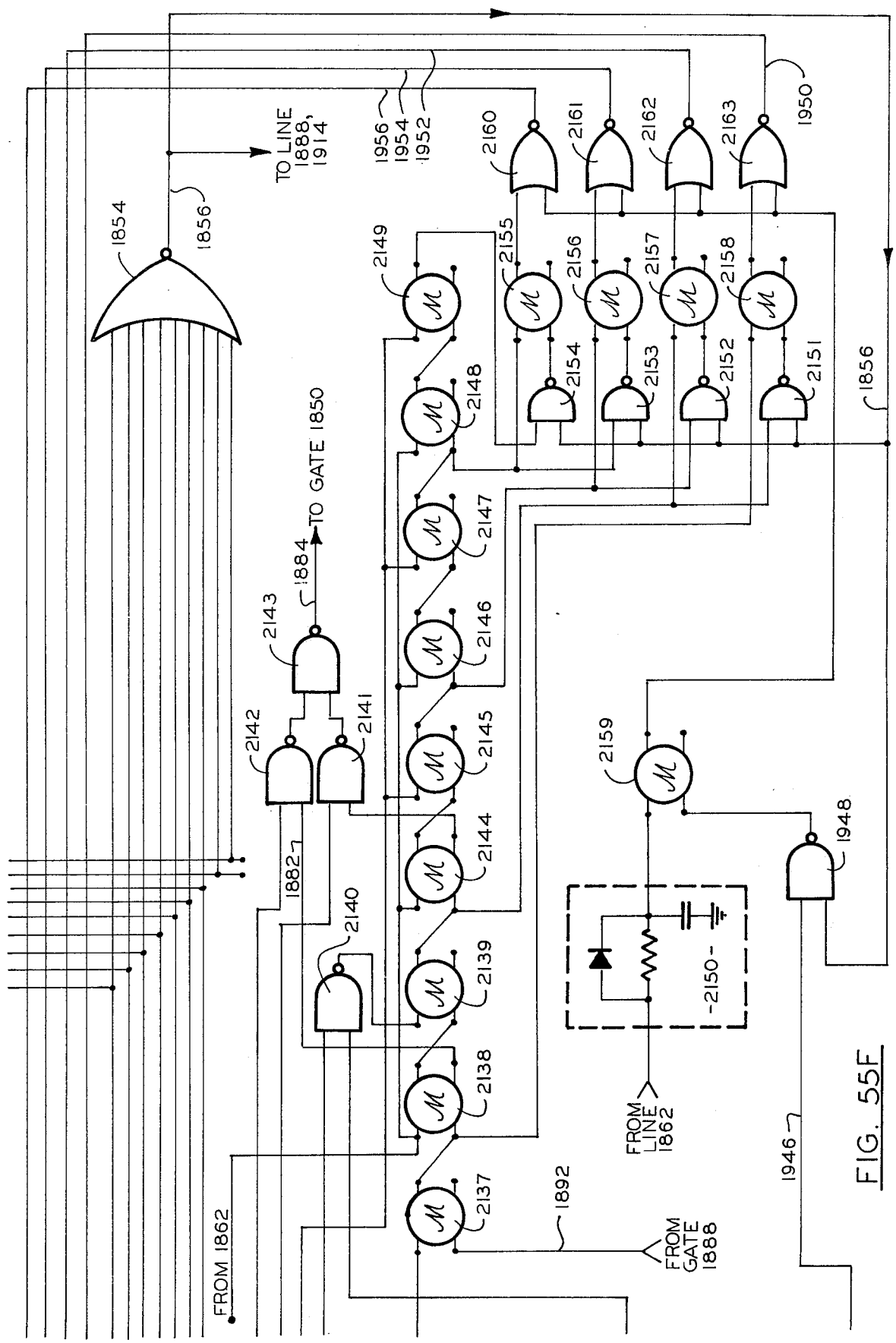
Figure 55G:
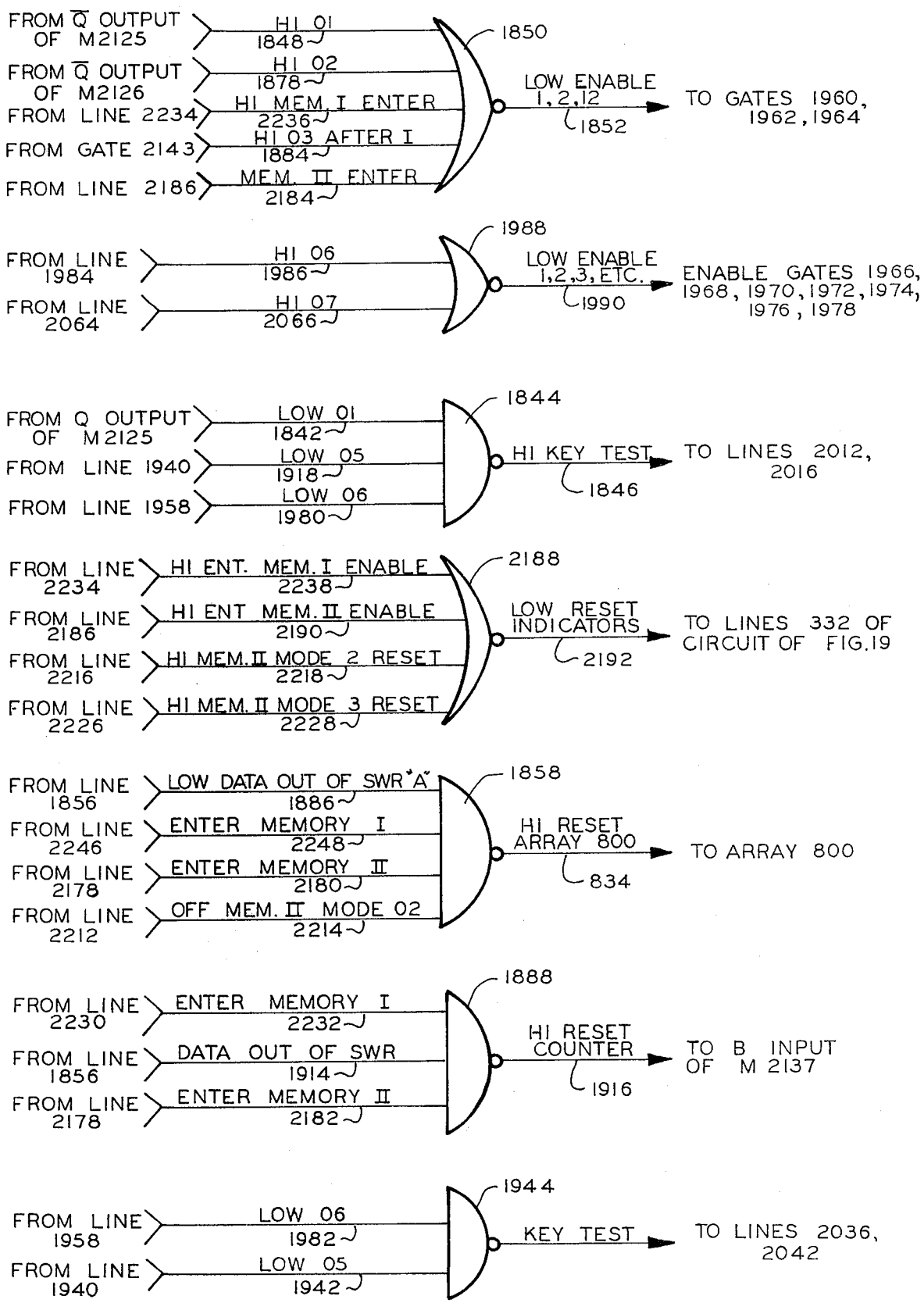
Figures 56, 57:
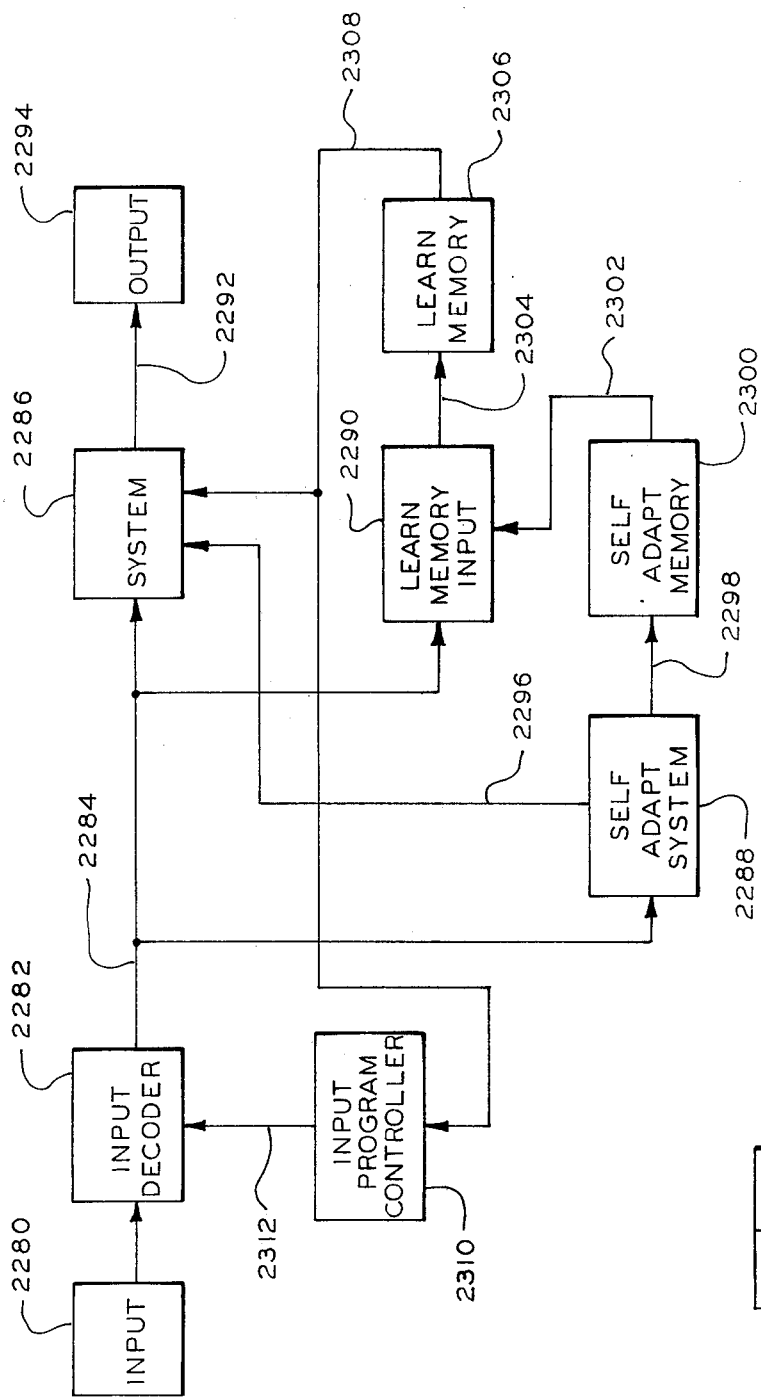
Figure 57A:
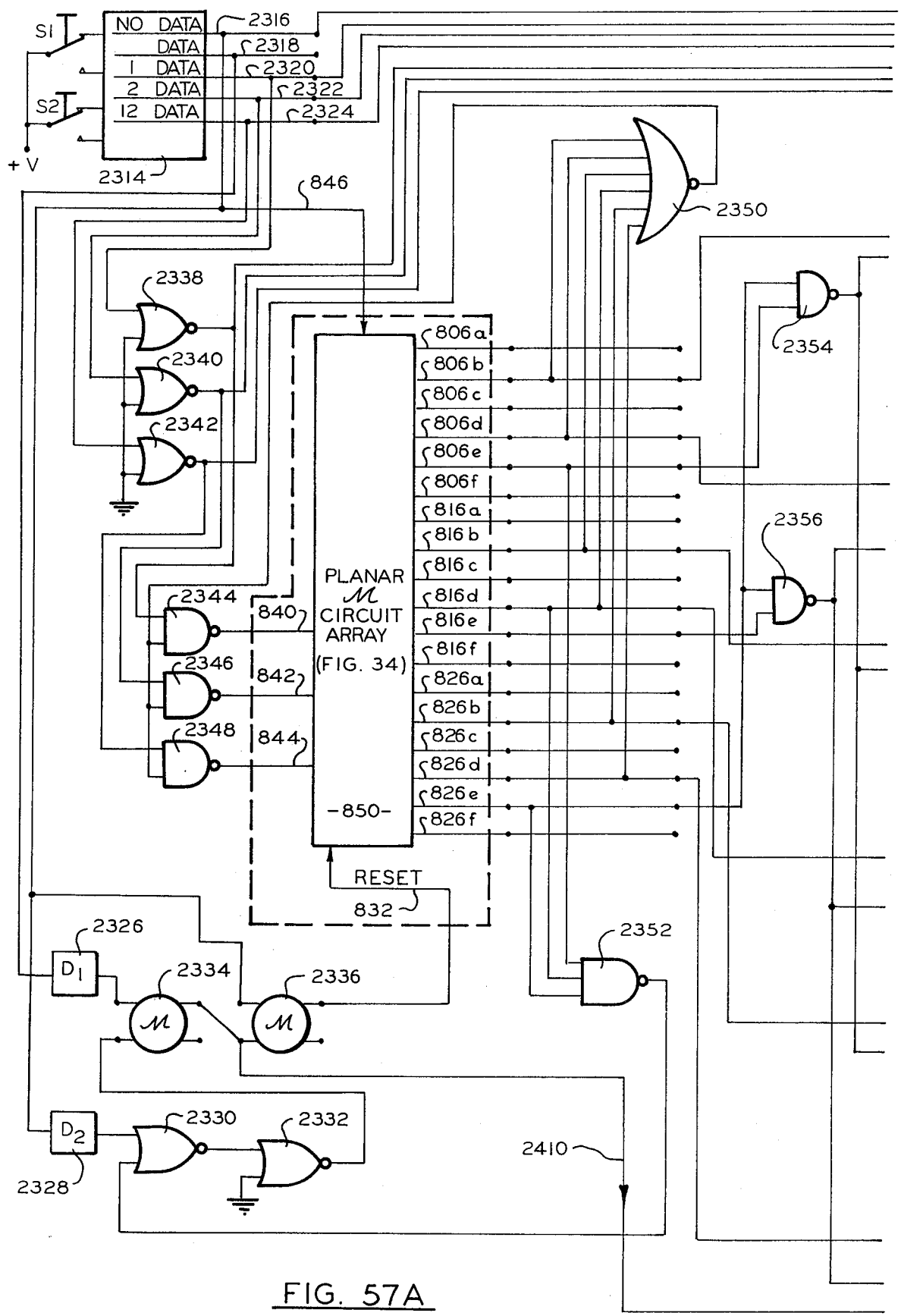
Figure 57B:
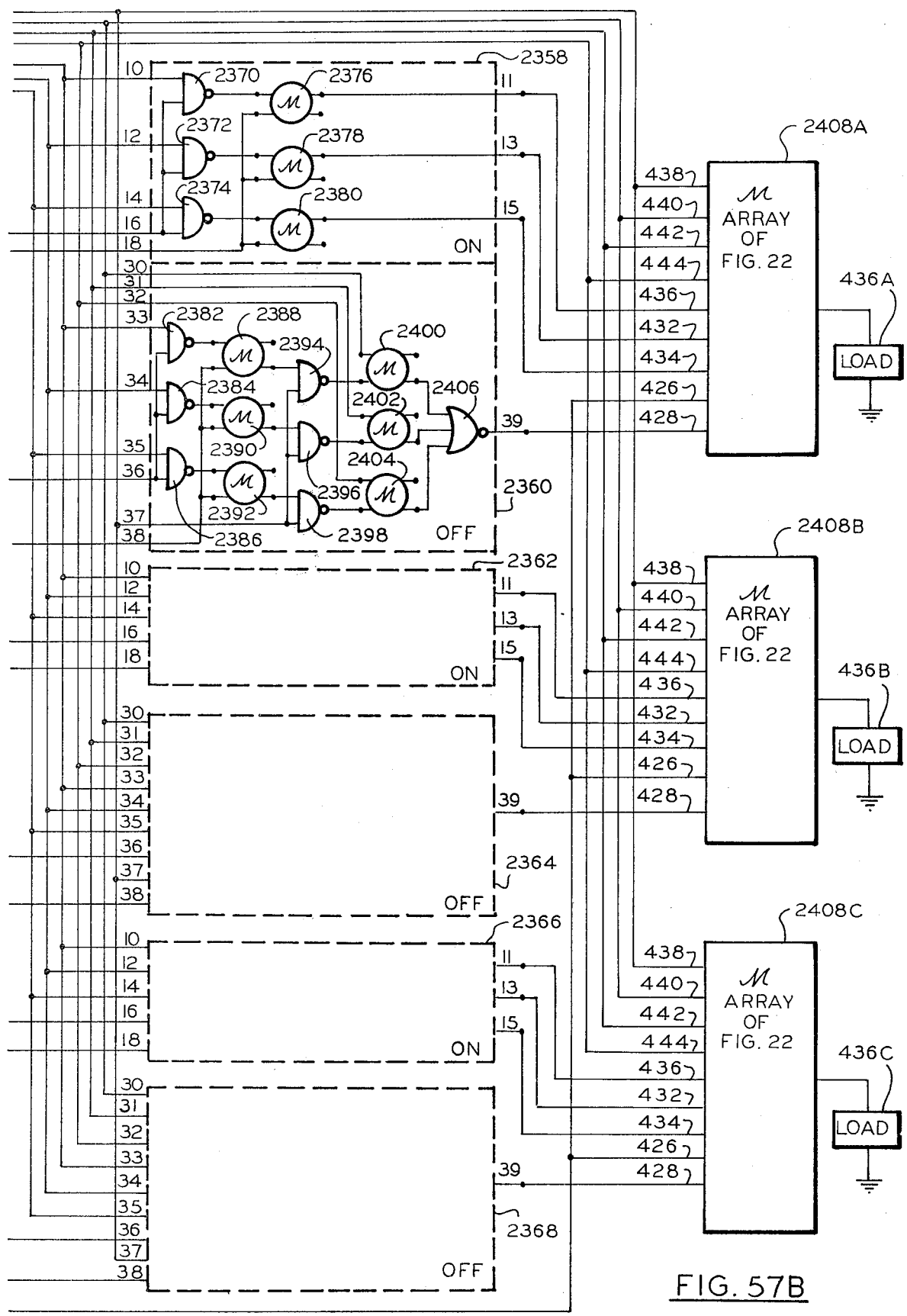
Figure 58:
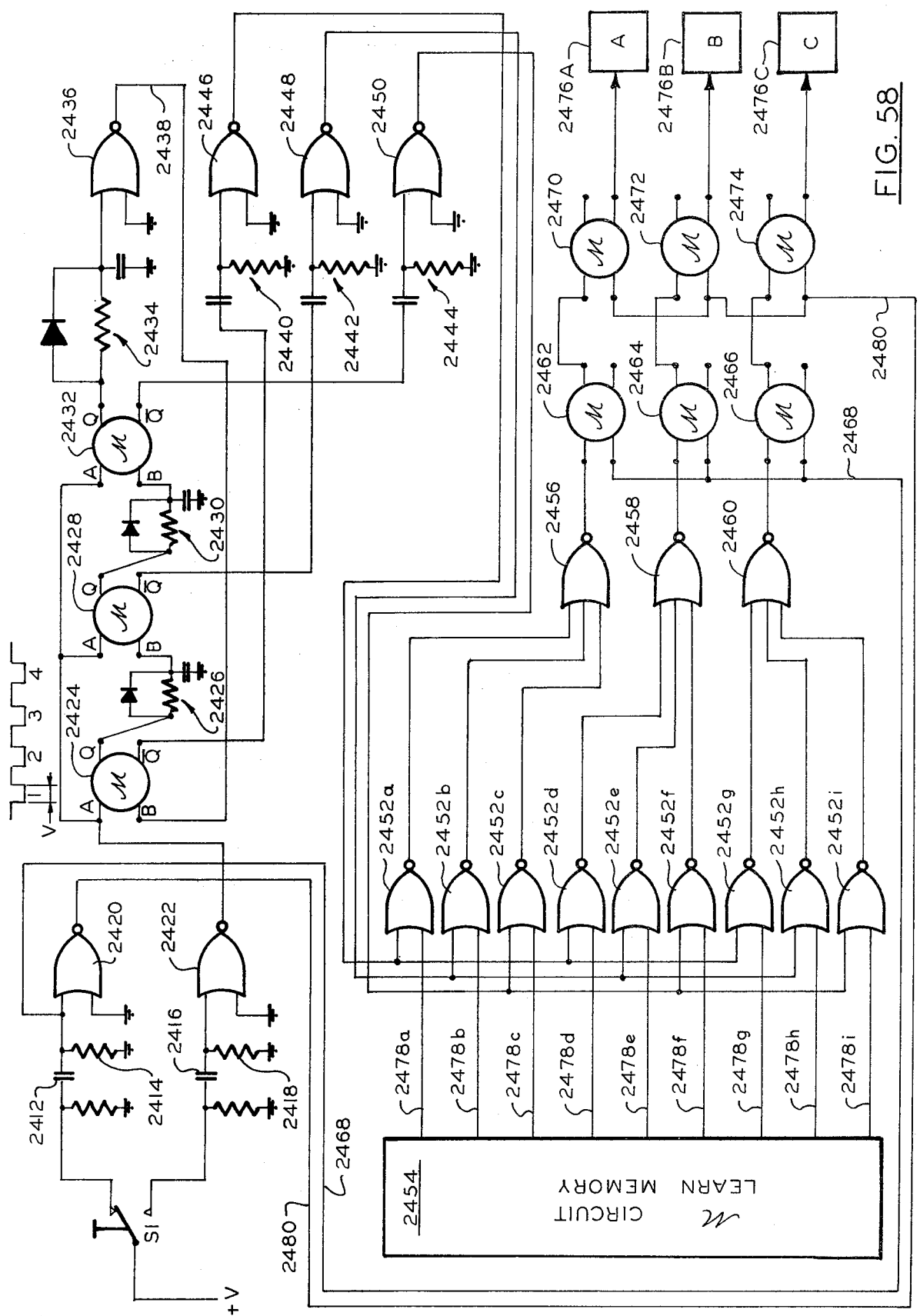
Figure 59:
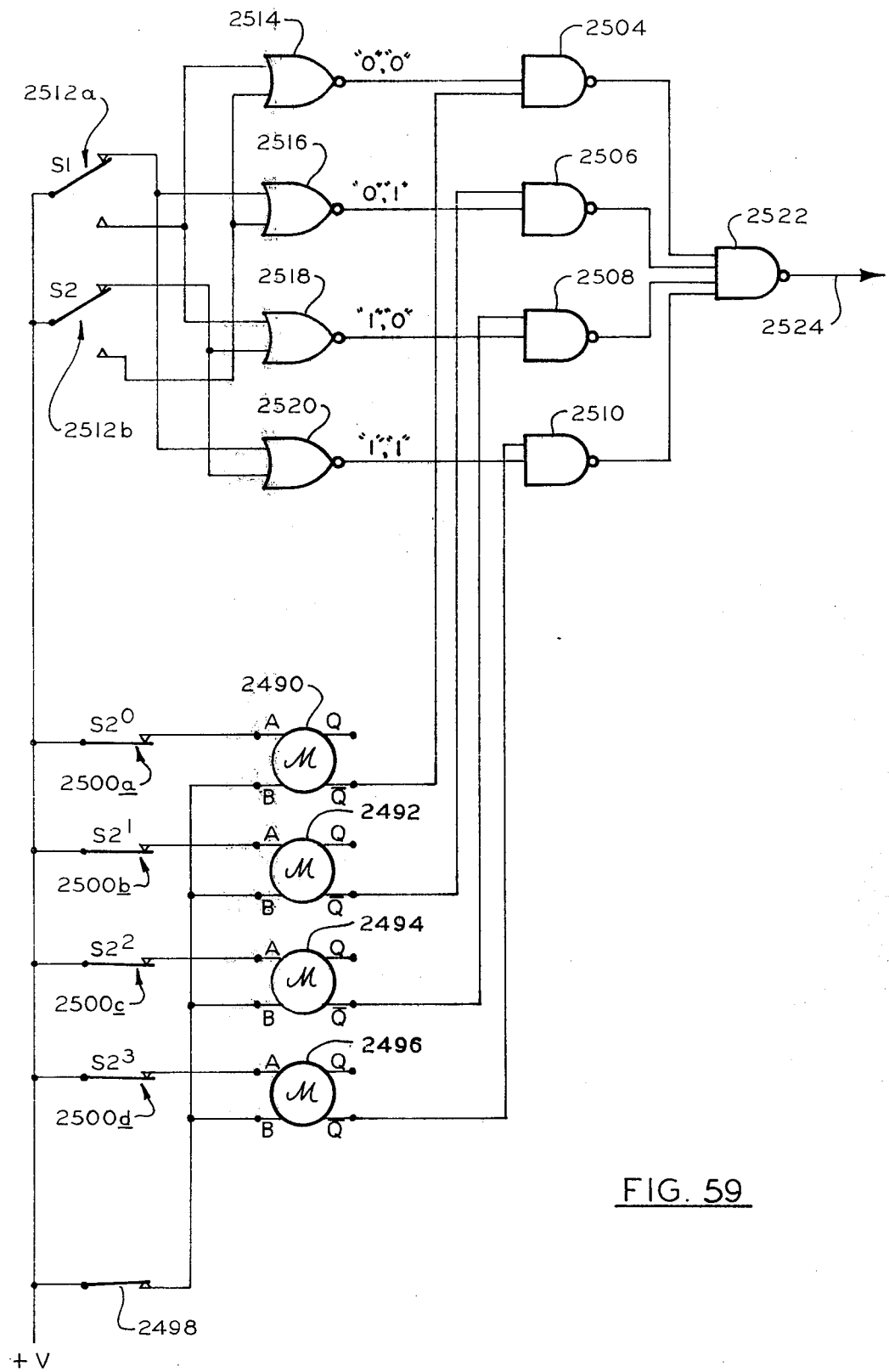
Figures 60, 61A, 61B:
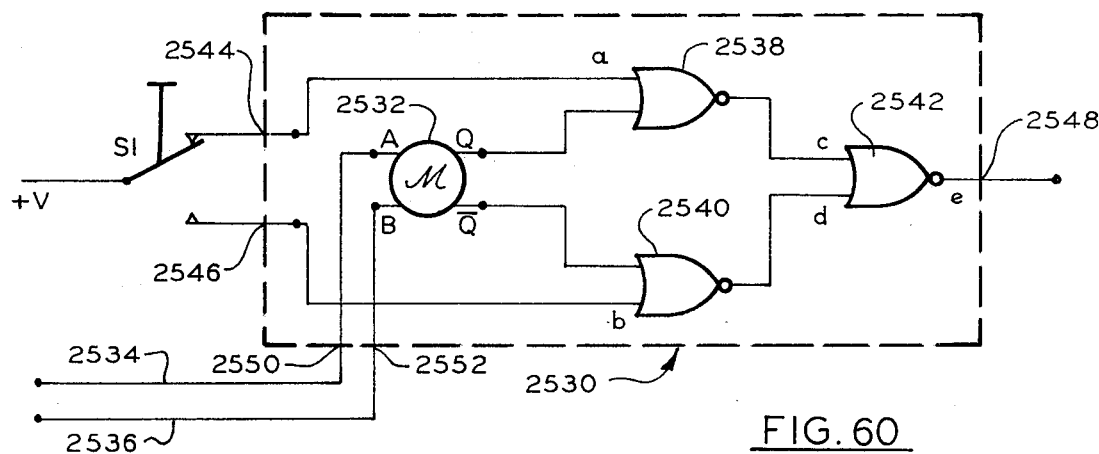
Figures 62, 63A:
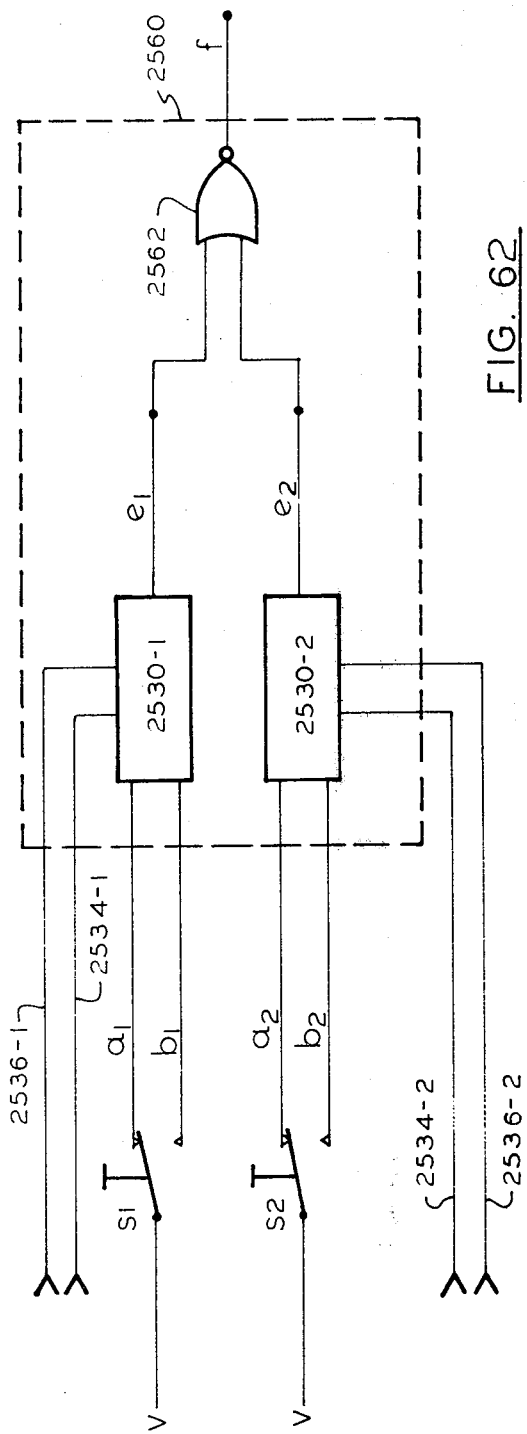

In FIG. 14F, two M Circuits are interconnected as shown in FIG. 13G above. The A inputs of M226 and M228 are connected, respectively, via lines 230 and 232 to the T outputs of gates 234 and 236. The inputs 1, 2, . . . , N of gates 234 and 236 are normally "0". When all the inputs of gate 234 and gate 236 go to "1" the T outputs will go to "0" and M226 and M228 will set if the B input of M226 is "0". This is another example of a coincidence circuit.

What is claimed is:

1. A logic system comprising first and second identical logic circuit building blocks, each referred to as an M Circuit, which responds to transitions of a two level, binary input signal to provide a memory and a logic function which has a complete truth table for every possible combination of input signal transitions or changes in logic level at a pair of input terminals A and B, each of said M Circuits comprising:
- gating means having two inputs connected to said A and B input terminals, respectively; and
- a set-reset flip flop means having its set input connected to the output of said gating means, its reset input connected to said B input terminal and its set and reset outputs connected respectively to output terminal Q and $\overline{Q}$ of said M Circuit, said Q and $\overline{Q}$ output terminals providing complementary binary outputs for any combination of binary inputs applied at said A and B input terminals, whereby said M Circuit is a four terminal device which responds to each transition of said input signal at said A and B terminals to provide outputs at said Q and $\overline{Q}$ terminals in accordance with its truth table function; and
- means interconnecting one of said Q and $\overline{Q}$ output terminals of said first M Circuit with one of said A and B input terminals of said second M Circuit.

2. System as recited in claim 1 wherein said means interconnecting one of said Q and $\overline{Q}$ output terminals of said first M Circuit with one of said A and B input terminals of said second M Circuit comprises a delay means.

3. System as recited in claim 1 wherein said means interconnecting one of said Q and $\overline{Q}$ output terminals of said first M Circuit with one of said A and B input terminals of said second M Circuit comprises a feedback network.

4. System as recited in claim 1 wherein a first one of said M Circuits is connected to a second one of said M Circuits by means connecting the B input terminal of said second M Circuit to one of the Q and $\overline{Q}$ outputs of said first M Circuit whereby said second M Circuit may be reset or enabled to be set by said first M Circuit.

5. System as recited in claim 1, wherein the Q terminal of a first M Circuit is coupled to the A terminal of a second M Circuit.

6. System as recited in claim 1, wherein the $\overline{Q}$ terminal of a first M Circuit is coupled to the A terminal of a second M Circuit.

* * * * *